US012660246B2

(12) United States Patent
Liang et al.

(10) Patent No.: US 12,660,246 B2
(45) Date of Patent: Jun. 16, 2026

(54) METHOD AND DEVICE RELATED TO SEAMLESS METAL CONTACT

(71) Applicant: Taiwan Semiconductor Manufacturing Company, Ltd., Hsin-Chu (TW)

(72) Inventors: Shuen-Shin Liang, Hsinchu County (TW); Kan-Ju Lin, Kaohsiung City (TW); Chia-Hung Chu, Taipei City (TW); Chien Chang, Hsinchu (TW); Harry Chien, Chandler, AZ (US); Sung-Li Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 455 days.

(21) Appl. No.: 18/182,921

(22) Filed: Mar. 13, 2023

(65) Prior Publication Data
US 2024/0313075 A1      Sep. 19, 2024

(51) Int. Cl.
*H10D 30/67*       (2025.01)
*H10D 30/01*       (2025.01)
*H10D 30/43*       (2025.01)
*H10D 62/10*       (2025.01)
(Continued)

(52) U.S. Cl.
CPC ....... *H10D 30/6735* (2025.01); *H10D 30/014* (2025.01); *H10D 30/43* (2025.01); *H10D 30/6729* (2025.01); *H10D 30/6757* (2025.01); *H10D 62/121* (2025.01); *H10D 84/0128* (2025.01); *H10D 84/013* (2025.01); *H10D 84/038* (2025.01)

(58) Field of Classification Search
CPC .. H10D 30/6735; H10D 30/014; H10D 30/43; H10D 30/6729; H10D 30/6757; H10D 62/121; H10D 84/0128; H10D 84/013; H10D 84/038
USPC ......................................................... 438/157
See application file for complete search history.

(56) References Cited

U.S. PATENT DOCUMENTS

| 8,772,109 B2 | 7/2014 | Colinge |
| 8,785,285 B2 | 7/2014 | Tsai et al. |
| 8,816,444 B2 | 8/2014 | Wann et al. |
| (Continued) | | |

FOREIGN PATENT DOCUMENTS

| TW | 202213523 A | 4/2022 |
| TW | 202234582 A | 9/2022 |

*Primary Examiner* — Duy T Nguyen
(74) *Attorney, Agent, or Firm* — HAYNES AND BOONE, LLP

(57) ABSTRACT

The present disclosure provides a method for semiconductor fabrication. The method includes depositing a first metal layer by a first deposition over a source/drain (S/D) feature and over side portions of a trench exposing the S/D feature. The first metal layer is thicker over the S/D feature than over side portions of the trench. The method includes growing a metal on the first metal layer by a second deposition to form a second metal layer filling up the trench. The second deposition is different from the first deposition and the growing of the metal in a vertical direction is grown at a faster rate than the growing of the metal in a horizontal direction. After growing the metal to form the second metal layer, the method includes planarizing the first and second metal layers to form an S/D contact. The method forms an S/D via on the second metal layer.

20 Claims, 49 Drawing Sheets

(51) Int. Cl.
  *H10D 84/01*      (2026.01)
  *H10D 84/03*      (2025.01)

(56)         References Cited

U.S. PATENT DOCUMENTS

| | | | |
|---|---|---|---|
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2005/0073051 A1* | 4/2005 | Yamamoto | H01L 21/76867 |
| | | | 438/597 |
| 2012/0043592 A1* | 2/2012 | Zhao | H01L 23/485 |
| | | | 438/653 |
| 2012/0261737 A1* | 10/2012 | Hsieh | H10D 84/0151 |
| | | | 257/E27.06 |
| 2013/0279048 A1* | 10/2013 | Juha | H02H 7/042 |
| | | | 361/36 |
| 2013/0299901 A1* | 11/2013 | Hsieh | H10D 64/62 |
| | | | 438/270 |
| 2014/0273436 A1* | 9/2014 | Hintze | H01L 21/76856 |
| | | | 438/653 |
| 2017/0040214 A1* | 2/2017 | Lai | H01L 21/76877 |

\* cited by examiner

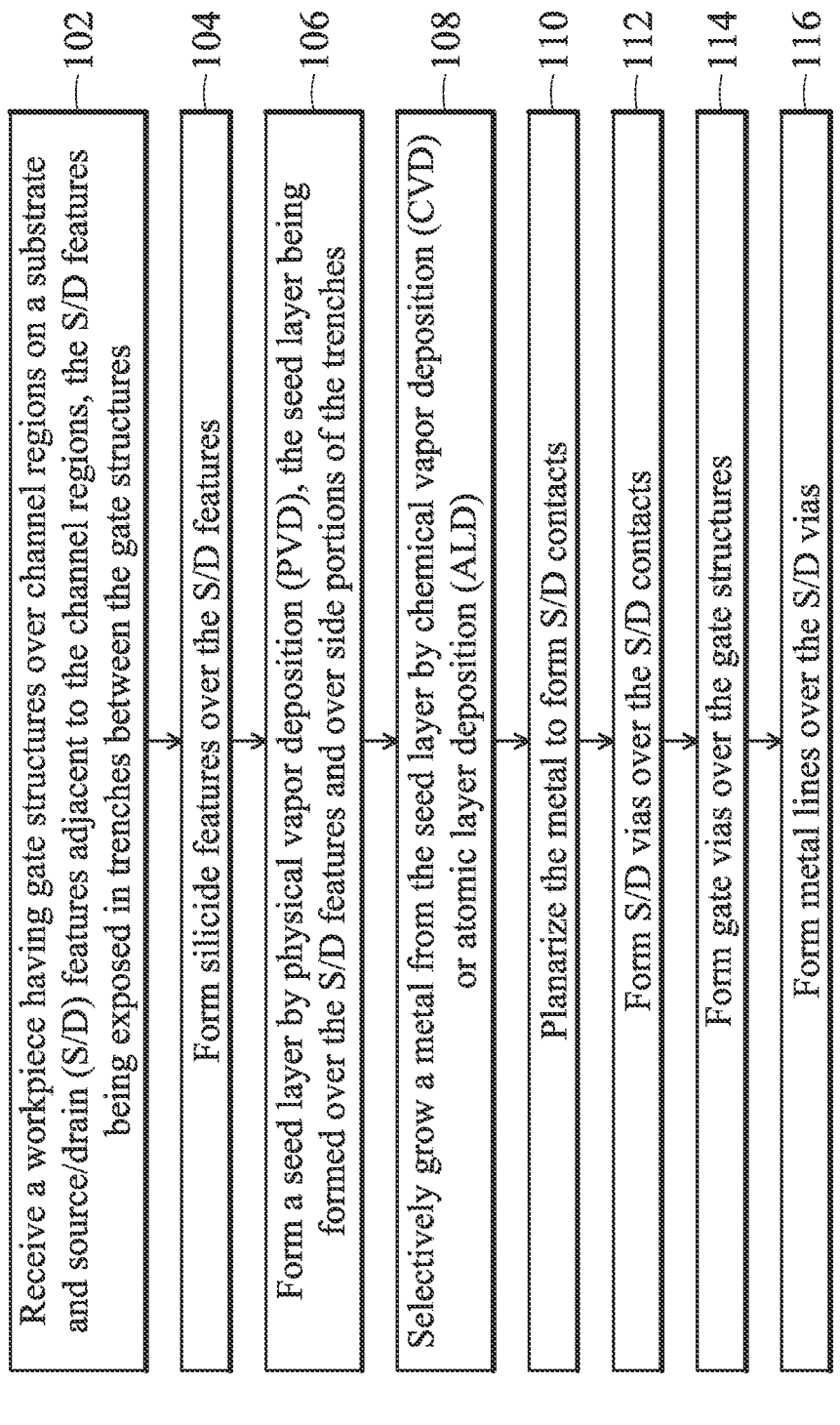

Receive a workpiece having gate structures over channel regions on a substrate and source/drain (S/D) features adjacent to the channel regions, the S/D features being exposed in trenches between the gate structures — 102

Form silicide features over the S/D features — 104

Form a seed layer by physical vapor deposition (PVD), the seed layer being formed over the S/D features and over side portions of the trenches — 106

Selectively grow a metal from the seed layer by chemical vapor deposition (CVD) or atomic layer deposition (ALD) — 108

Planarize the metal to form S/D contacts — 110

Form S/D vias over the S/D contacts — 112

Form gate vias over the gate structures — 114

Form metal lines over the S/D vias — 116

Figure 13:
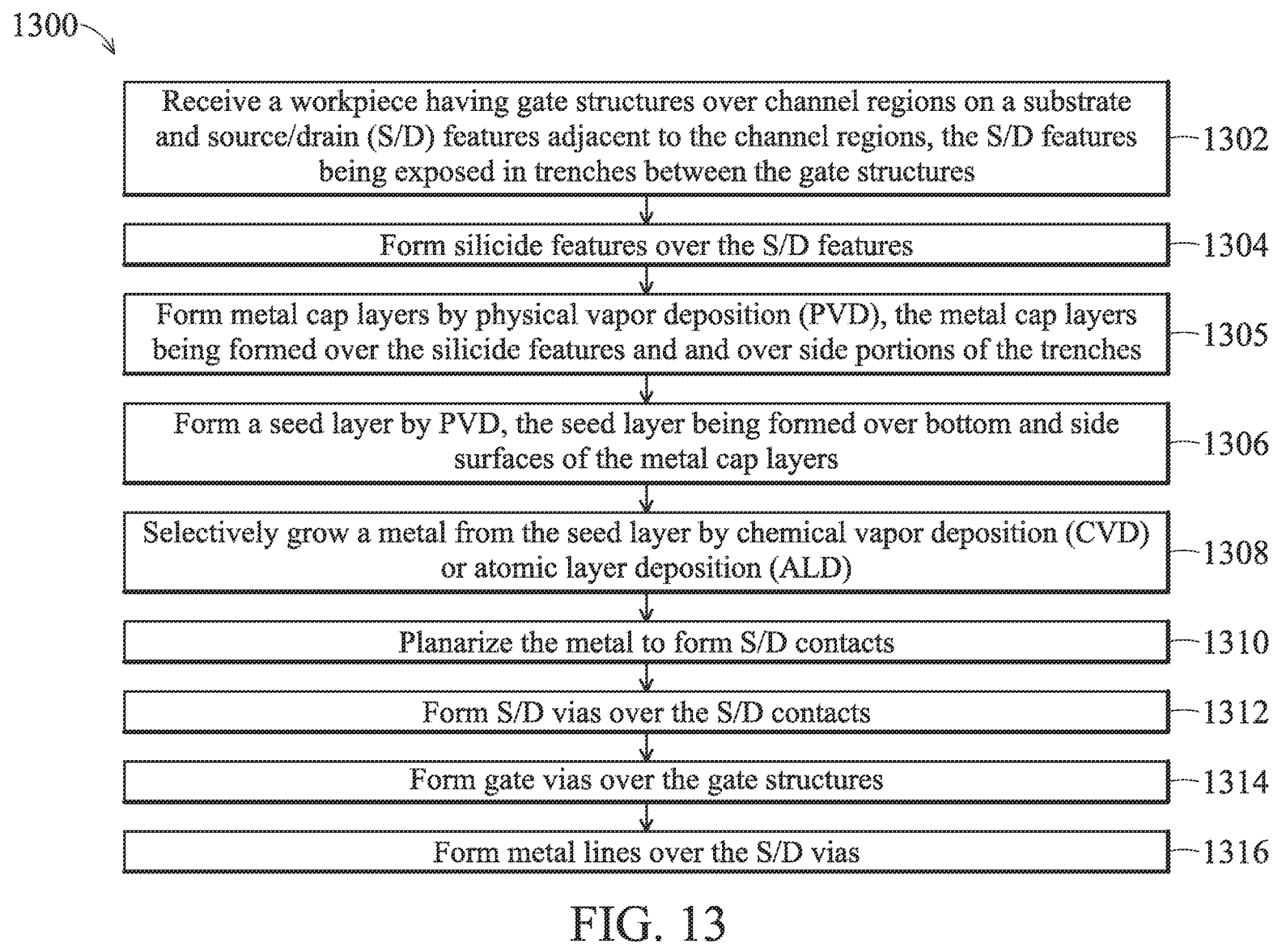

1302 — Receive a workpiece having gate structures over channel regions on a substrate and source/drain (S/D) features adjacent to the channel regions, the S/D features being exposed in trenches between the gate structures 1304 — Form silicide features over the S/D features 1305 — Form metal cap layers by physical vapor deposition (PVD), the metal cap layers being formed over the silicide features and and over side portions of the trenches 1306 — Form a seed layer by PVD, the seed layer being formed over bottom and side surfaces of the metal cap layers 1308 — Selectively grow a metal from the seed layer by chemical vapor deposition (CVD) or atomic layer deposition (ALD)

1310 — Planarize the metal to form S/D contacts

1312 — Form S/D vias over the S/D contacts

1314 — Form gate vias over the gate structures

1316 — Form metal lines over the S/D vias

METHOD AND DEVICE RELATED TO SEAMLESS METAL CONTACT

BACKGROUND

The integrated circuit (IC) industry has experienced exponential growth. Technological advances in semiconductor manufacturing have produced generations of ICs, where each generation has smaller and more complex circuits than the previous generation. In the course of IC evolution, functional density (i.e., the number of interconnected IC devices per chip area) has generally increased while geometry size (i.e., dimensions and/or sizes of IC features and/or spacings between these IC features) has decreased. Typically, scaling down has been limited only by an ability to lithographically define IC features at the ever-decreasing geometry sizes. However, as feature sizes continue to decrease, metal contacts need to fit into smaller spaces while minimizing contact resistance. Fitting metal material into smaller spaces often produce seams or voids, thereby degrading electrical connection. For example, undesired seams may be formed when forming source/drain contacts and source/drain vias, which then connect to upper level interconnects and metal lines. As such, the ability to form seamless metal contacts becomes a limiting factor when forming semiconductor devices in the further scaling down of ICs.

Therefore, although existing methods of forming semiconductor metal contacts have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 1 is a flow chart of a method for fabricating metal contacts, in portion or entirety, according to various aspects of the present disclosure.

FIGS. 2A-12A illustrate cross-sectional views of a semiconductor device at intermediate stages of fabrication and processed in accordance with the method of FIG. 1 according to an embodiment of the present disclosure.

FIGS. 2B-12B illustrate cross-sectional views of a semiconductor device at intermediate stages of fabrication and processed in accordance with the method of FIG. 1 according to another embodiment of the present disclosure.

FIG. 13 is a flow chart of a method for fabricating metal contacts, in portion or entirety, according to various aspects of the present disclosure.

FIGS. 14A-25A illustrate cross-sectional views of a semiconductor device at intermediate stages of fabrication and processed in accordance with the method of FIG. 13 according to an embodiment of the present disclosure.

FIGS. 14B-25B illustrate cross-sectional views of a semiconductor device at intermediate stages of fabrication and processed in accordance with the method of FIG. 13 according to another embodiment of the present disclosure.

DETAILED DESCRIPTION

Figure 2A:
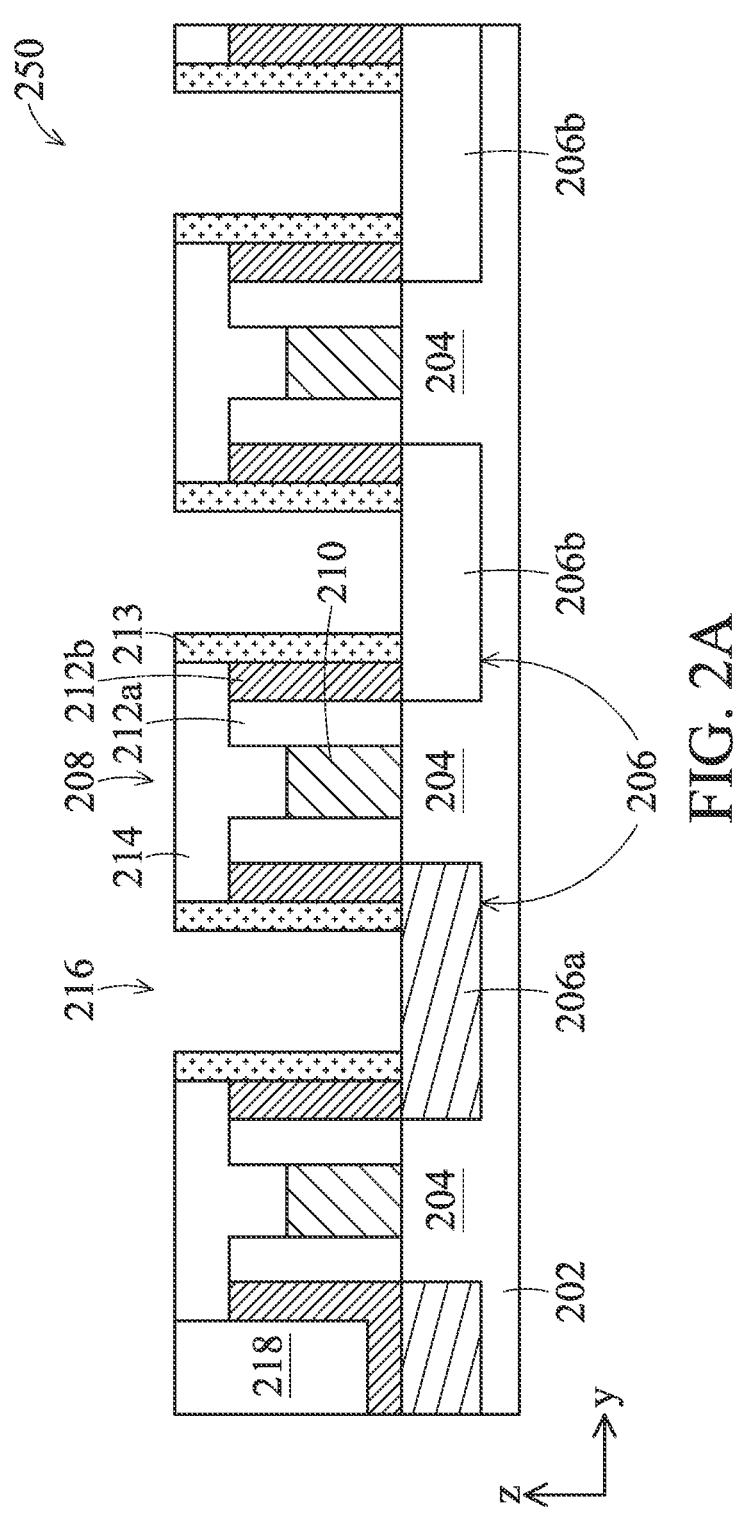
Figure 2B:
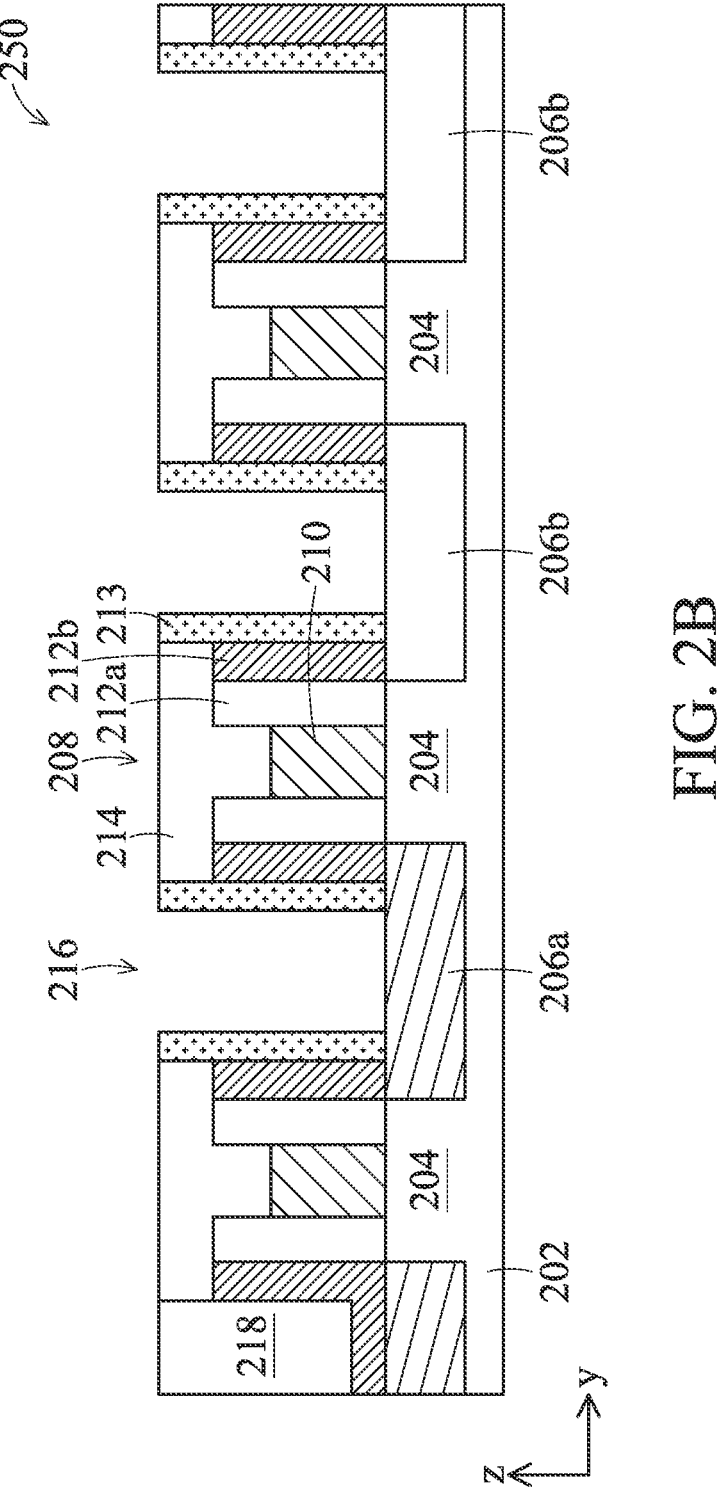

The present disclosure relates generally to integrated circuit (IC) semiconductor devices, and more particularly, to device-level metal contacts in IC semiconductor devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Further, spatially relative terms, such as "beneath," "below." "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/-10% of the number described, or other values as understood by person skilled in the art. For example, the term "about 5 nm" may encompass the dimension range from 4.5 nm to 5.5 nm.

The present disclosure relates to metal contacts and the vias and metal lines that physically and electrically connect to the metal contacts. The metal contacts include source/drain (S/D) contacts that are formed over S/D epitaxial features. The metal contacts are formed seamlessly through seed layers that are formed by physical vapor deposition (PVD) and through selective bottom-up metal growth from the seed layers by chemical vapor deposition (CVD) or atomic layer deposition (ALD). Through careful selection of seed layer and metal fill materials, the S/D contacts are formed without voids and with lowered resistance. As such, the vias that land on the S/D contacts have proper landing grounds so that the vias may also be formed without voids and with lowered resistance. Further, a metal cap layer in addition to the seed layer may be included, which allows for the tuning of interface contact with the S/D features while increasing process window when forming seamless metal contacts.

To illustrate the various aspects of the present disclosure, methods of forming a semiconductor device are discussed below. Embodiments shown in the present disclosure are implemented with FinFETs, but the present disclosure is not limited thereto. Those of ordinary skill in the art should appreciate that they may readily use the present disclosure as a basis for designing or modifying other structures for carrying out the same purposes and/or achieving the same advantages of the embodiments introduced herein. For example, the present disclosure may be implemented with gate-all-around FETs such as nanosheet FETs or nanowire FETs.

FIG. 1 illustrate a flow chart of a method 100 for fabricating metal contacts, in portion or entirety, according to various aspects of the present disclosure. The method 100 is briefly described below. At operation 102, the method 100 receives or is provided with a workpiece that includes gate structures over channel regions on a substrate. S/D features are adjacent to the channel regions, and the S/D features are exposed in trenches between the gate structures. The channel regions may be channel regions for a fin FET, a nanowire or nanosheet FET, or other types of multi-gate FETs. The channel region may be part of an active region protruding from a substrate. At operation 104, the method 100 forms silicide features over the S/D features. At operation 106, the method 100 forms a seed layer by PVD. The seed layer is formed over the silicide features and over side portions of the trenches. At operation 108, the method 100 selectively grow metals by CVD or ALD from the seed layer to fill up the trenches. The metals are grown in a bottom-up scheme. At operation 110, the method 100 planarizes the metal to form S/D contacts. At operation 112, the method 100 forms S/D vias over the S/D contacts. At operation 114, the method 100 forms gate vias over the gate structures. At operation 116, the method 100 forms metal lines over the S/D vias 116. The method 100 may perform further steps to complete fabrication of a semiconductor device. Additional processing is contemplated by the present disclosure. Additional operations can be provided before, during, and after method 100, and some of the operations described can be moved, replaced, or eliminated for additional embodiments of method 100.

Embodiments of the method 100 can be applied to SRAM devices, logic devices, and other devices, particularly when resistance of S/D contacts and S/D vias is of a concern. Embodiments of the method 100 can be readily integrated into existing manufacturing flow to simplify process flow while improving device performance.

Method 100 is further described below in conjunction with FIGS. 2A-12A, which illustrate cross-sectional views of a semiconductor device 200 at intermediate stages of fabrication and processed according to an embodiment of the present disclosure. FIGS. 2A-12A have been simplified for the sake of clarity to better understand the inventive concepts of the present disclosure. Additional features can be added in the device 200, and some of the features described below can be replaced, modified, or eliminated in other embodiments of the device 200.

The semiconductor device 200 may be a portion of an integrated circuit (IC) chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the device is included in a non-volatile memory, such as a non-volatile random access memory (NVRAM), a flash memory, an electrically erasable programmable read only memory (EEPROM), an erasable programmable read-only memory (EPROM), other suitable memory type, or combinations thereof.

At operation 102, the method 100 receives a workpiece 250 of the device 200, an embodiment of which is illustrated in FIG. 2A. The workpiece 250 may include a substrate 202 and channel regions 204 protruding from the substrate 202. S/D features 206 are disposed adjacent to the channel regions 204, which may include n-type S/D features 206*a* for n-type transistors and p-type S/D features 206*b* for p-type transistors. The n-type S/D features 206*a* may be epitaxially grown and comprise doped silicon. The p-type S/D features 206*b* may be epitaxially grown and comprise doped silicon germanium. The n-type S/D features 206*a* may be doped with n-type dopants such as arsenic, phosphorus, and/or other n-type dopants. The p-type S/D features 206*b* may be doped with p-type dopants such as boron, germanium, indium, and/or other p-type dopants.

Gate structures 208 are disposed over the channel regions 204. Each of the gate structures may include a metal gate 210 and gate spacers 212*a* and 212*b* along sidewalls of the metal gate 210. The gate spacers 212*a* and 212*b* may include a dielectric material, such as silicon oxide, silicon nitride, silicon carbide, silicon oxynitride, a low-k material, and/or other suitable dielectric materials. In this embodiment, there is an inner gate spacer 212*a* and an outer gate spacer 212*b*, which may include different dielectric materials. In other embodiments, there may only be one gate spacer. Each of the gate structures may further include a dielectric cap 214 over the metal gate 210 and over the gate spacers 212*a* and 212*b*. The dielectric cap 214 may have a center portion that dips lower than side portions of the dielectric cap 214. In these cases, the metal gates 210 are lower in the z direction than the gate spacers 212*a* and 212*b*. In some embodiments, the workpiece 250 further includes etch stop layers 213 along sidewalls of the metal gate structures. For example, the etch stop layers 213 may be disposed adjacent to the outer gate spacers 212*b* and the dielectric caps 214. The etch stop layers 213 may be of a different material composition than the gate spacers 212*a* and 212*b*. The etch stop layer 213 may include silicon nitride, silicon oxynitride, or other suitable materials.

Several trenches 216 are formed between the gate structures 208. In some embodiments, the trenches 216 are disposed between gate spacers 212 of different gate structures 208. In other embodiments, the trenches 216 are disposed between adjacent etch stop layers 213. The trenches 216 expose a top surface of the S/D features 206. In some embodiments, instead of a trench exposing an S/D feature 206, an interlayer dielectric (ILD) layer 218 is disposed over the S/D feature instead. The ILD layer 218 may comprise tetraethylorthosilicate (TEOS) oxide, undoped silicate glass, or doped silicon oxide such as borophosphosilicate glass (BPSG), fluoride-doped silica glass (FSG), phosphosilicate glass (PSG), boron doped silicon glass (BSG), a low-k dielectric material, and/or other suitable dielectric materials.

Figure 3A:
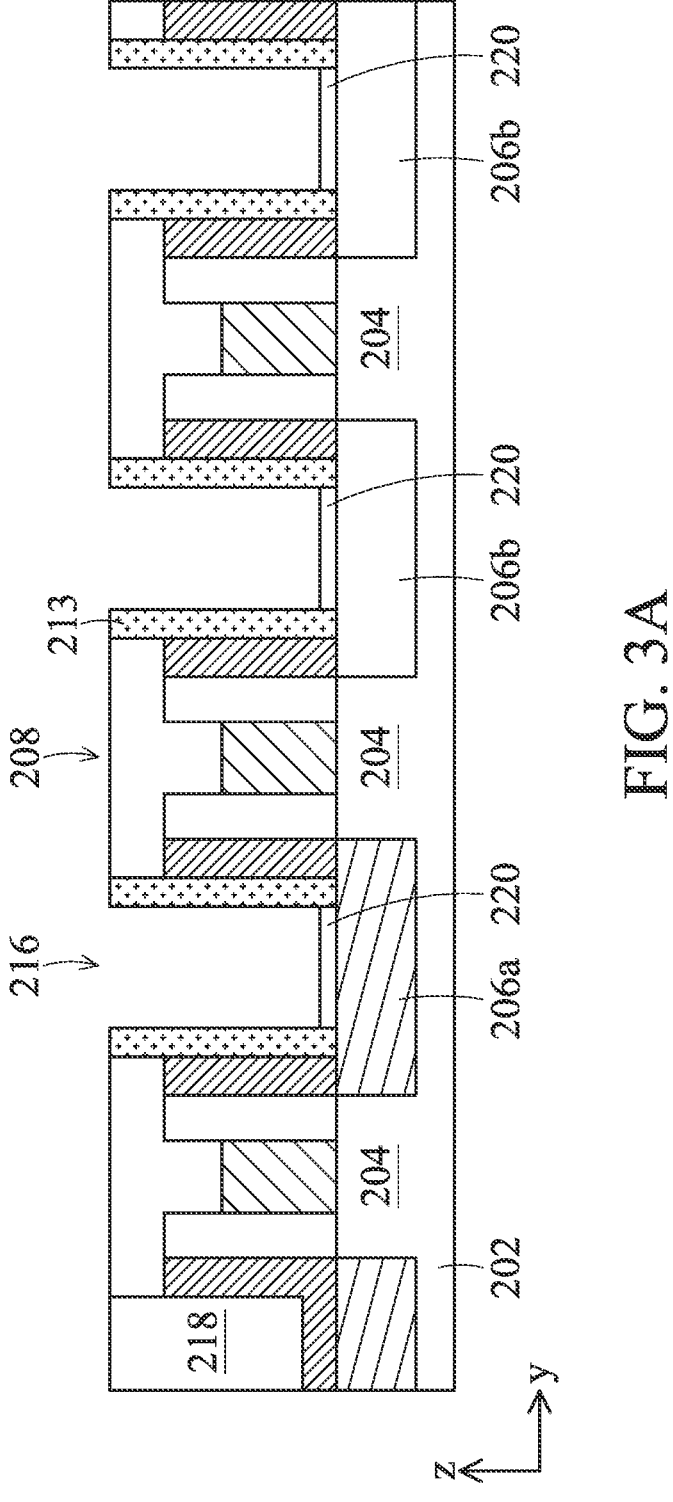
Figure 3B:
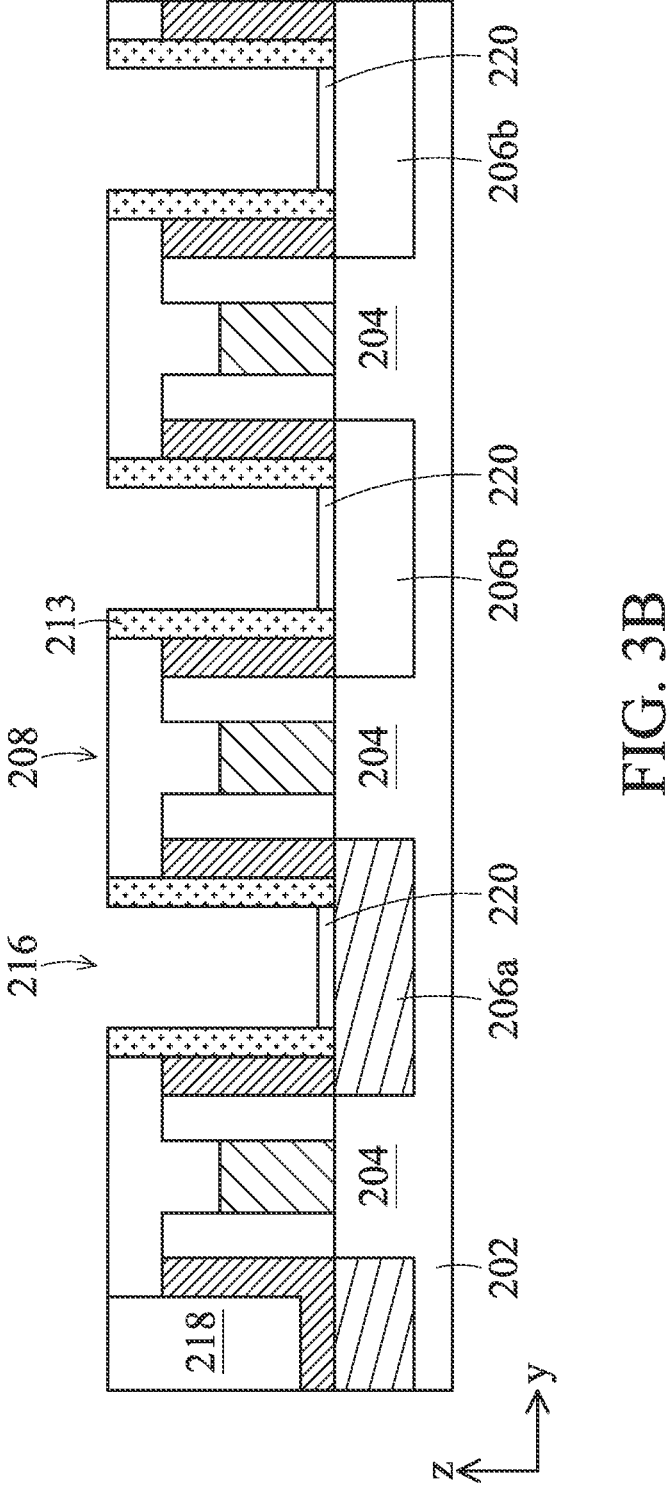

At operation 104, in reference to FIG. 3A, the method 100 forms silicide features 220 over the S/D features 206a and 206b. In some embodiments, the silicide features 220 may also form on side portions of each of the trenches 216 (not shown). The silicide features 220 may include a layer of titanium silicide (TiSi). In other embodiments, the silicide features 220 may include cobalt silicide (CoSi), ruthenium silicide (RuSi), nickel silicide (NiSi), TiSiGe, CoSiGe, RuSiGe, NiSiGe, other suitable silicides, or combinations thereof. Different materials may be used depending on the application. In an example, titanium silicide is used in an n-type transistor, and cobalt silicide is used in a p-type transistor. The silicide features 220 may be formed by any suitable method. For example, a metal layer (e.g., titanium) may be deposited over the device 200 by a deposition process such as CVD, ALD, PVD, other suitable processes, or combinations thereof. Then, the device 200 is annealed to allow the metal layer and the semiconductor materials of the source/drain features 206 to react and form the silicide features 220. Thereafter, the un-reacted metal layer is removed, leaving the silicide features 220 as a layer over the source/drain features 206.

Figure 4A:
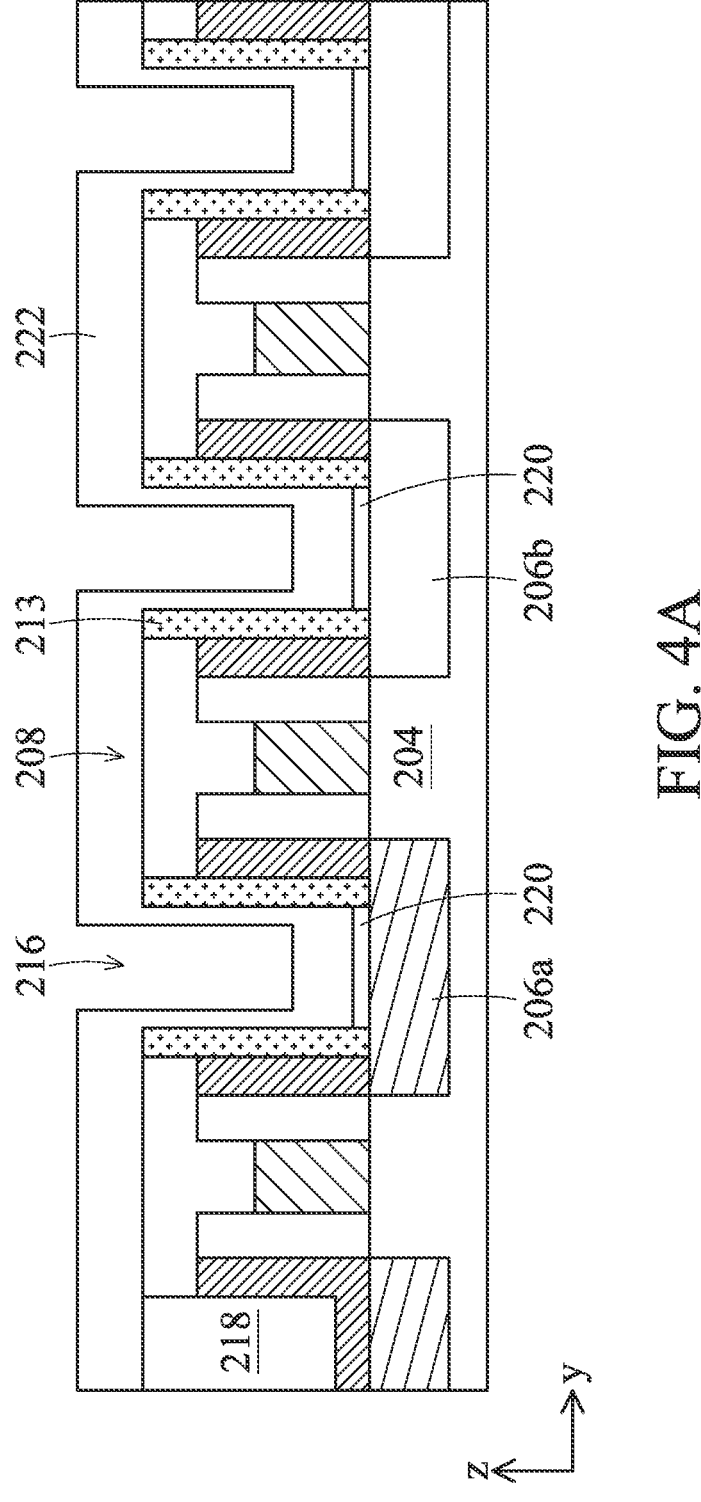

At operation 106, in reference to FIG. 4A, the method 100 forms a seed layer 222 by PVD over each of the silicide features 220 and over side portions of each of the trenches 216. Bottom portions of the seed layer 222 directly lands on each of the silicide features 220, and side portions of the seed layer 222 directly lands on side portions of each of the trenches 216. In some embodiments, side portions of the seed layer 222 directly lands on side portions of the silicide features 220 (not shown). The bottom portions of the seed layer 222 extend horizontally in a y direction, having a thickness vertically in a z direction. The side portions of the seed layer extend vertically in a z direction, having a thickness horizontally in a y direction. The thickness of the bottom portions of the seed layer 222 is greater than the thickness of the side portions. A greater thickness in the bottom portions is desirable for subsequent processes. In some embodiments, the thickness of the bottom portions is greater than 2.5 nm and the thickness of the side portions is less than 2.5 nm. In other embodiments, the thickness of the bottom portions is greater than 3 nm and the thickness of the side portions is less than 2 nm. Portions of the seed layer 222 may also land atop the gate structures 208, the etch stop layers 213, and the ILD layer 218.

The seed layer 222 may have dual functions. First, the seed layer 222 may act as a PVD metal cap layer 222 to protect the silicide features 220. The silicide features 220 upon formation may be exposed to atmosphere or other air that contains oxygen. Thus, there is risk of the silicide features 220 getting oxidized, which would increase its resistance. As such, the seed layer (or PVD cap layer) 222 should be thick enough to act as a cap to prevent unwanted silicide oxidation. In some embodiments, the seed layer (or PVD cap layer) 222 is thicker in the z direction than the silicide features 220. Second, the seed layer 222 acts as a proper landing ground for subsequent bottom-up metal growth. As such, no barrier layer or glue layer (e.g., made of titanium (Ti), titanium nitride (TiN), tantalum (Ta), or tantalum nitride (TaN)) is formed over the silicide features 220. This helps reduce resistivity because the seed layer 222 has lower resistivity than the barrier or glue layers. Because the seed layer 222 is formed to prepare for subsequent bottom-up metal growth, the thickness of the side portions of the seed layer 222 should be minimized to allow more growth vertically from the bottom portions than horizontally from the side portions.

The seed layer 222 is formed using PVD instead of CVD or other deposition processes because a pure metal precursor is desirable. In some embodiments, instead of metal alloys or metal compounds, the seed layer 222 formed by PVD should substantially comprise a single pure metal (e.g., more than 99% the pure metal). Therefore, to achieve low resistance seamless fill, the metal chosen for the subsequent bottom-up metal growth should be one that is compatible to the pure metal for single grain or less grain boundary interface. In a preferred embodiment, the seed layer 222 is made of molybdenum (Mo).

Figure 5A:
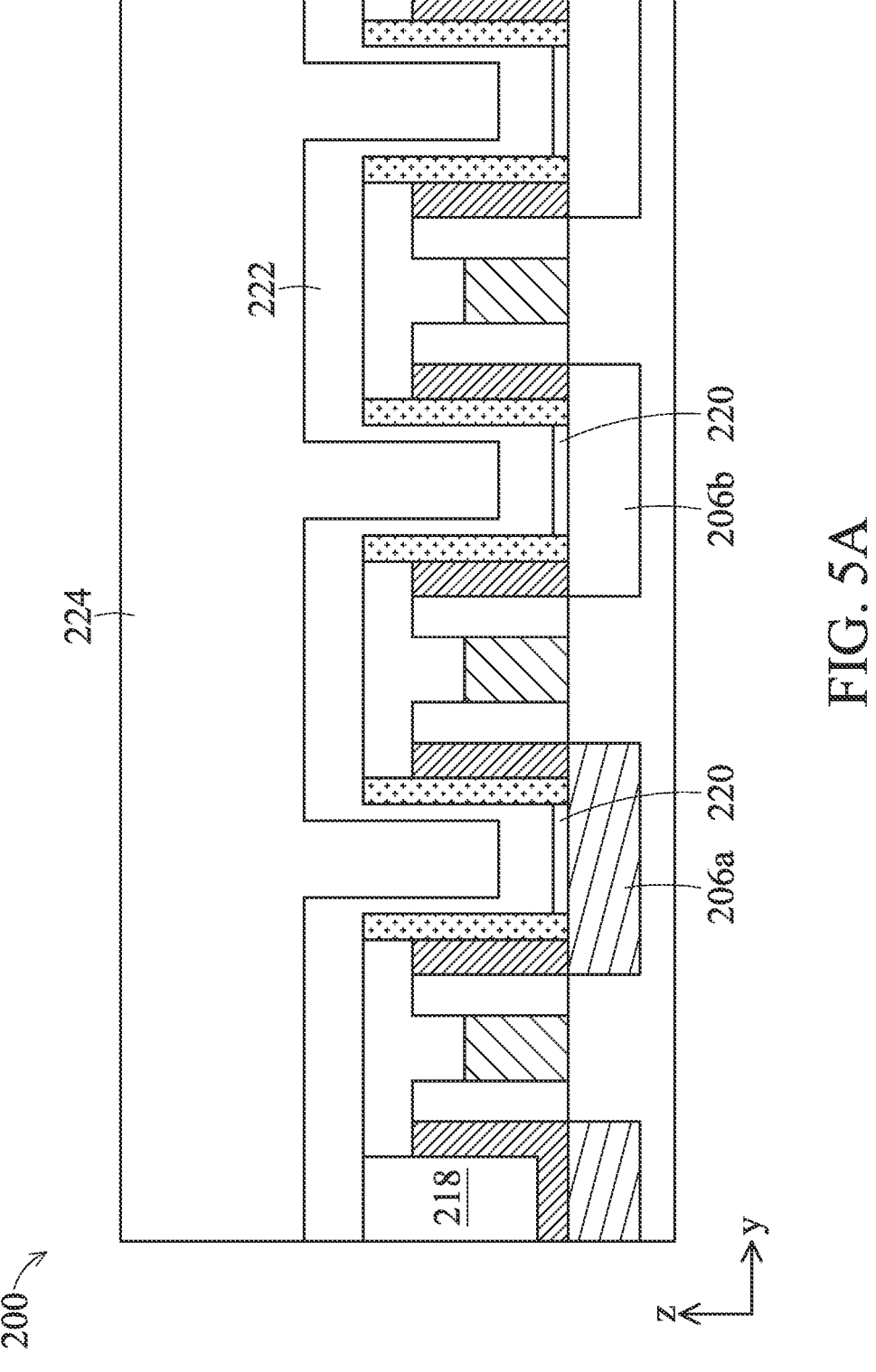

At operation 108, in reference to FIG. 5A, the method 100 deposits a metal 224 on the seed layer 222 by a suitable method, such as CVD or ALD. This deposition is anisotropic to achieve bottom-up deposition and is also referred to as bottom-up metal growth. The disclosed bottom-up deposition is achieved by applying a precursor that includes a chemical having species to be deposited and an etching chemical to simultaneously deposit and etch. As the deposition and etch effects are not uniform to bottom surface and sidewalls, the net effect achieves anisotropic deposition or bottom-up deposition. In the disclosed embodiments, the etching chemical includes halogen, such as chlorine or fluorine. The trenches 216 are filled with the metal 224, with additional metal overfilling the trenches 216. In this embodiment, the metal 224 grown from the seed layer 222 are of the same metal material. In a preferred embodiment, the metal 224 and the seed layer 222 are both molybdenum (Mo). Having the same metal material allows for good interface contact and single grain boundary, lowering contact resistance.

The bottom-up metal growth is performed with a metal halide precursor having a metal component and a halogen component (e.g., an etching chemical). As part of the CVD or ALD process, the metal growth is performed by incorporating metal halide precursors such that the metal component includes tungsten (W), molybdenum (Mo), ruthenium (Ru), cobalt (Co), iridium (Ir), or rhodium (Rh), and the halogen component includes fluorine (F), chlorine (Cl), bromine (Br), or iodine (I). The metal component refers to the metal 224 to be deposited over the seed layer 222. The metal component in the precursor may result in forming the corresponding material for the metal 224, and as described in other embodiments, the material for the seed layer may vary from the material for the metal 224. The materials for the halogen component may have etching effect to facilitate proper vertical metal growth (e.g., $MoCl_5$ and $WCl_5$ have etch metal capability). In some embodiments, the metal halide precursor further includes oxygen. In these embodiments, the metal halide precursor may also have metal oxide etching effect (e.g., $MoOCl_5$ and $WOCl_5$), which may be necessary due to unwanted oxide formed through oxidation by the silicide features 220. The deposition process temperature should be less than 500 degrees Celsius. No direct plasma is used in the deposition process.

The process to form metal feature 224 is different from the process to form the seed layer 222. The metal feature 224 is formed by bottom-up deposition while the seed layer 222 is formed by PVD with plasma. Therefore, the plasma can be biased to provide directional direction, such as directional toward the bottom surface, therefore forming the seed layer 222 thicker on the bottom surface than the sidewalls. The bias power is tunable and can be dynamically controlled to achieve the desired profile.

The metal growth of the metal 224 is substantially in the vertical direction, such that the growth rate is faster in the vertical direction than in the horizontal direction. This is desirable to prevent seams or voids from forming such as by unwanted metal enclosures caused by metal growth sideways. This may be achieved due to the etching effect of the metal halide precursors, which allows for more etching in top portions of the trenches 216 (See FIG. 4A), etching along sidewall portions of the seed layer 222 while allowing for more deposition in the bottom portions of the seed layer 222. In some embodiments, the etching effect of the metal halide precursors may also etch sidewall portions of the seed layer. This is in addition to etching the metal being deposited along the sidewall portions of the seed layer. Due to the presence of the halide in the precursor of the bottom-up deposition, the metal feature 224 may also include a halide, such as F, Cl, Br or I. The halide may distribute unevenly in the metal feature 224 such as higher halogen concentration at the interface between seed layer 222 and metal feature 224, depending on the precursor that is dynamically tunable during the bottom-up deposition. On the other hand, since the seed layer 224 is formed by PVD, no halide (or very little) is present in the seed layer 222 after the metal growth of the metal 224.

Figure 6A:
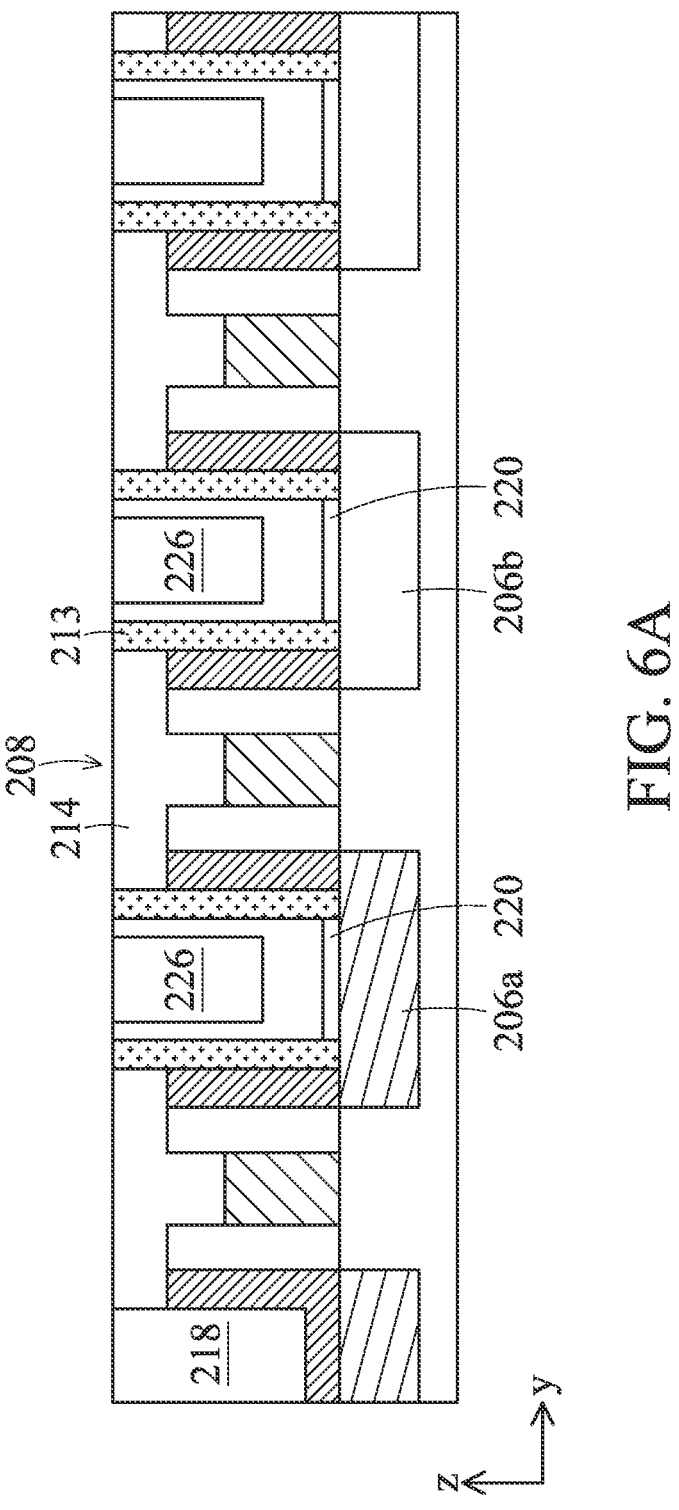

At operation 110, in reference to FIG. 6A, the method 100 planarizes the metal 224 to form S/D contacts 226. In some embodiments, portions of the seed layer 222 is also planarized along with the metal 224. After the planarization, a top surface of each of the S/D contacts 226 may be coplanar with top surfaces of the gate structure 208. In some embodiments, the top surfaces of each of the S/D contacts 226 becomes coplanar with top surfaces of the dielectric caps 214, the etch stop layers 213, and the ILD layer 218. In this embodiment, each of the S/D contacts 226 is a mono-layer metal contact, having a single metal material. In a preferred embodiment, the single metal material is molybdenum (Mo).

At operation 112 and 114, and in reference to FIGS. 7A-11A, the method 100 forms S/D vias 234a over the S/D contacts 226 and gate vias 234b over the metal gates 210. In reference to FIG. 7A, an etch stop layer 227 may be formed over the planarized device 200. The etch stop layer 227 may be similar to the etch stop layer 213 in composition. The etch stop layer 227 forms directly over the S/D contacts 226 and gate structures 208. In reference to FIG. 8A, an ILD layer 228 may be formed over the etch stop layer 227. The ILD layer 228 may be similar to the ILD layer 218 in composition. In reference to FIG. 9A, trenches including S/D via trenches 230a and gate via trenches 230b may be formed. The S/D via trenches 230a may be formed through the ILD layer 228 and the etch stop layer 227 to expose a top surface of the S/D contacts 226. The gate vias trenches 230b may be formed through the ILD layer 228, the etch stop layer 227, and the dielectric caps 214 to expose a top surface of the metal gate 210. The trenches 230a and 230b may be formed through photolithography and etching processes. For example, the photolithography process may form a masking element covering areas of the device 200 that are not to be etched and exposing areas that are to be etched. The trenches 230a and 230b may be formed in a same or different process steps. In some embodiments, the gate via trenches 230b are deeper in the z direction than the S/D via trenches 230a. The trenches 230a and 230b may be lined with a barrier layer 232 along sidewalls of the trenches. The barrier layer is a dielectric barrier layer formed by a suitable procedure that includes deposition and anisotropic etch (e.g., plasma etch) to remove the deposited barrier layer on bottom surface of the trenches. The barrier layer may comprise silicon nitride, silicon oxynitride, other suitable dielectric material or a combination thereof.

Figure 10A:
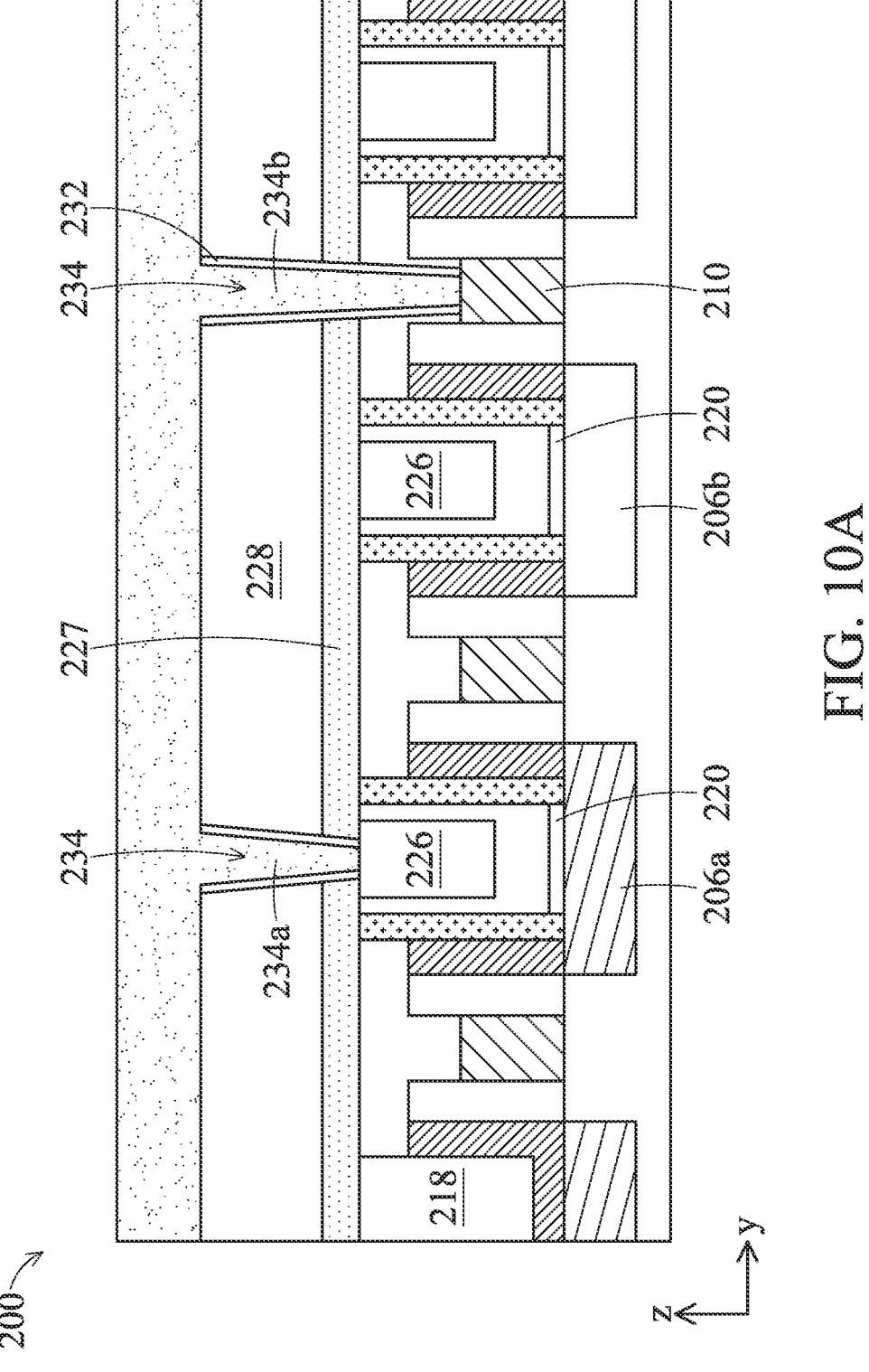
Figure 10B:
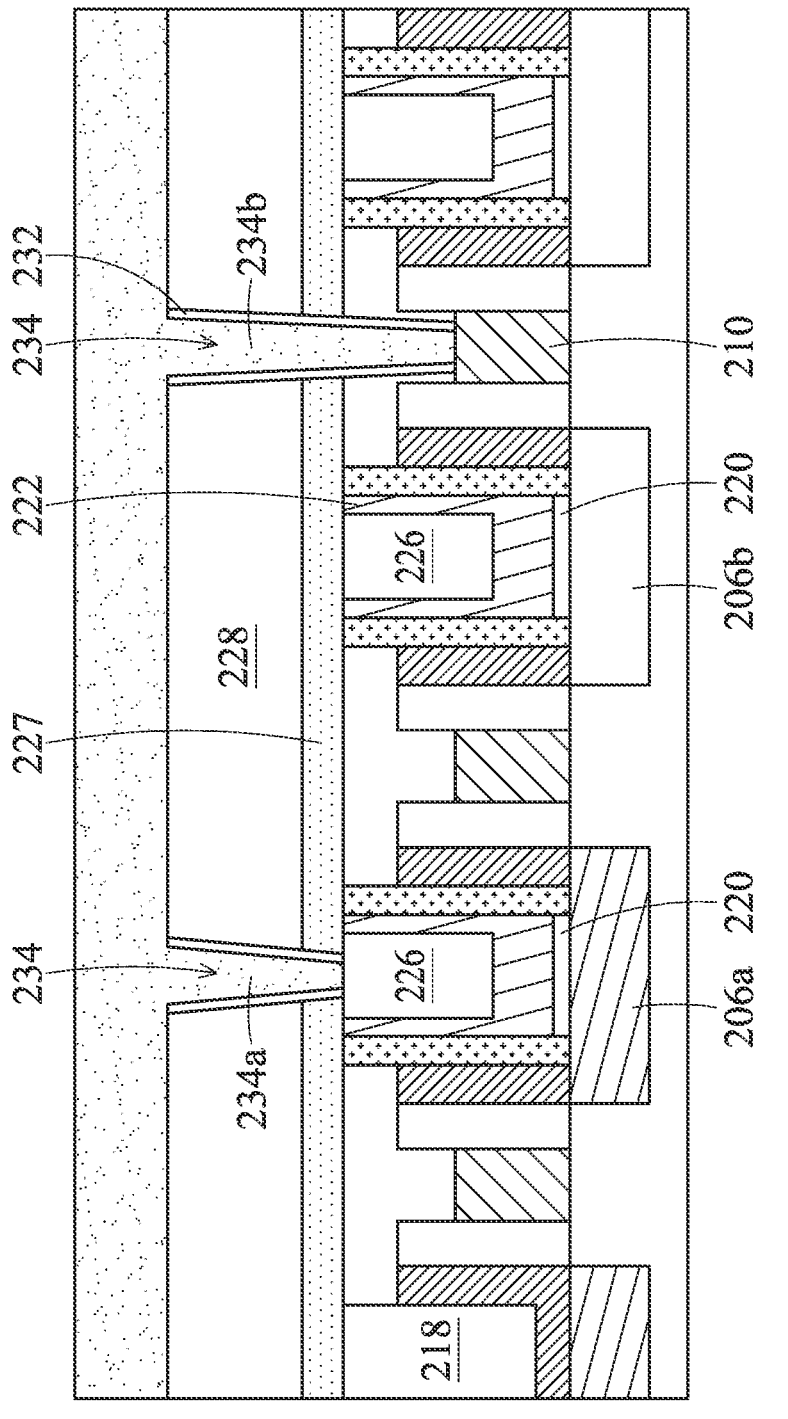
Figure 11A:
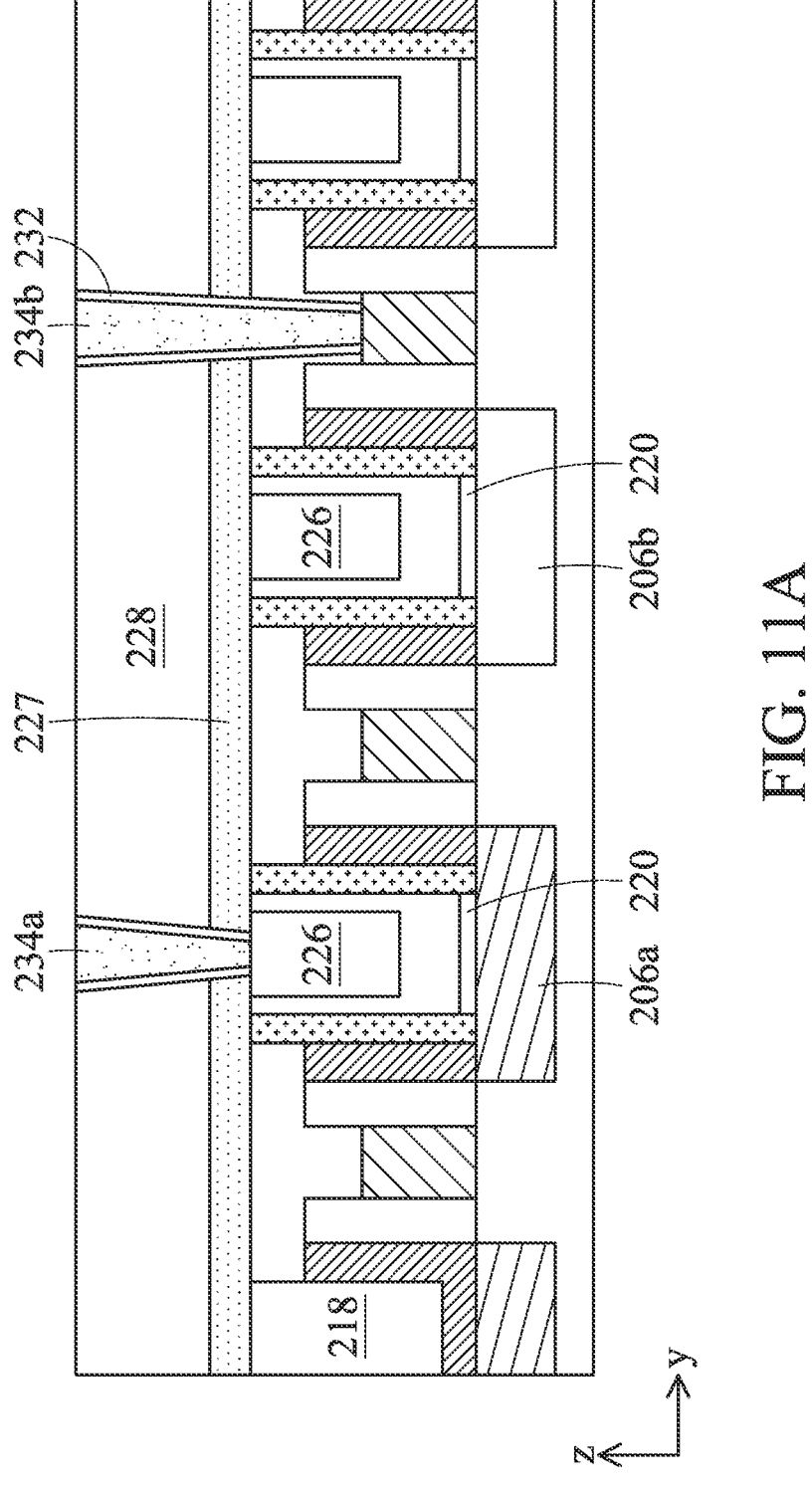
Figure 11B:
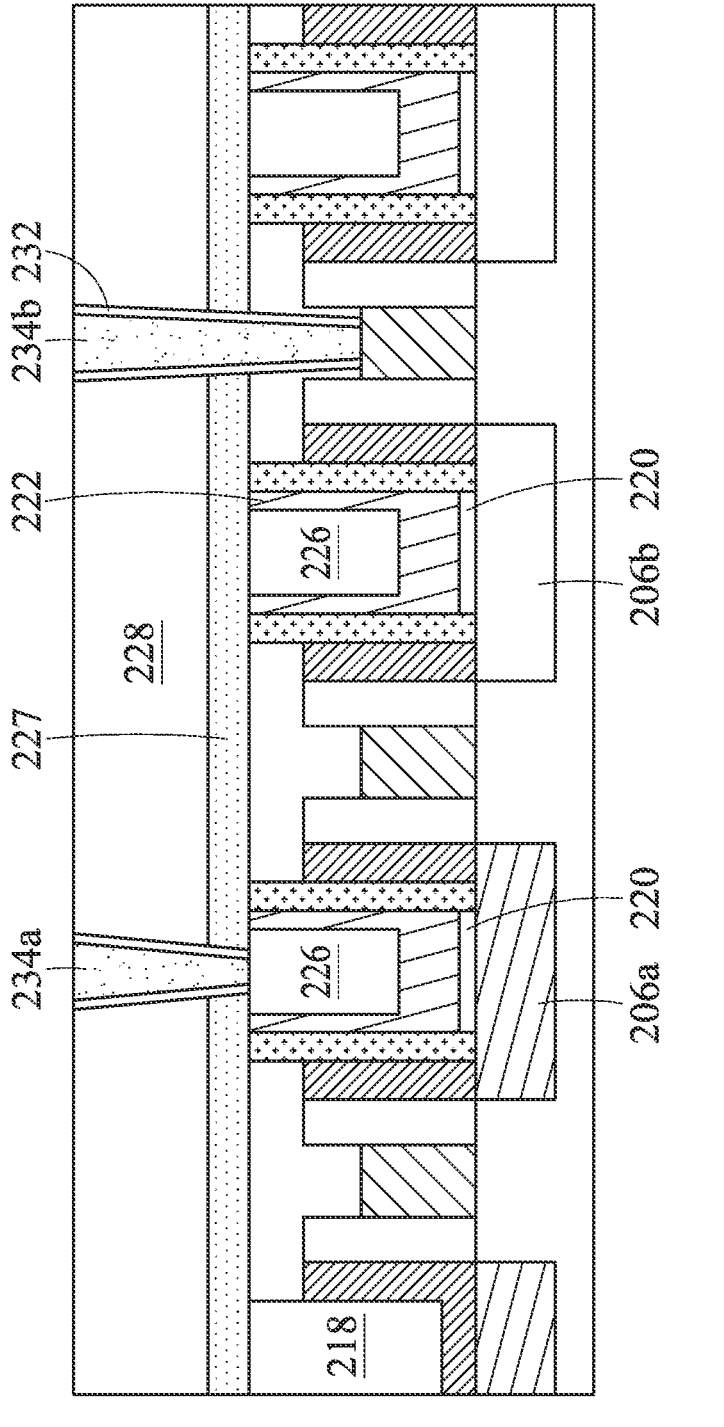

Referring to operation 112 and 114, in reference to FIG. 10A, the trenches 230a and 230b are filled to form vias 234. The vias 234 may be S/D vias 234a interfacing with S/D contacts 226 or gate vias 234b interfacing with metal gates 210. Now in reference to FIG. 11A, the vias 234 are planarized such that top surfaces of the vias 234a and 234b_are coplanar with the top surface of the ILD layer 228. The S/D contacts 226 provide seamless metal landing for the S/D vias 234a. Thus, the S/D vias 234a may also be formed to be without seams or voids. In some embodiments, the S/D vias 234a are directly grown from the S/D contacts 226. The S/D vias 234a have the same metal material as portions of the S/D contacts 226 it directly lands on. In some embodiments, the S/D vias 234a comprise molybdenum (Mo).

Figure 12A:
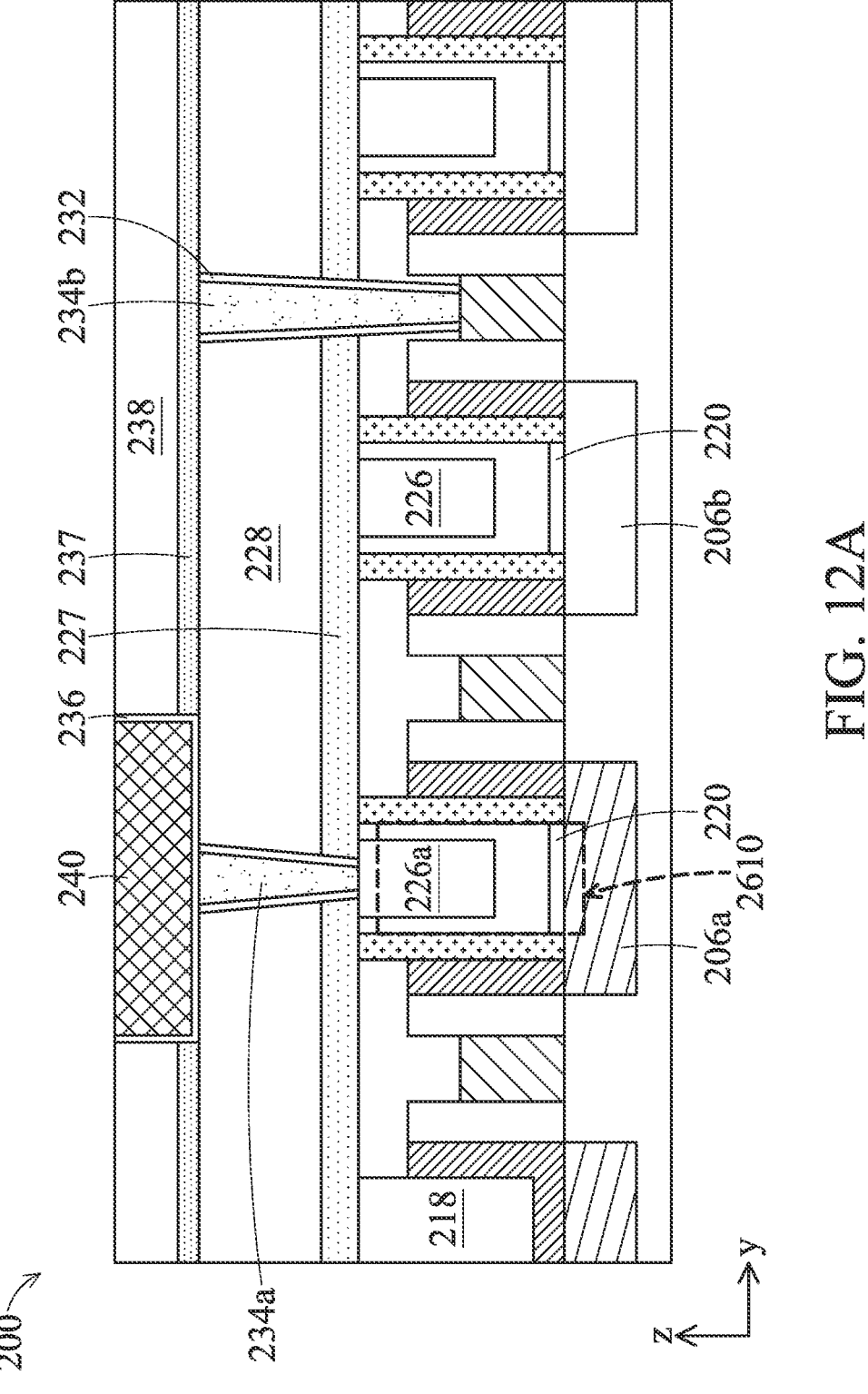

At operation 116, in reference to FIG. 12A, metal lines, such as metal line 240, are formed over the vias 234 and over the ILD layer 228. The metal line 240 may contact S/D vias 234a. The metal line 240 may include a conductive barrier layer 236 that acts as a glue layer enclosing a metal fill material of the metal line 240. The conductive barrier layer 236 is of a different composition than the barrier layer 232. The conductive barrier layer 236 may comprise titanium (Ti), titanium nitride (TiN), tantalum (Ta), or tantalum nitride (TaN). The metal fill material of the metal line 240 may be formed by isotropic growth. Since there is a larger volume or spacing to form the metal line 240, a bottom-up metal growth scheme is not necessary to avoid seams or voids. As shown, the metal line 240 may be embedded in another etch stop layer 237 and another ILD layer 238. These layers are formed in a similar way with respect to the etch stop layer 227 and ILD layer 228 described above. Additional operations may be performed to complete fabrication of the device 200. For example, additional vertical interconnect features such as additional contacts and/or vias, and/or horizontal interconnect features such as more metal lines, and multilayer interconnect features such as metal layers and interlayer dielectrics can be formed over the device 200. In the disclosed embodiment, the conductive barrier layer 236 is thinner than the etch stop layer 237, and the bottom surface of the conductive barrier layer 236 and the bottom surface of the etch stop layer 237 are coplanar. In furtherance of the embodiment, the gate vias 234b and the S/D vias 234a extend vertically to the interface of the ILD layer 228 and the etch stop layer 237.

Figure 26:
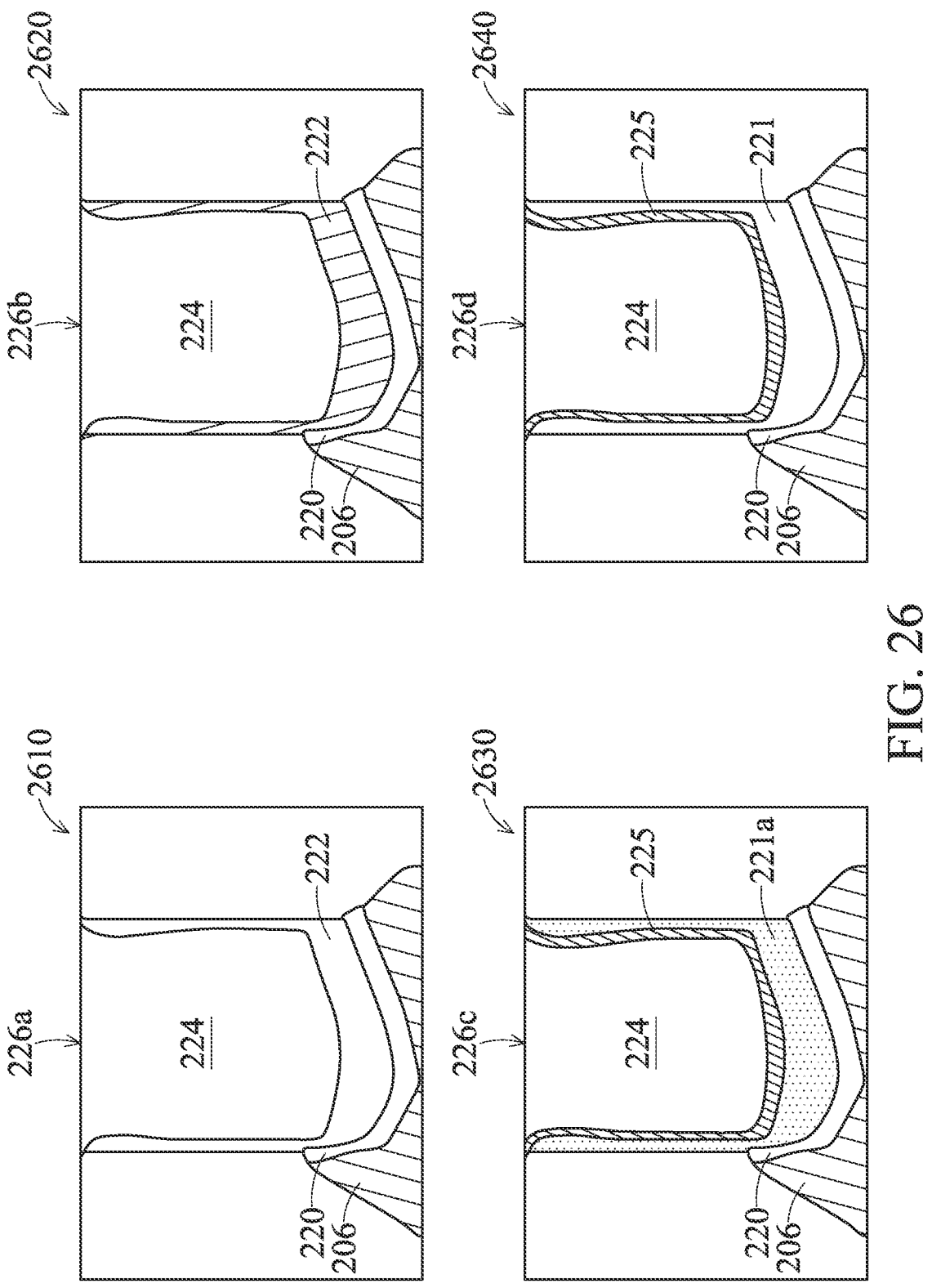
FIG. 26 is an enlarged view of dashed boxes of FIGS. 12A, 12B, 25A and 25B.

Still referring to FIG. 12A, a dashed box 2610 illustrates a mono-layer metal contact 226a and certain other surrounding features. The dashed box 2610 encloses in part or in full, an S/D feature 206a, a silicide feature 220, a seed layer 222 (part of metal contact 226a), and a metal 224 (part of metal contact 226a). A zoomed-in depiction of the dashed box 2610 is illustrated in FIG. 26, which portrays an embodiment of the above-mentioned elements in a real device. As shown in the zoomed-in portrayal 2610, the S/D feature 206 may have an etch-back so that a top surface of the S/D feature 206 curves inwards and the silicide feature 220 is formed over the curved top surface. The seed layer 222 and metal 224 have side portions and bottom portions, where the respective side and bottom portions have rounded corners at the interfaces therebetween. In the disclosed embodiment of the seed layer 222, the bottom portion is thicker than the respective side portions. Although in this embodiment, the metal material for the seed layer 222 and metal 224 are the same, there is an interface between the seed layer 222 and the metal 224 that may be defined by a higher concentration of remaining halide components described above.

FIGS. 2B-12B illustrate cross-sectional views of a semiconductor device 200 at intermediate stages of fabrication and processed in accordance with the method 100 of FIG. 1 according to another embodiment of the present disclosure. FIGS. 2B-12B are similar to FIGS. 2A-12A, respectively. Likewise, the description that accompany FIGS. 2A-12A may be similarly applied to FIGS. 2B-12B. For the sake of brevity, the similar features and configurations will not be repeated here.

Figure 4B:
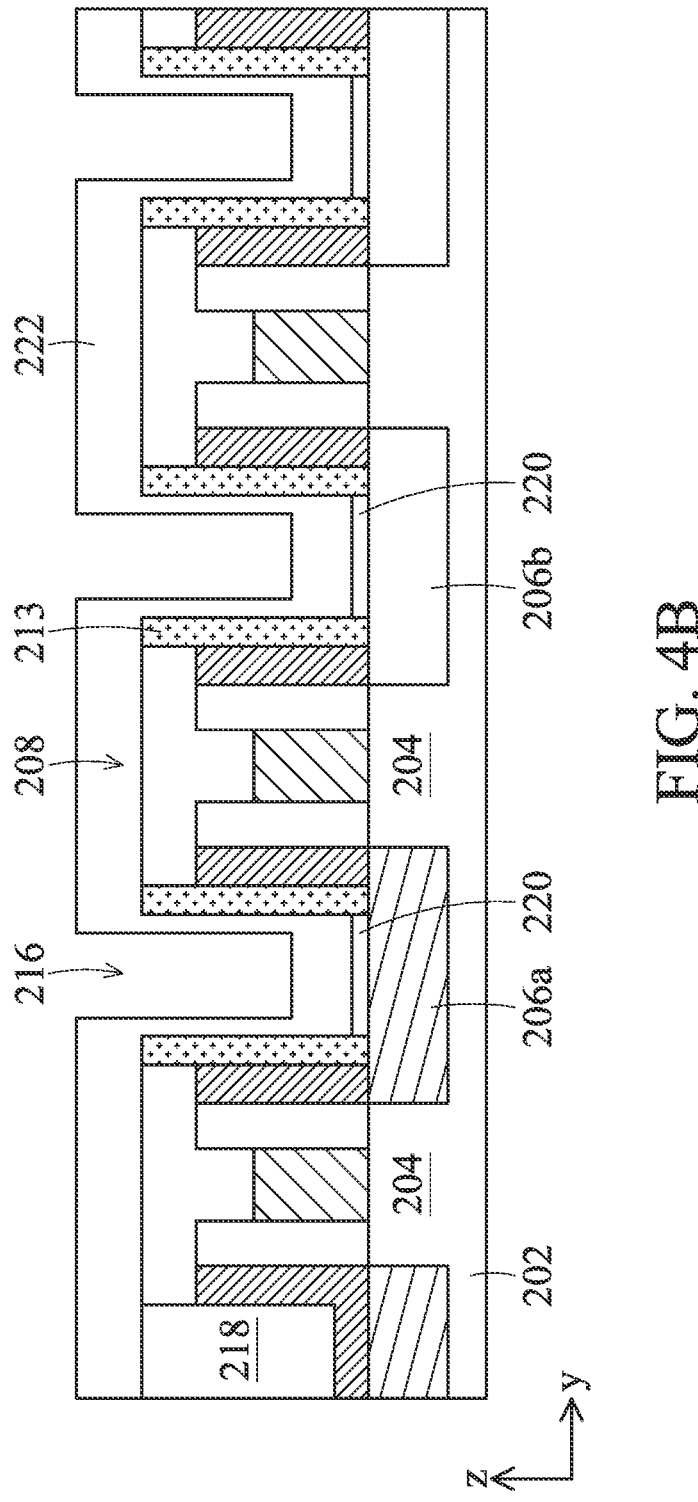

At operation 106, in reference to FIG. 4B, a seed layer 222 is deposited by PVD into the trenches 216, much like the process described in FIG. 4A. The seed layer 222 forms over the silicide features 220 and side portions of the trenches 216. In this embodiment, the seed layer 222 is to be of a different metal material than the metal 224 (See FIG. 5B) that will grow on top of it. The seed layer 222 may be strategically chosen for better adhesion with the silicide features 220, while having good interface contact with the metal 224. In a preferred embodiment, the seed layer 222 is a tungsten (W) metal layer.

Figure 5B:
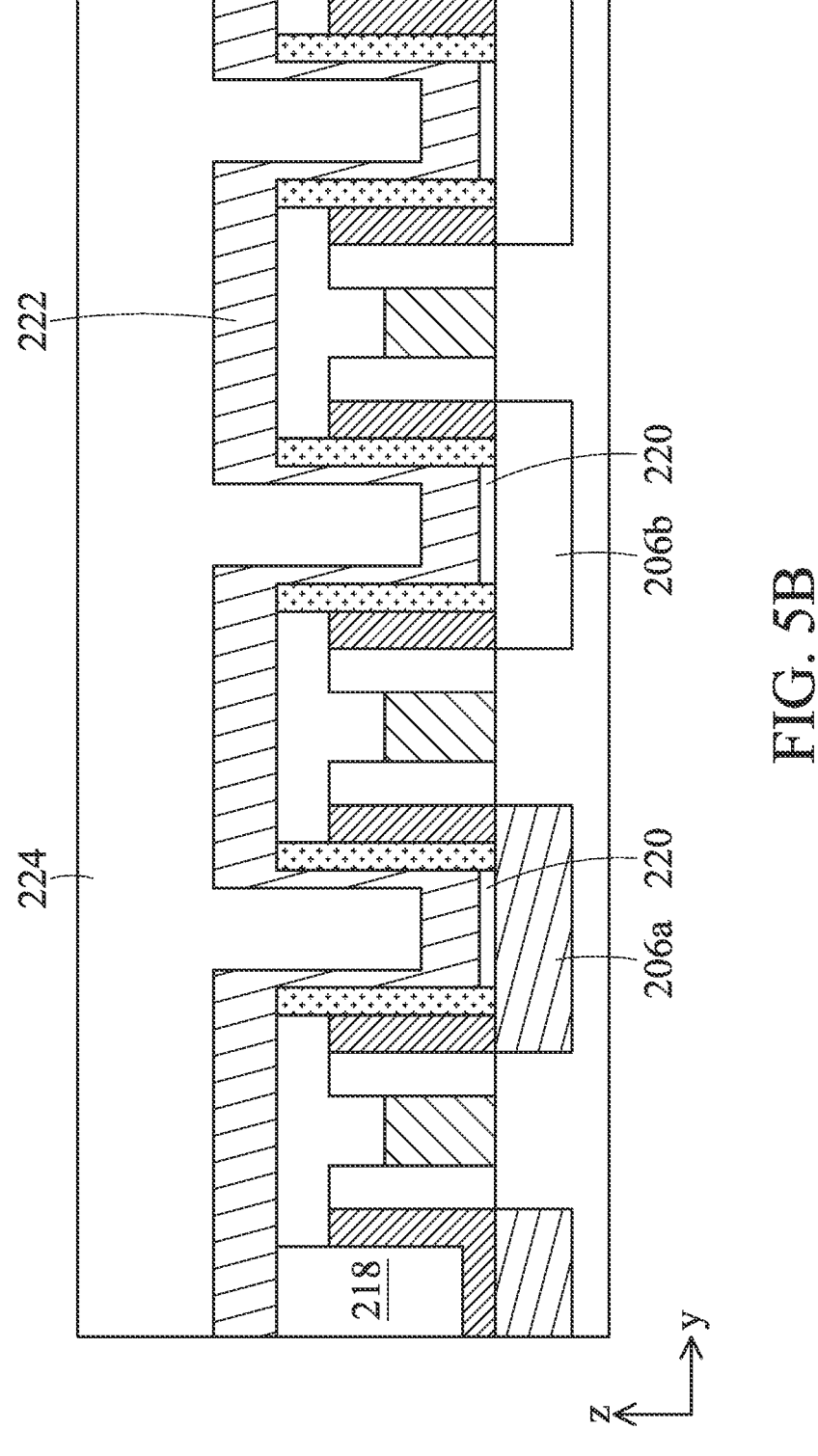

At operation 108, in reference to FIG. 5B, the method 100 deposits a metal 224 on the seed layer 222 by a suitable method, such as CVD or ALD. This is much like the process described with respect to FIG. 5A. As mentioned above, the metal 224 and the seed layer 222 are made of different metals. The metal 224 may be strategically chosen for lower resistivity and better integration with surrounding dielectric materials without inter-diffusion concerns. In a preferred embodiment, the metal 224 is molybdenum (Mo), which is found to have good interface contact with tungsten if tungsten is the seed layer 222. In other embodiments, other fill metal materials may be used if those fill metal materials also have good interface contact with the seed layer 222.

Figure 6B:
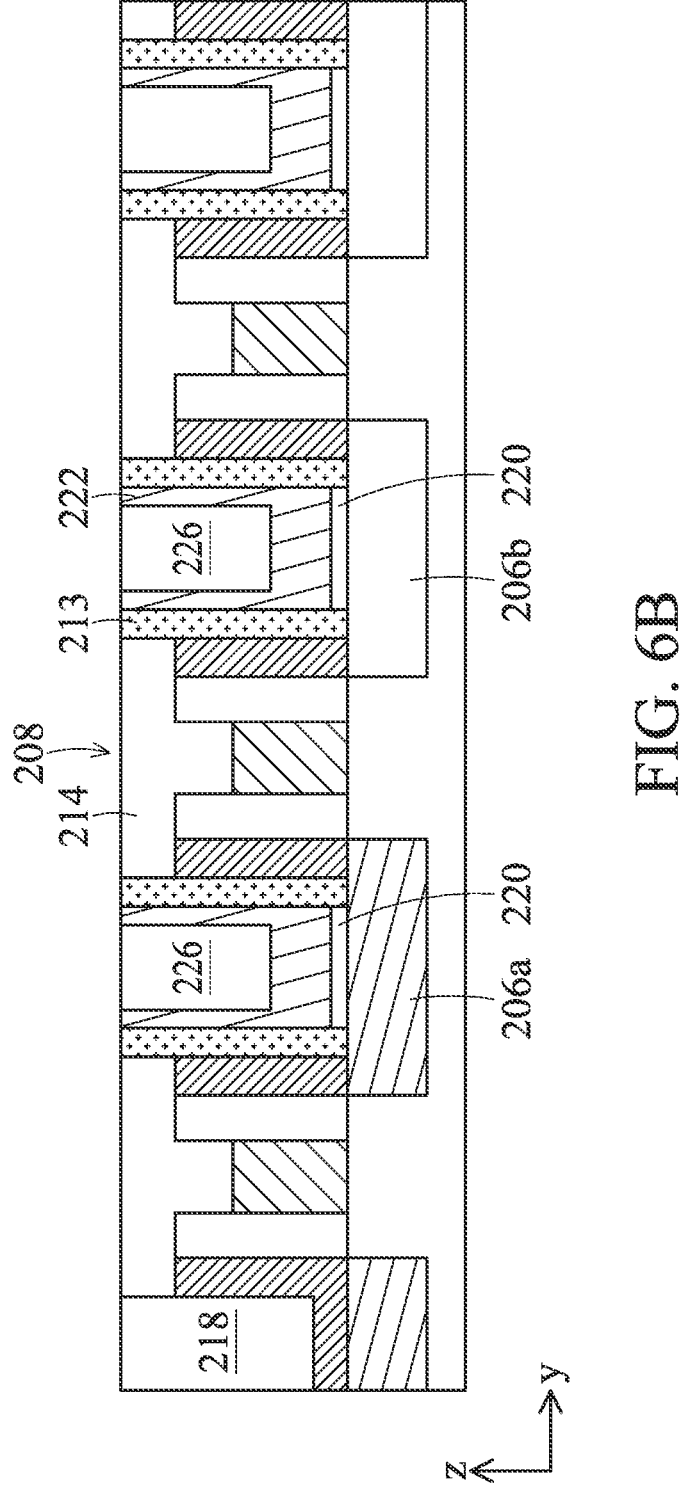
Figure 7A:
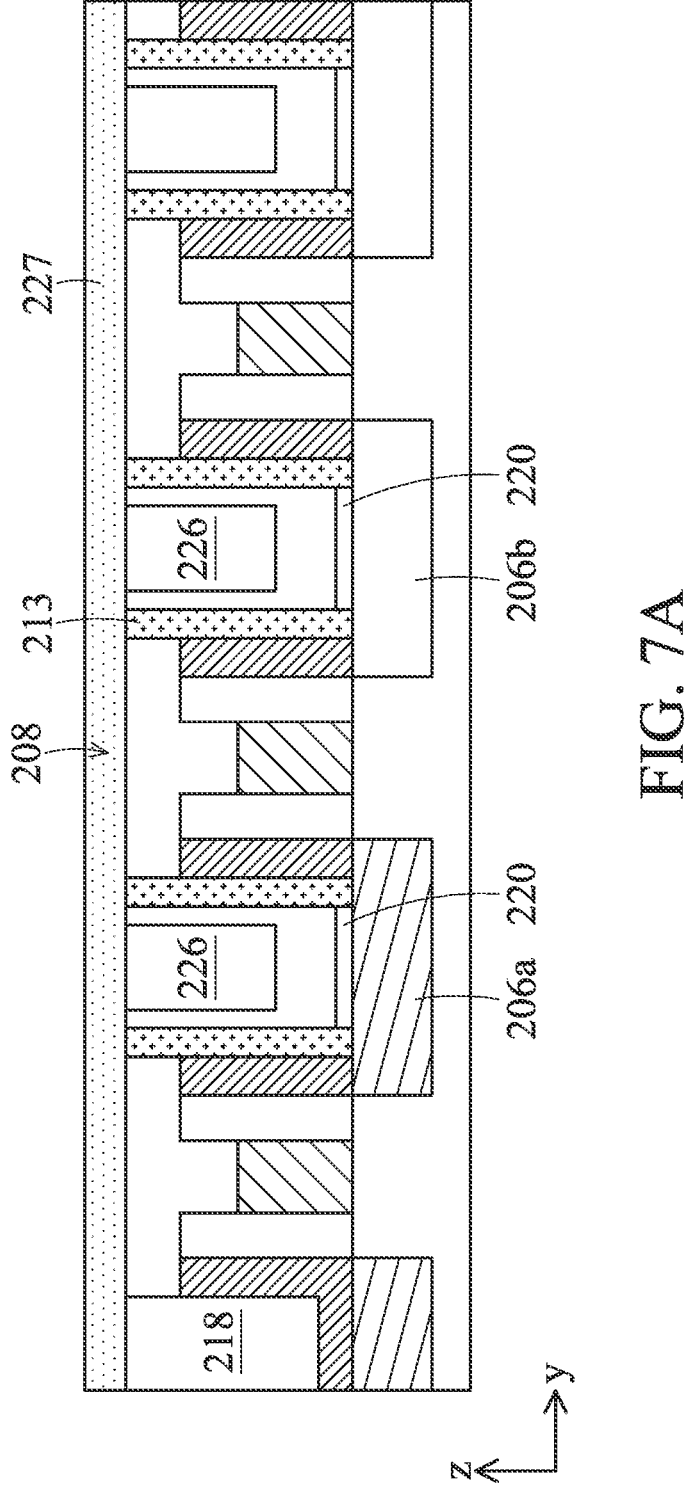
Figure 7B:
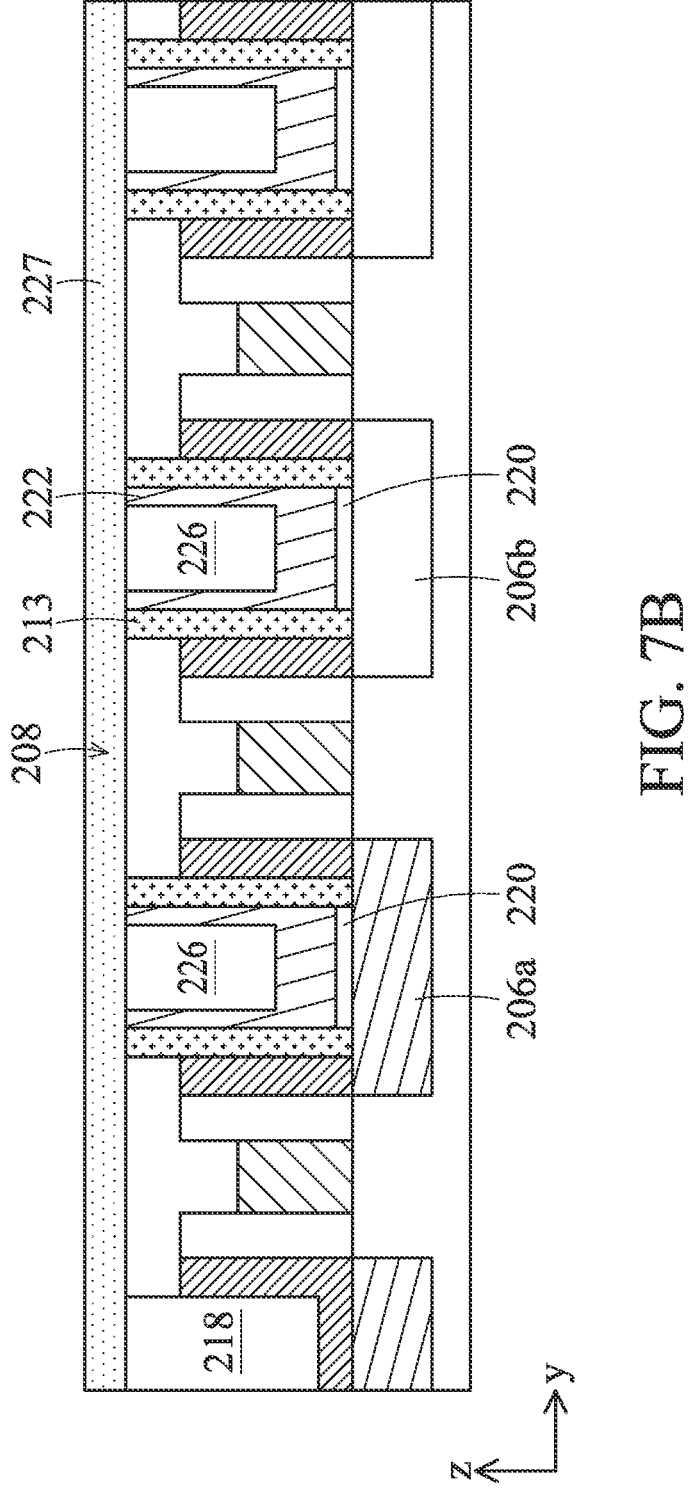
Figure 8A:
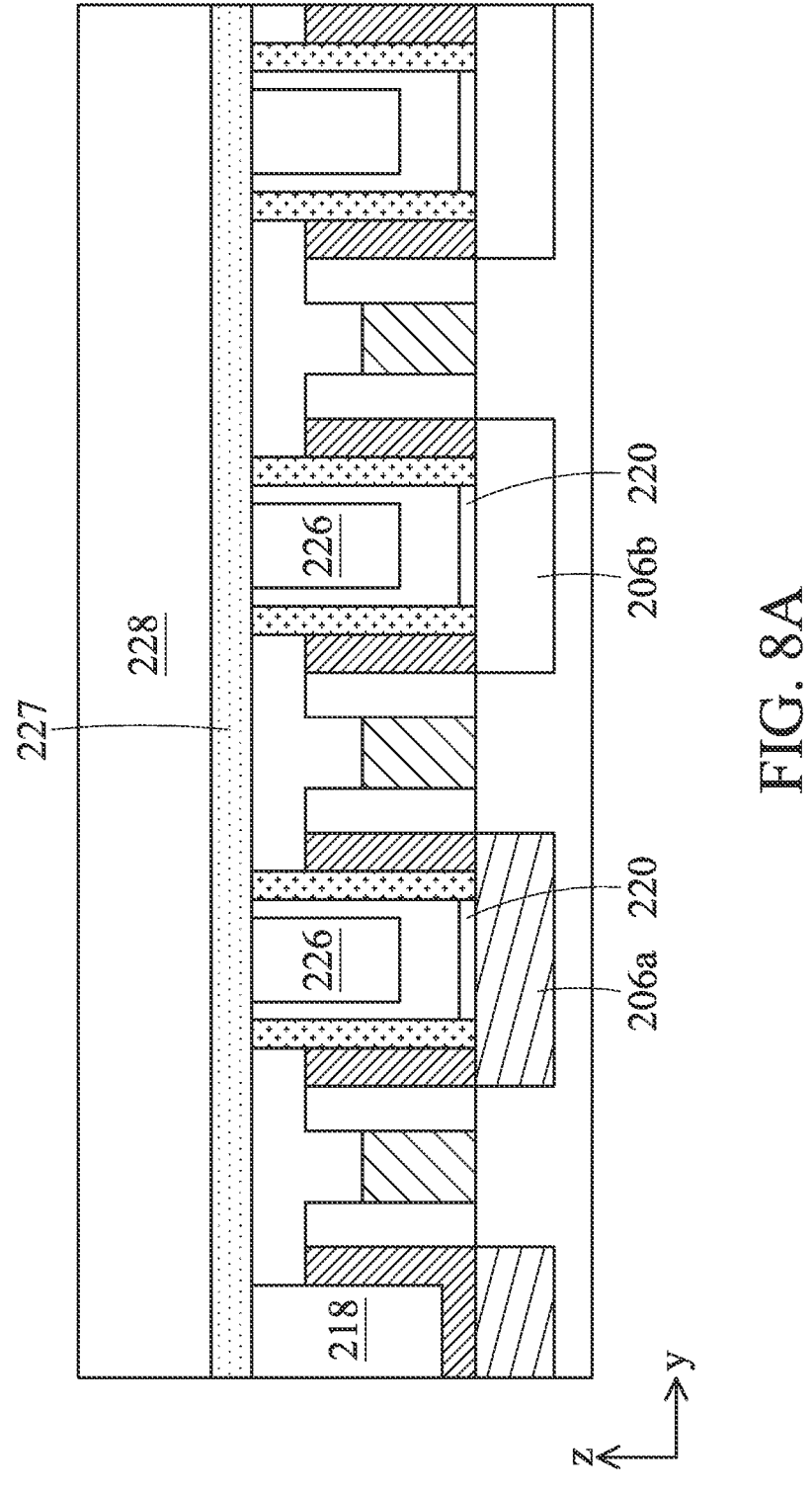
Figure 8B:
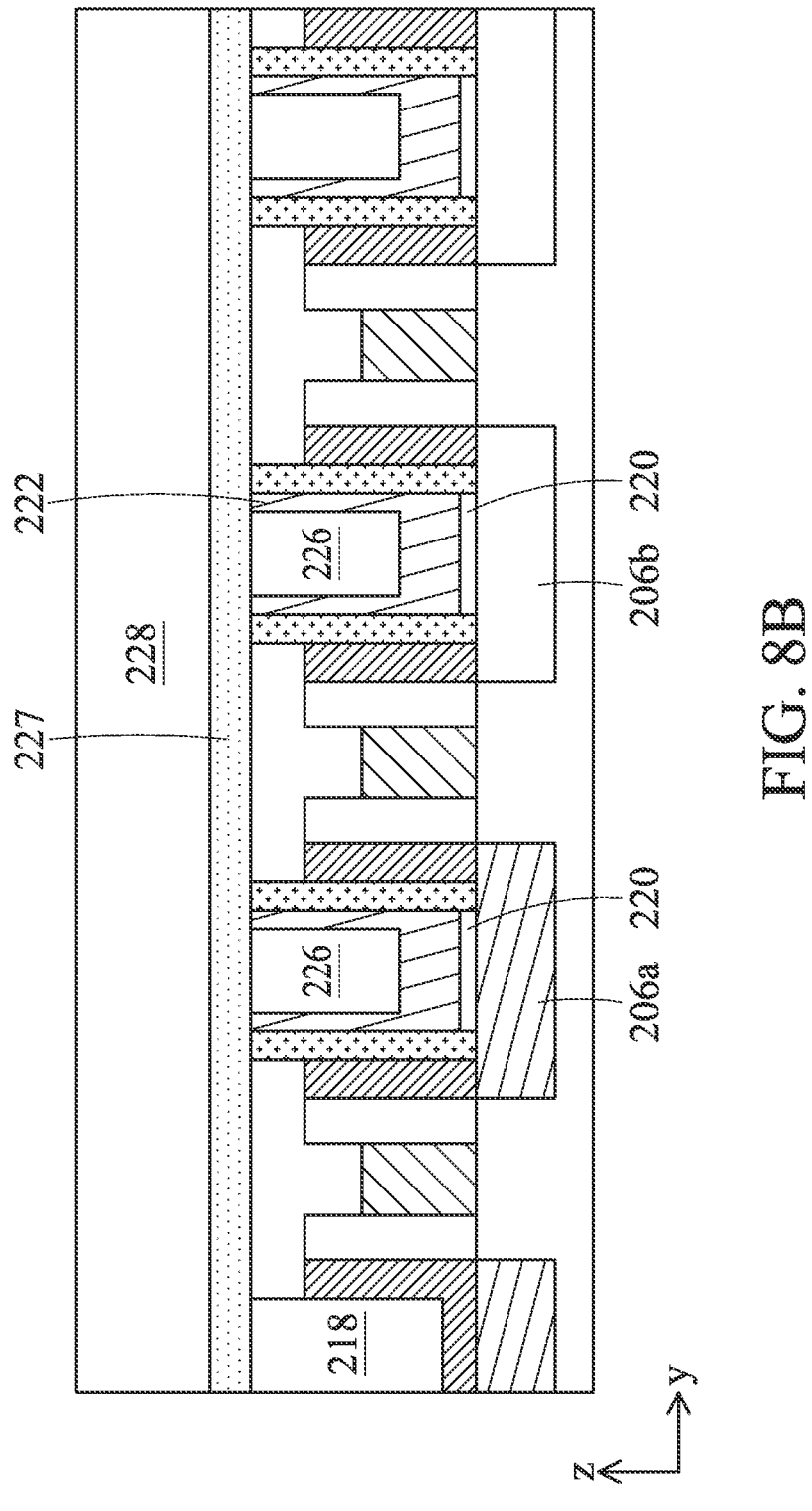
Figure 9A:
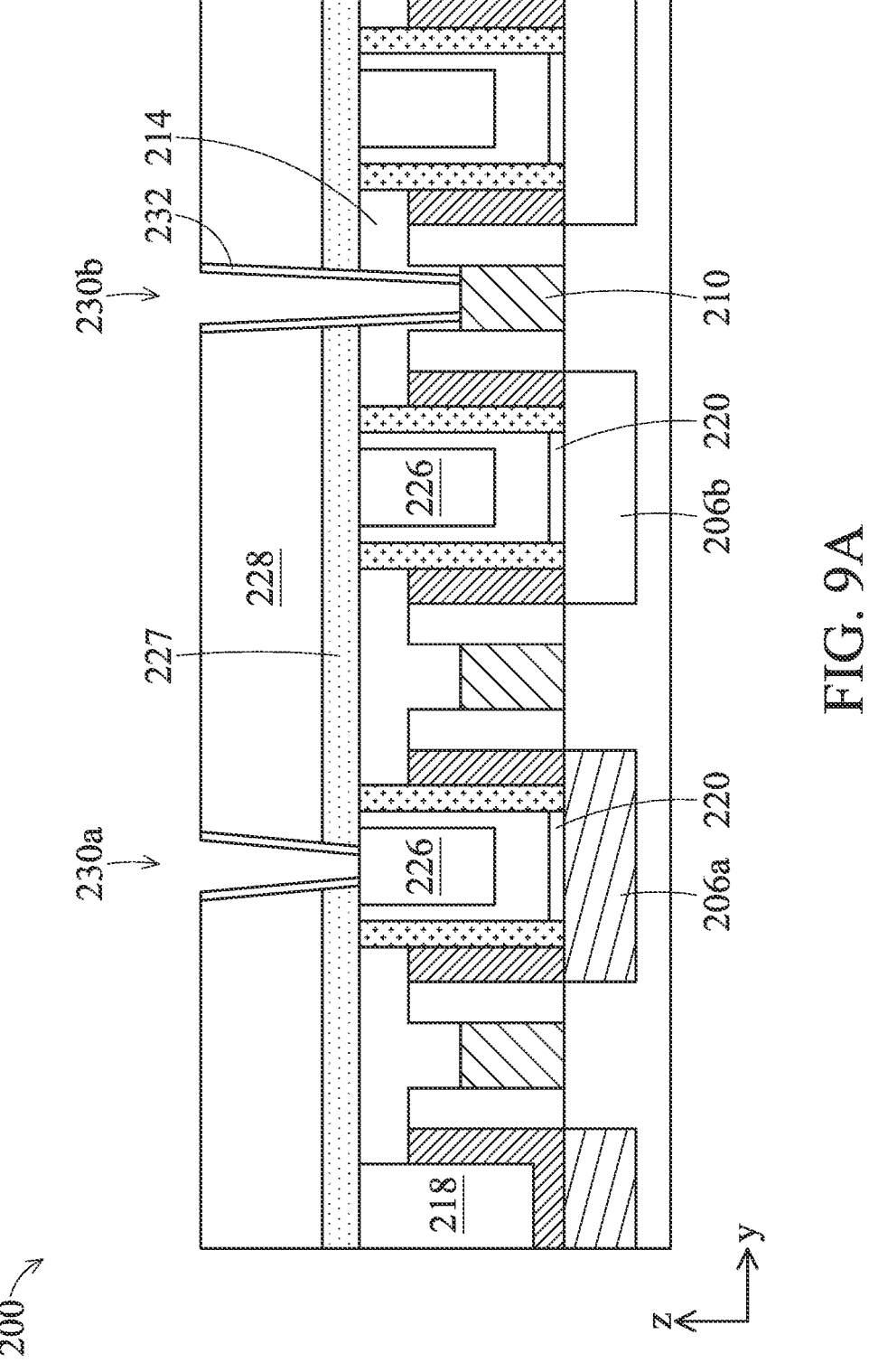
Figure 9B:
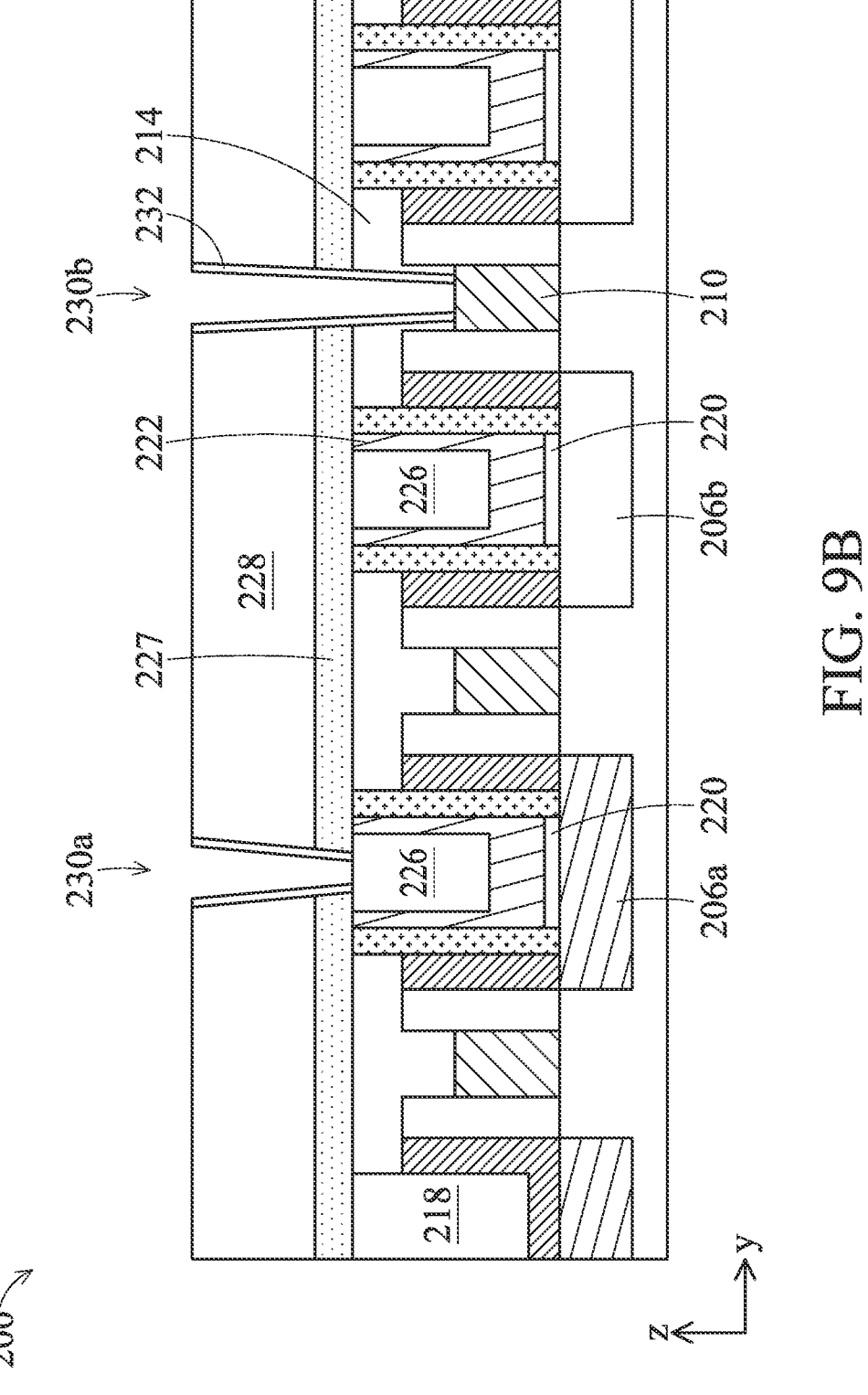

At operation 110, in reference to FIG. 6B, the method 100 planarizes the metal 224 to form S/D contacts 226. This is much like the process described in FIG. 6A. In this embodiment, after the planarization, a top surface of each of the planarized metal 224 may be coplanar with a top surface of the seed layer 222. As shown, the S/D contacts 226 include portions of the metal 224 sandwiched between sidewall portions of the seed layer 222. In this embodiment, each of the S/D contacts 226 is a bi-layer metal contact, having two metal materials. In a preferred embodiment, the two metal materials are tungsten (W) and molybdenum (Mo), with Mo filled over and between portions of W.

At operation 112 and 114, and in reference to FIGS. 7B-11B, the method 100 forms S/D vias 234a over the S/D contacts 226 and gate vias 234b over the metal gates 210 much like in FIGS. 7A-11A. In reference to FIG. 10B, portions of the S/D contacts 226 provide seamless metal landing for the S/D vias 234a. Particularly, the metal 224 (see FIG. 5B) filled over the seed layer 222 provides the landing for the S/D vias 234a. Thus, the S/D vias 234a may also be formed to be without seams or voids. In some embodiments, the S/D vias 234a are selectively grown from the S/D contacts 226. The S/D vias 234a have the same metal material as the metal 224 it lands on. In some embodiments, the S/D vias 234a comprise molybdenum (Mo). At operation 116, shown in FIG. 12B, additional processes are performed much like in FIG. 12A.

Figure 12B:
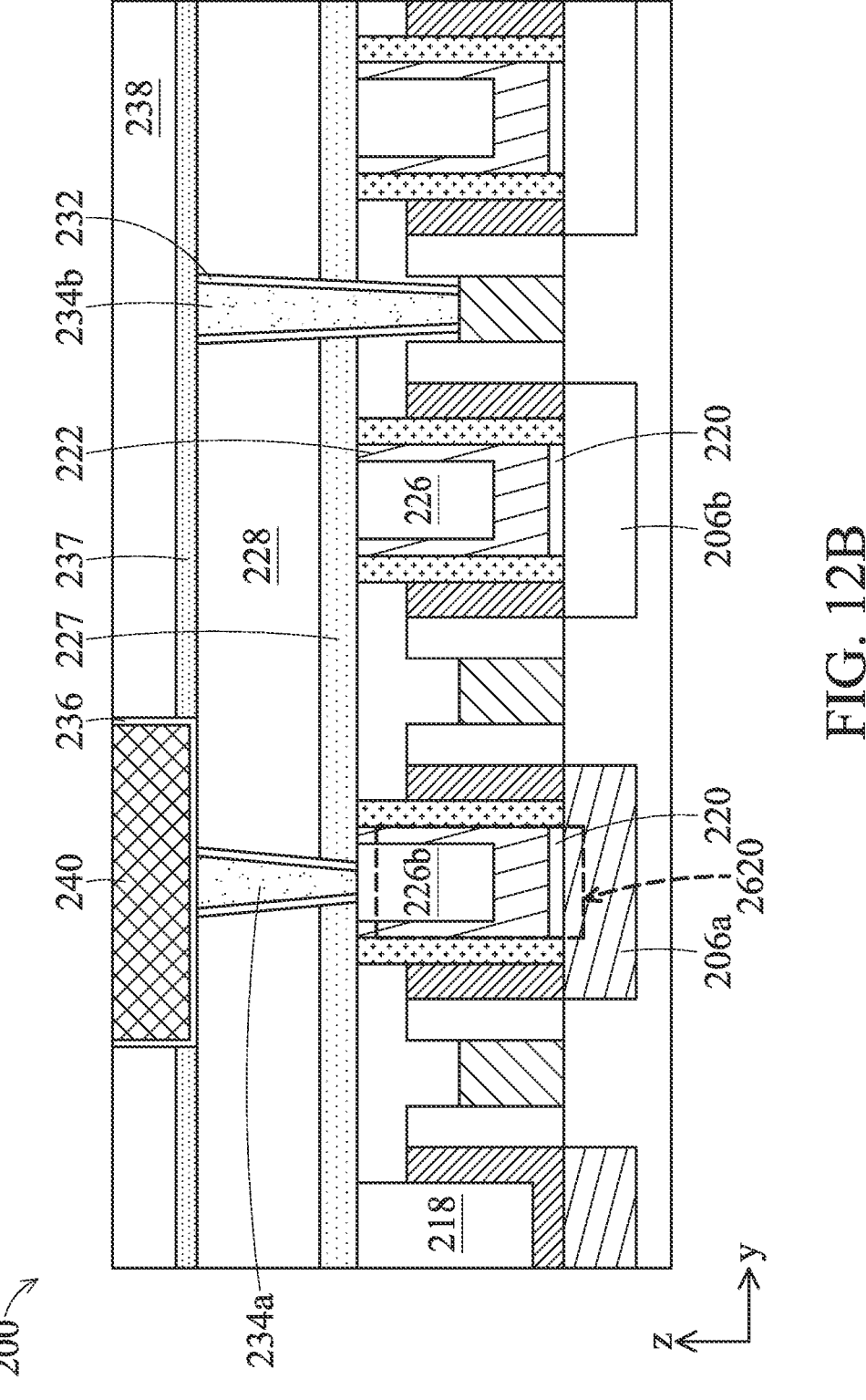

Referring to FIG. 12B, a dashed box 2620 illustrates a bi-layer metal contact 226b and certain other surrounding features. The dashed box 2620 encloses in part or in full, an S/D feature 206a, a silicide feature 220, a seed layer 222 (part of metal contact 226b), and a metal 224 (part of metal contact 226b). A zoomed-in depiction of the dashed box 2620 is illustrated in FIG. 26, which portrays an embodiment of the above-mentioned elements in a real device. As shown in the zoomed-in portrayal 2620, the S/D feature 206 may have an etch-back so that a top surface of the S/D feature 206 curves inwards and the silicide feature 220 is formed over the curved top surface. The seed layer 222 and metal 224 have side portions and bottom portions, where the respective side and bottom portions have rounded corners at the interfaces therebetween. In the disclosed embodiment of the seed layer 222, the bottom portion is thicker than the respective side portions. In this embodiment, the metal material for the seed layer 222 and metal 224 are different, and an interface between the seed layer 222 and the metal 224 may be defined by a higher concentration of remaining halide components described above.

FIG. 13 is a flow chart of another method 1300 for fabricating metal contacts, in portion or entirety, according to various aspects of the present disclosure. The method 1300 is similar to the method 100, such that operation 102 corresponds to operation 1302, operation 104 corresponds to operation 1304, and so on. For the sake of brevity, some of the similar features and process steps will not be recited again. One difference between the method 100 and the method 1300 is the extra operation 1305, where the method 1300 forms metal cap layers by PVD over the silicide features. As such, in operation 1306, the seed layer is formed on top of the metal cap layers rather than directly landing on the silicide features like in method 100.

FIGS. 14A-25A illustrate cross-sectional views of a semiconductor device 200 at intermediate stages of fabrication and processed in accordance with the method 1300 of FIG. 13 according to an embodiment of the present disclosure. FIGS. 14A-25A have been simplified for the sake of clarity to better understand the inventive concepts of the present disclosure. Additional features may be added in the device 200, and some of the features described below can be replaced, modified, or eliminated in other embodiments of the device 200. The semiconductor device 200 may be a portion of an integrated circuit (IC) chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOS-FETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the device is included in a non-volatile memory, such as a non-volatile random access memory (NVRAM), a flash memory, an electrically erasable programmable read only memory (EE-PROM), an erasable programmable read-only memory (EPROM), other suitable memory type, or combinations thereof.

Figure 14A:
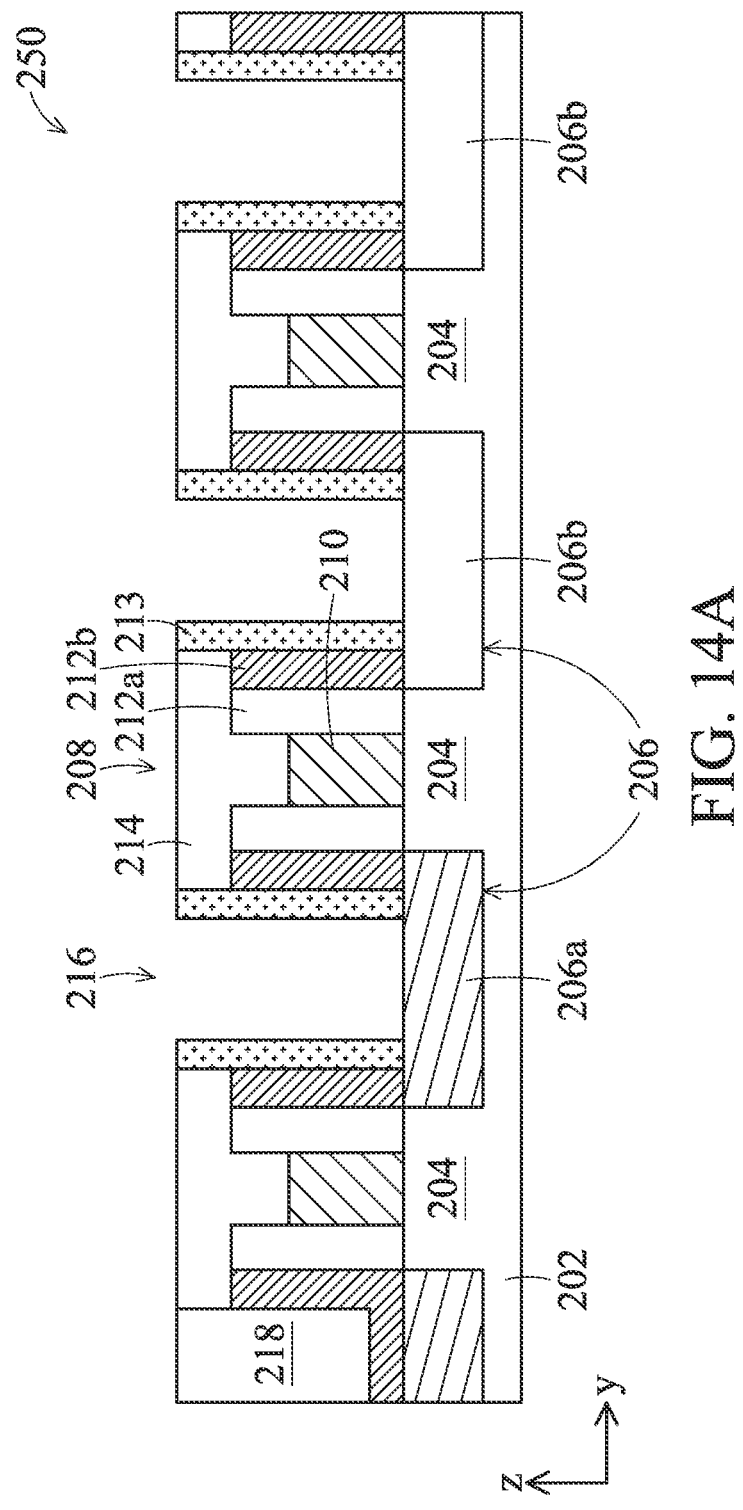
Figure 14B:
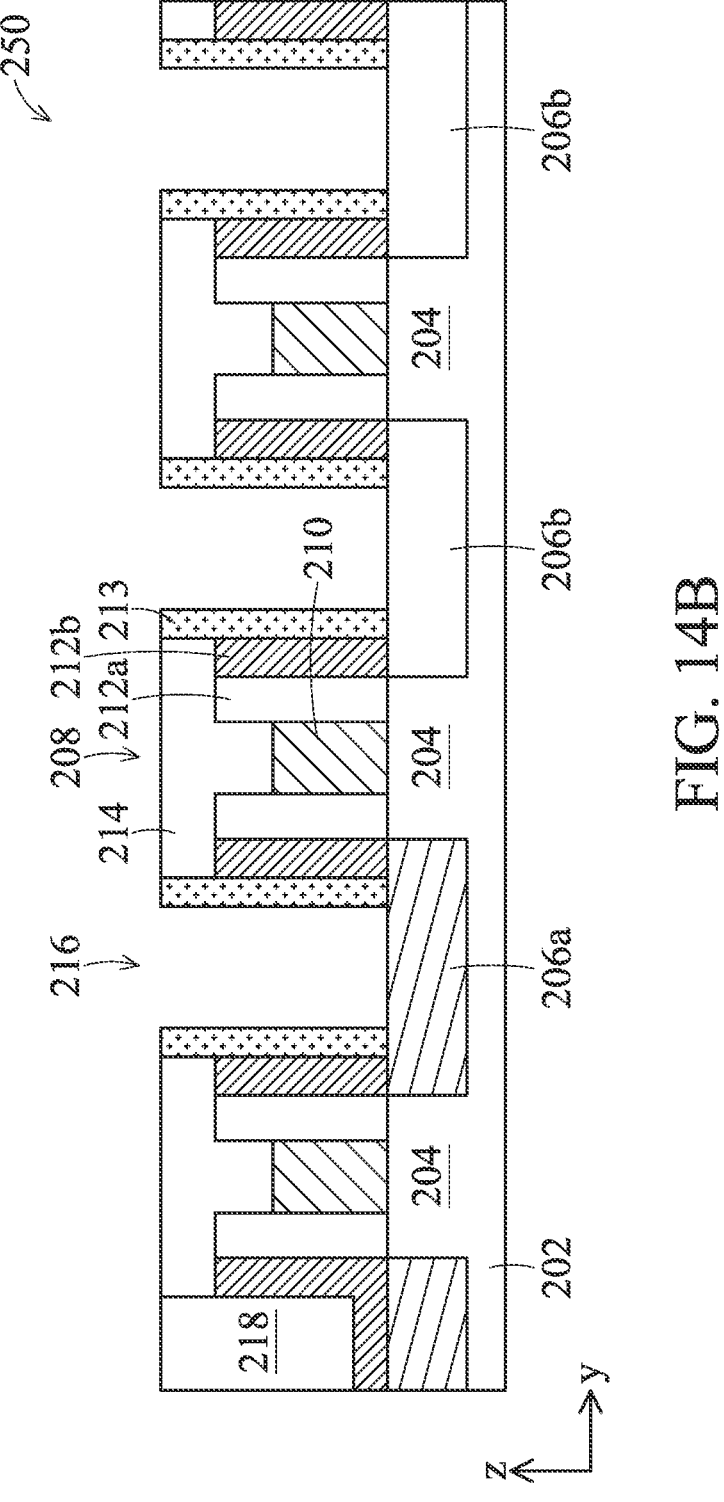

At operation 1302, the method 1300 receives a workpiece 250 of the device 200, an embodiment of which is illustrated in FIG. 14A. The workpiece 250 may include a substrate 202 and channel regions 204 protruding from the substrate 202. S/D features 206 are disposed adjacent to the channel regions 204, which may include n-type S/D features 206a for n-type transistors and p-type S/D features 206b for p-type transistors. The n-type S/D features 206a may be epitaxially grown and comprise doped silicon. The p-type S/D features 206b may be epitaxially grown and comprise doped silicon germanium. The n-type S/D features 206a may be doped with n-type dopants such as arsenic, phosphorus, and/or other n-type dopants. The p-type S/D features 206b may be doped with p-type dopants such as boron, germanium, indium, and/or other p-type dopants.

Gate structures 208 are disposed over the channel regions 204. Each of the gate structures may include a metal gate 210 and gate spacers 212a and 212b along sidewalls of the metal gate 210. The gate spacers 212a and 212b may include a dielectric material, such as silicon oxide, silicon nitride, silicon carbide, silicon oxynitride, a low-k material, and/or other suitable dielectric materials. In this embodiment, there is an inner gate spacer 212a and an outer gate spacer 212b, which may include different dielectric materials. In other embodiments, there may only be one gate spacer. Each of the gate structures may further include a dielectric cap 214 over the metal gate 210 and over the gate spacers 212a and 212b. The dielectric cap 214 may have a center portion that dips lower than side portions of the dielectric cap 214. In these cases, the metal gates 210 are lower in the z direction than the gate spacers 212a and 212b. In some embodiments, the workpiece 250 further includes etch stop layers 213 along sidewalls of the metal gate structures. For example, the etch stop layers 213 may be disposed adjacent to the outer gate spacers 212b and the dielectric caps 214. The etch stop layers 213 may be of a different material composition than the gate spacers 212a and 212b. The etch stop layer 213 may include silicon nitride, silicon oxynitride, or other suitable materials.

Several trenches 216 are formed between the gate structures 208. In some embodiments, the trenches 216 are disposed between gate spacers 212 of different gate structures 208. In other embodiments, the trenches 216 are disposed between adjacent etch stop layers 213. The trenches 216 expose a top surface of the S/D features 206. In some embodiments, instead of a trench exposing an S/D feature 206, an interlayer dielectric (ILD) layer 218 is disposed over the S/D feature instead. The ILD layer 218 may comprise tetraethylorthosilicate (TEOS) oxide, undoped silicate glass, or doped silicon oxide such as borophosphosilicate glass (BPSG), fluoride-doped silica glass (FSG), phosphosilicate glass (PSG), boron doped silicon glass (BSG), a low-k dielectric material, and/or other suitable dielectric materials.

Figure 15A:
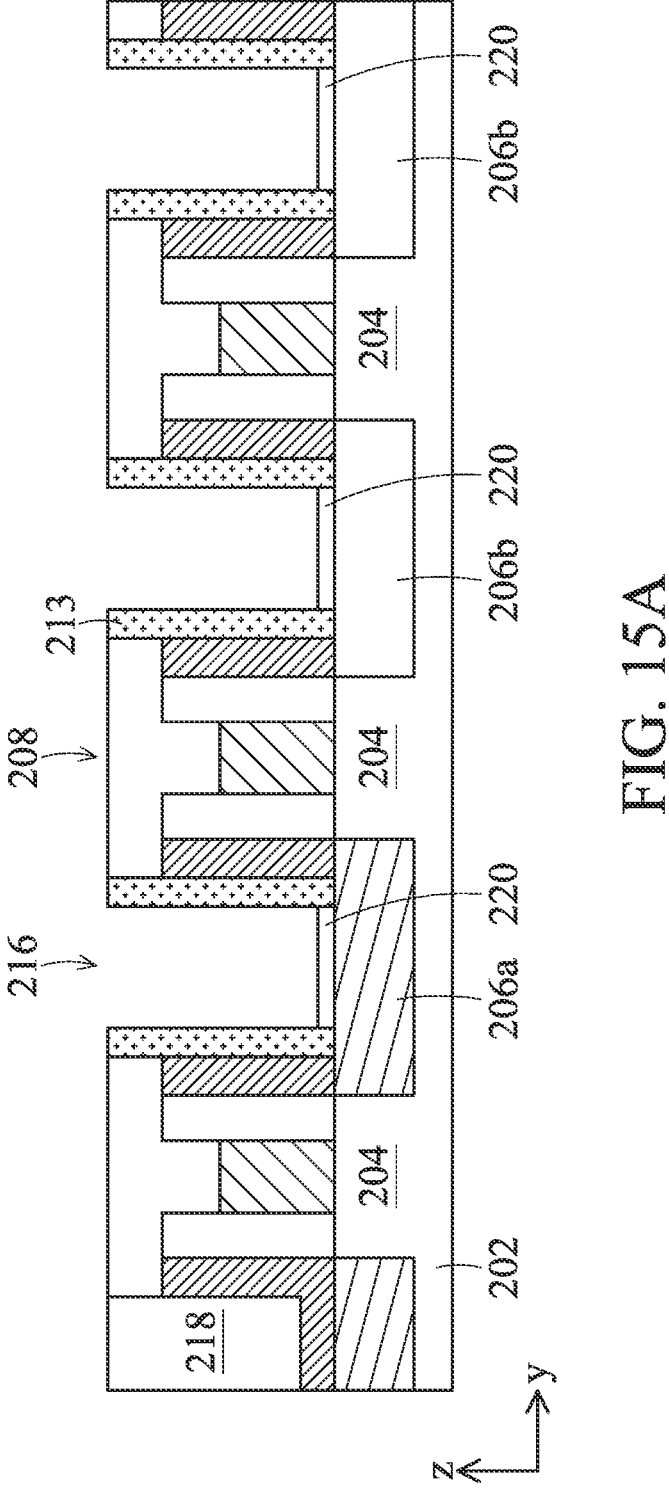
Figure 15B:
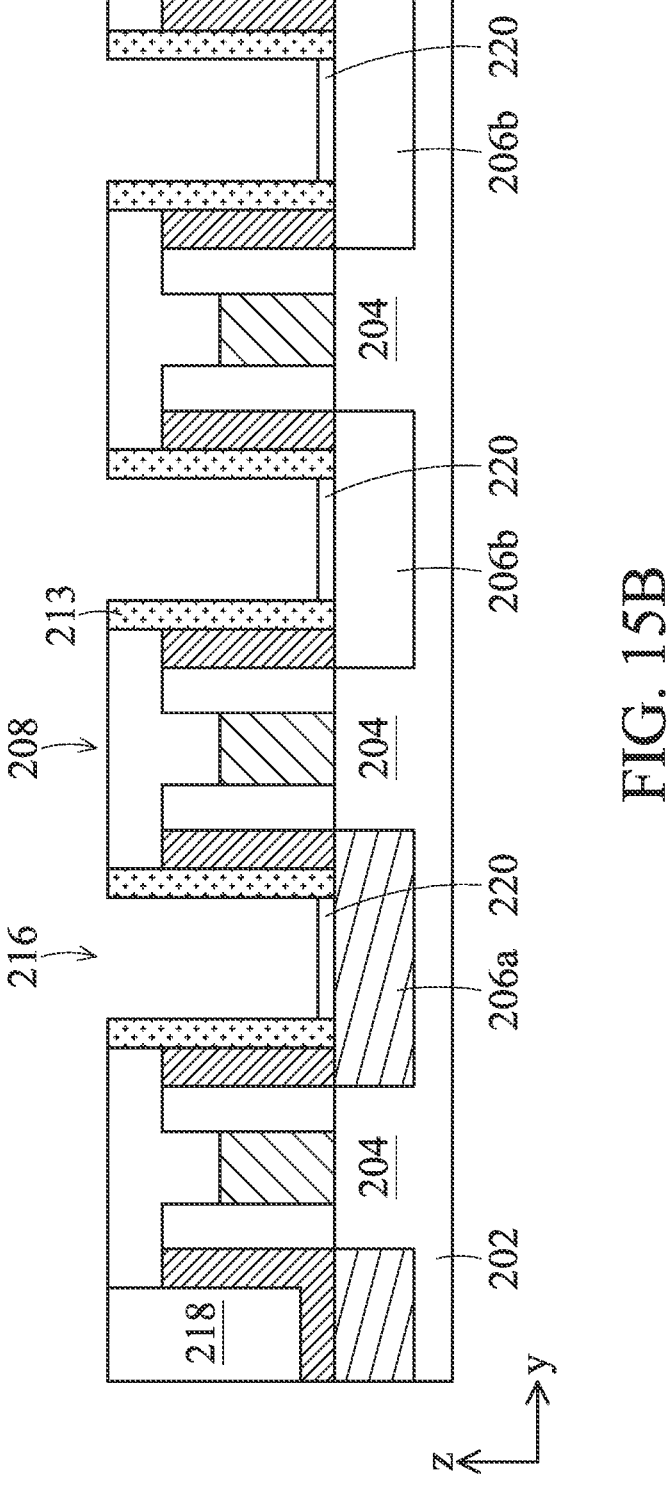

At operation 1304, in reference to FIG. 15A, the method 1300 forms silicide features 220 over the S/D features 206a and 206b. The silicide features 220 may include a layer of titanium silicide (TiSi). In other embodiments, the silicide features 220 may include cobalt silicide (CoSi), ruthenium silicide (RuSi), nickel silicide (NiSi), TiSiGe, CoSiGe, RuSiGe, NiSiGe, other suitable silicides, or combinations thereof. Different materials may be used depending on the application. In an example, titanium silicide is used in an n-type transistor, and cobalt silicide is used in a p-type transistor. The silicide features 220 may be formed by any suitable method. For example, a metal layer (e.g., titanium) may be deposited over the device 200 by a deposition process such as CVD, ALD, PVD, other suitable processes, or combinations thereof. Then, the device 200 is annealed to allow the metal layer and the semiconductor materials of the source/drain features 206 to react and form the silicide features 220. Thereafter, the un-reacted metal layer is removed, leaving the silicide features 220 as a layer over the source/drain features 206.

Figure 16A:
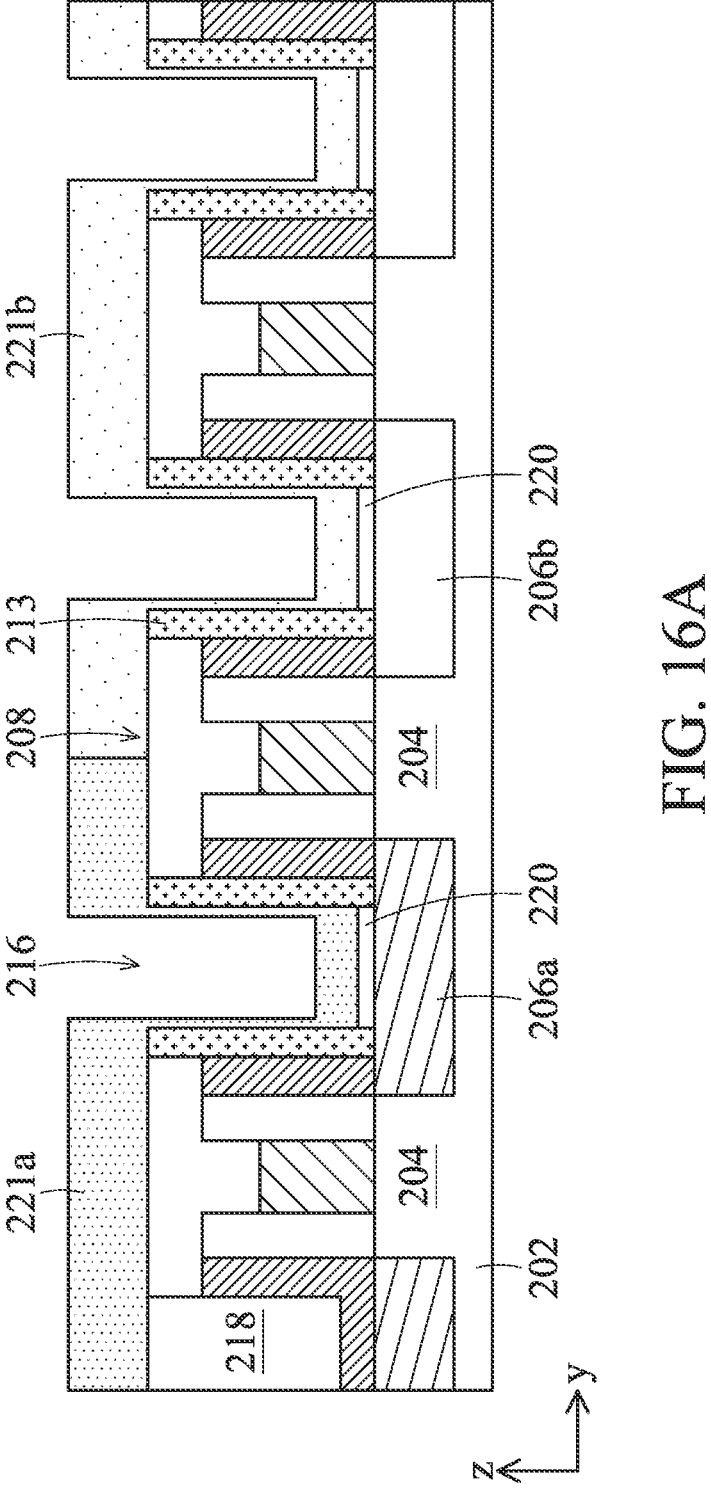

At operation 1305, in reference to FIG. 16A, the method 1300 forms metal cap layers such as metal cap layers 221a and 221b by PVD over each of the silicide features 220 and over side portions of each of the trenches 216. The metal cap layers 221a and 221b may be formed by PVD with plasma to provide directional deposition. Bottom portions of the metal cap layers 221a and 221b directly land on each of the silicide features 220, and side portions of the metal cap layers 221a and 221b directly lands on side portions of each of the trenches 216. The bottom portions of the metal cap layers 221a and 221b extend horizontally in a y direction, having a thickness vertically in a z direction. The side portions of the metal cap layers 221a and 221b extend vertically in a z direction, having a thickness horizontally in a y direction. The thickness of the bottom portions of the metal cap layers 221a and 221b is greater than the thickness of the side portions. A greater thickness in the bottom portions is desirable for subsequent processes. In some embodiments, the thickness of the bottom portions is greater than 2.5 nm and the thickness of the side portions is less than 2.5 nm. In other embodiments, the thickness of the bottom portions is greater than 3 nm and the thickness of the side portions is less than 2 nm. Portions of the metal cap layers 221a and 221b may also land atop the gate structures 208, the etch stop layers 213, and the ILD layer 218.

The metal cap layers 221a and 221b could have similar functions as the seed layer 222 described above in reference to the method 100. As such, the metal cap layers 221a and 221b could also be referred to as seed layers. The metal cap layers 221a and 221b, like the seed layer 222 described above, may have multiple functions. First, the metal cap layers 221a and 221b may act as a PVD metal cap to protect the silicide features 220. The silicide features 220 upon formation may be exposed to atmosphere or other air that contains oxygen. Thus, there is risk of the silicide features 220 getting oxidized, which would increase its resistance. As such, the metal cap layers 221a and 221b should be thick enough to act as a cap to prevent unwanted silicide oxidation. In some embodiments, the metal cap layers 221a and 221b is thicker in the z direction than the silicide feature layers 220. Second, the metal cap layers 221a and 221b act as a proper landing ground for subsequent processes, such as forming additional seed layers.

The metal cap layers 221a and 221b is of different metal material depending on what type S/D features 206a or 206b it is disposed over. For reasons of simplicity, FIG. 16A shows one substrate 202 having both n-type S/D features 206a and p-type S/D features 206b disposed between channel regions 204 in a continuous region along the y direction. In practice, the n-type S/D features 206a and p-type S/D features 206b may be separated in different regions by ILD layers (such as ILD layer 218) and by cut metal features (not shown). For example, the n-type and p-type S/D features are on a different portion of the substrate 202. Therefore, for reasons of simplicity, FIG. 16A also shows different metal cap layers 221a and 221b formed over the same continuous region along the y direction. Note that the metal cap layers 221a and 221b may be formed in separate regions of the substrate 202. The metal cap layers 221a and 221b may be formed in separate steps and use various masking and etching techniques.

In this embodiment, the metal cap layer 221a is formed in trenches directly over n-type S/D features 206a, and the metal cap layer 221b is formed in trenches directly over p-type S/D features 206b. Such selective formation is to improve resistivity depending on the doped type. The metal material chosen for the metal cap layers 221a and 221b will depend on metal work functions more suitable for n-type or for p-type for better metal interface contact and reducing Schottky barrier height. For example, the metal cap layer 221a for p-type transistors may include nickel, cobalt, ruthenium, aluminum, gallium, indium, molybdenum, platinum, palladium, or tungsten. And the metal cap layer 221b for n-type transistors may include zirconium, erbium, scandium, hafnium, antimony, cerium, yttrium, and ytterbium.

Various method may be used to form respective metal cap layers 221a and 221b on n-type S/D features 206a and p-type S/D features 206b, respectively. In some embodiments, a patterned photoresist layer is formed with openings to expose trenches 216 for p-type S/D features 206b, then the metal cap layer 221b is deposited on p-type S/D features 206b, and then the patterned photoresist layer is removed by stripping or ashing. Another patterned photoresist layer is formed with openings to expose trenches 216 for n-type S/D features 206a, then the metal cap layer 221a is deposited on n-type S/D features 206a, and then the patterned photoresist layer is removed thereafter. In other embodiments, the method may be implemented in a different sequence, such as the metal cap layer 221a being deposited before the metal cap layers 221b.

Figure 17A:
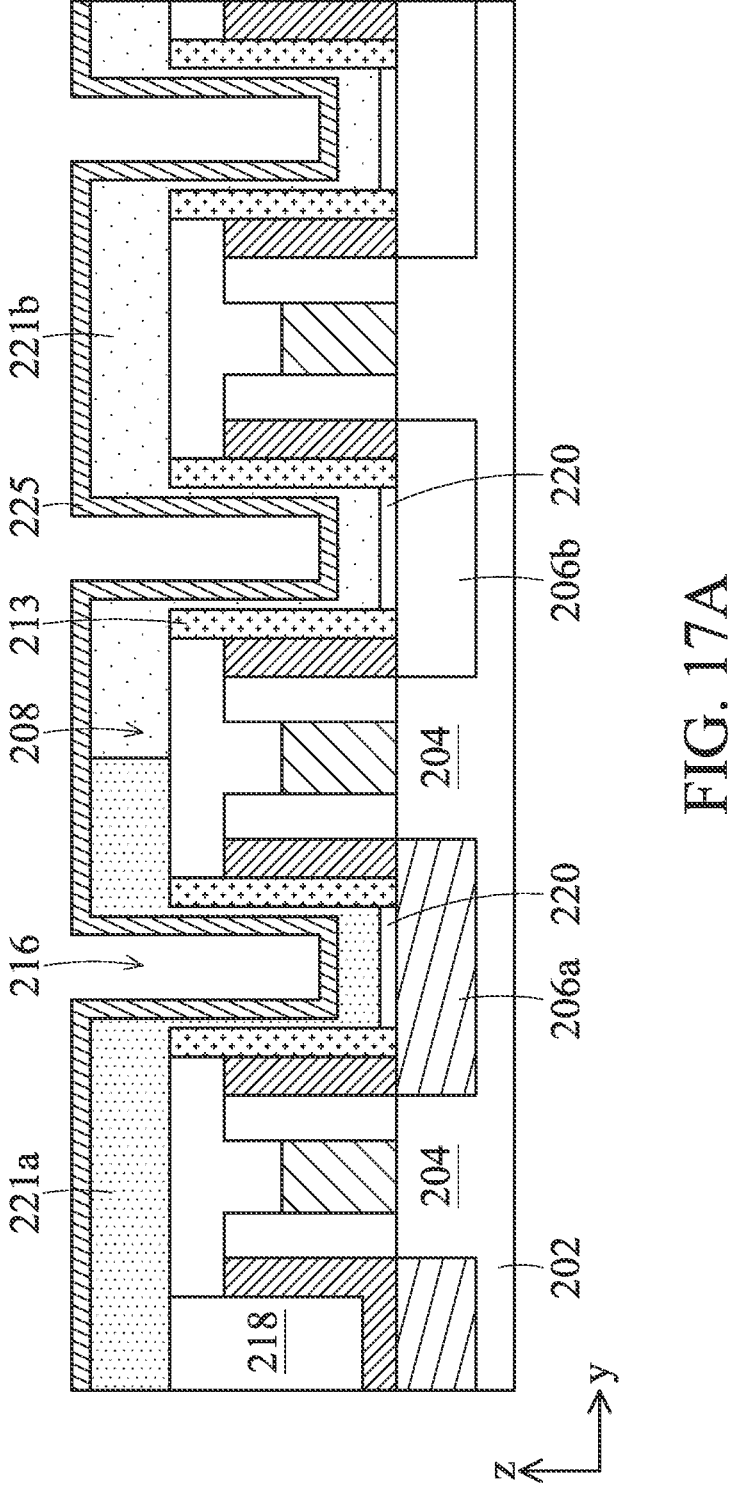

At operation 1306, in reference to FIG. 17A, the method 1300 forms a seed layer 225 by PVD over bottom and side surfaces of each of the metal cap layers 221a and 221b inside the trenches 216. Bottom portions of the seed layer 225 directly lands on each of the bottom surfaces of the metal cap layers, and side portions of the seed layer 225 directly land each of side surfaces of the metal cap layers. The bottom portions of the seed layer 225 extend horizontally in a y direction, having a thickness vertically in a z direction. The side portions of the seed layer 225 extend vertically in a z direction, having a thickness horizontally in a y direction. Along the z direction, the thickness of the bottom portions of the seed layer 225 may be smaller than the thickness of the bottom portions of the metal cap layers 221a and 221b. This is because there is already enough metal thickness in the z direction over the silicide features 220 for subsequent metal growth. However, to facilitate better bottom-up metal growth, the metal thickness along sidewalls of the trenches 116 (e.g., sum of the side portions of the metal cap layer and the seed layer) should be thinner than the metal thickness in the bottom portions of the trenches 116 (e.g., sum of the bottom portions of the metal cap layer and the seed layer). Further, a difference between thicknesses of the bottom and side portions of the seed layer is less than a difference between the thicknesses of the bottom and side portions of the metal cap layer. Further, a thickness ratio of the bottom to side portions of the metal cap layer is greater than a thickness ratio of the bottom to side portions of the seed layer. In some embodiments, the bottom portion and the side portions of the seed layer 225 have about the same thickness.

In a preferred embodiment, the seed layer 225 is made of tungsten (W), which has superior properties for subsequent seamless metal fill. In other embodiments, the seed layer 225 is chosen to be a specific metal for better bottom-up metal growth than metals used for the metal cap layers 221a and 221b. In the preferred embodiment, the tungsten of the seed layer 225 allows for increased process window and better deposition/etch properties for subsequent metal growth.

Both the metal cap layers 221 and the seed layer 225 are formed using PVD instead of CVD or other deposition processes because pure metal precursors are desirable. In some preferred embodiments, instead of metal alloys or metal compounds, the metal cap layers 221 and the seed layer 225 formed by PVD should substantially comprise pure metals (e.g., more than 99% the pure metal). Therefore, to achieve low resistance seamless fill, the metal chosen for the subsequent bottom-up metal growth should be one that is compatible to the pure metal for single grain or less grain boundary interface.

Figure 18A:
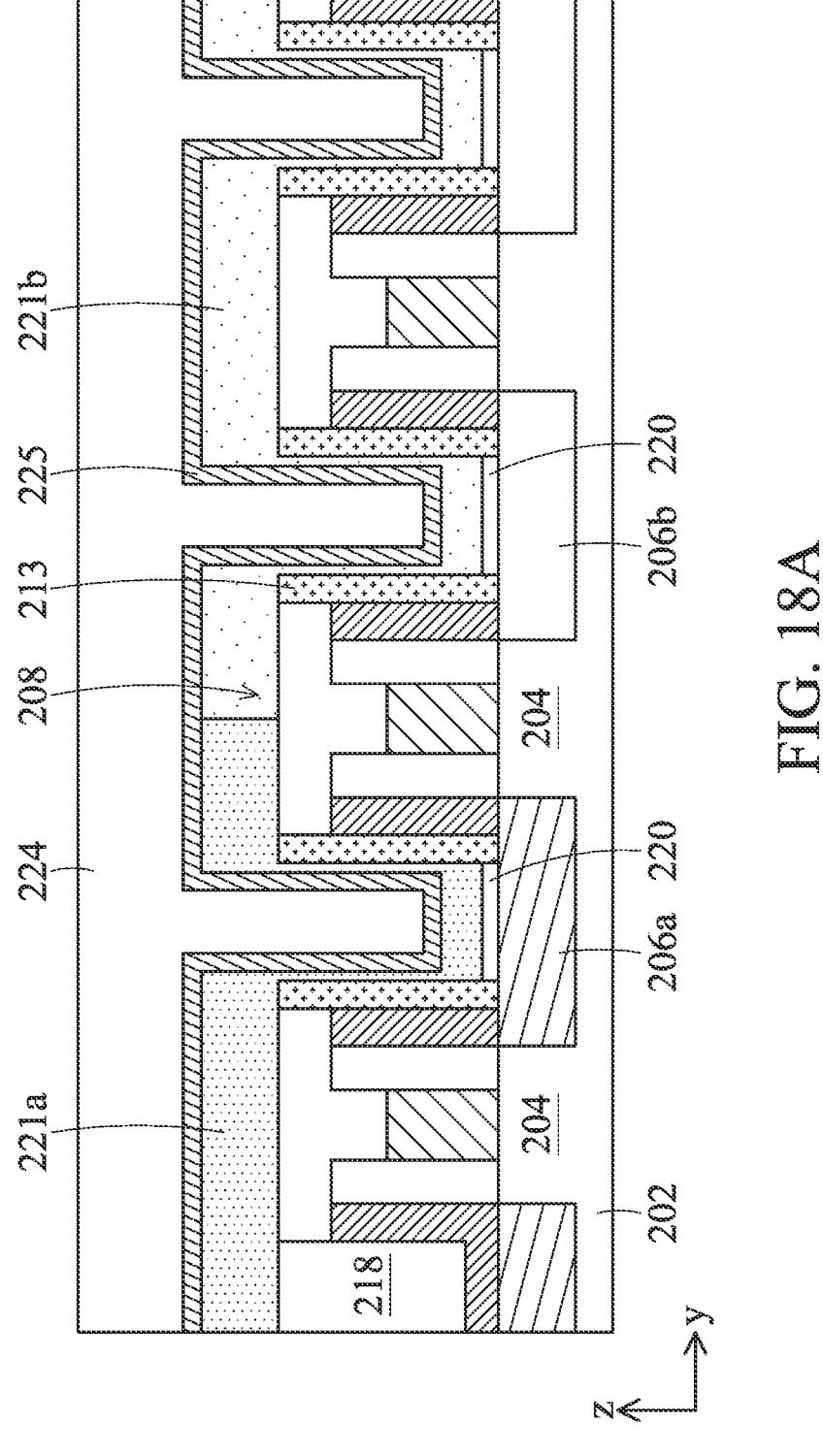

At operation 1308, in reference to FIG. 18A, the method 1300 deposits a metal 224 on the seed layer 225 by a suitable method, such as CVD or ALD. This deposition is anisotropic to achieve bottom-up deposition and is also referred to as bottom-up metal growth. The disclosed bottom-up deposition is achieved by applying a precursor that includes a chemical having species to be deposited and an etching chemical to simultaneously deposit and etch. As the deposition and etch effect are not uniform to bottom surface and sidewalls, the net effect achieves anisotropic deposition or bottom-up deposition. In the disclosed embodiments, the etching chemical includes halogen, such as chlorine or fluorine. The trenches 216 are filled with the metal 224, with additional metal overfilling the trenches 216. In this embodiment, the metal 224 grown from the seed layer 222 are of different metal materials. In some embodiments, the metal 224 is molybdenum (Mo) or Ruthenium (Ru). As described previously, tungsten (W) and molybdenum (Mo) is found to have good interface contact properties to lower resistance. Ruthenium (Ru) may also exhibit similar properties. In some embodiments, the metal 224 is molybdenum (Mo) and the seed layer 225 is tungsten (W).

The bottom-up metal growth is performed with a metal halide precursor having a metal component and a halogen component (e.g., an etching chemical). As part of the CVD or ALD process, the metal growth is performed by incorporating metal halide precursors such that the metal component includes tungsten (W), molybdenum (Mo), ruthenium (Ru), cobalt (Co), iridium (Ir), or rhodium (Rh), and the halogen component includes fluorine (F), chlorine (Cl), bromine (Br), or iodine (I). The metal component refers to the metal 224 to be deposited over the seed layer 225. And the materials for the halogen component may have etching effect to facilitate proper vertical metal growth (e.g., $MoCl_5$ and $WCL_5$ have etch metal capability). In some embodiments, the metal halide precursor further includes oxygen. In these embodiments, the metal halide precursor may also have metal oxide etching effect (e.g., $MoOCl_5$ and $WOCl_5$), which may be necessary due to unwanted oxide formed through oxidation by the silicide features 220. The deposition process temperature should be less than 500 degrees Celsius. No direct plasma is used in the deposition process.

The process to form metal feature 224 is different from the process to form the metal cap layers 221a and 221b and the seed layer 225. The metal feature 224 is formed by bottom-up deposition while the metal cap layers 221a and 221b and the seed layer 225 is formed by PVD. The PVD process may be performed with plasma, where the plasma can be biased to provide directional direction. The bias power is tunable and can be dynamically controlled to achieve the desired profile.

The metal growth of the metal 224 is substantially in the vertical direction, such that the growth rate is faster in the vertical direction than in the horizontal direction. This is desirable to prevent seams or voids from forming such as by unwanted metal enclosures caused by metal growth sideways. This may be achieved due to the etching effect of the metal halide precursors, which allows for more etching in top portions of the trenches 216, etching along sidewall portions of the seed layer 225 while allowing for more deposition in the bottom portions of the seed layer 225. In some embodiments, the etching effect of the metal halide precursors may also etch sidewall portions of the seed layer. This is in addition to etching the metal being deposited along the sidewall portions of the seed layer. Due to the presence of the halide in the precursor of the bottom-up deposition, the metal feature 224 may also include a halide, such as F, Cl, Br or I. The halide may distribute unevenly in the metal feature 224 such as higher halogen concentration at the interface between seed layer 222 and metal feature 224, depending on the precursor that is dynamically tunable during the bottom-up deposition. On the other hand, since the metal cap layers 221*a* and 221*b* are formed by PVD, no halide (or very little) is present in the metal cap layers 221*a* and 221*b* after the metal growth of the metal 224.

Figure 19A:
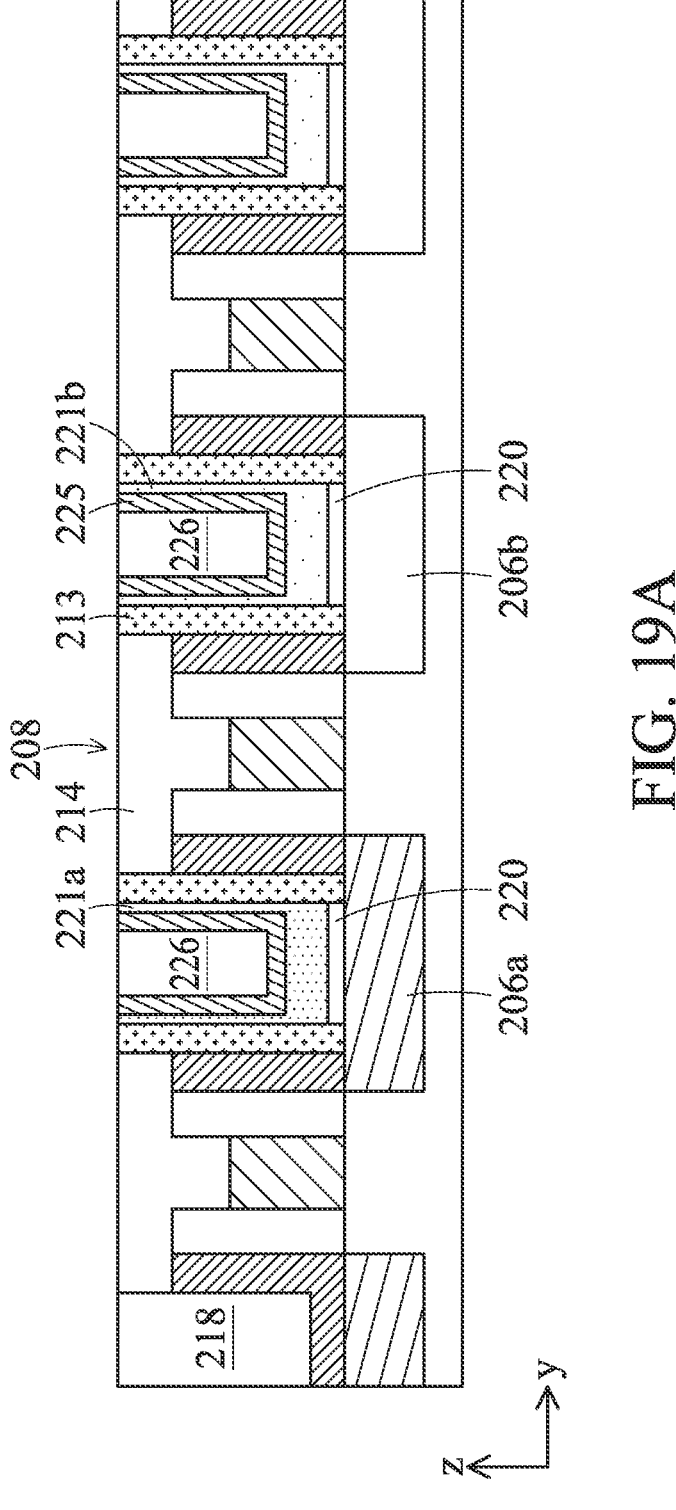

At operation 1310, in reference to FIG. 19A, the method 1300 planarizes the metal 224 to form S/D contacts 226. In some embodiments, portions of the seed layer 225 and portions of the metal cap layers 221*a* and 221*b* are also planarized along with the metal 224. After the planarization, a top surface of each of the S/D contacts 226 may be coplanar with top surfaces of the gate structure 208. In some embodiments, the top surfaces of each of the S/D contacts 226 becomes coplanar with top surfaces of the dielectric caps 214, the etch stop layers 213, and the ILD layer 218. As shown, the S/D contacts 226 include portions of the metal 224 sandwiched between side portions of the seed layer 225. And the seed layer 225 is sandwiched between the metal 224 and the metal cap layers 221*a* or 221*b*. In this embodiment, each of the S/D contacts 226 is a tri-layer metal contact, having three metal materials. In a preferred embodiment, the metal materials include at least tungsten (W), with the tungsten being a metal layer separating the other two metal materials, where one of the two remaining metal materials is chosen depending on the doped type of the S/D features 206.

At operation 1312 and 1314, and in reference to FIGS. 20A-24A, the method 1300 forms S/D vias 234*a* over the S/D contacts 226 and gate vias 234*b* over the metal gates 210. In reference to FIG. 20A, an etch stop layer 227 may be formed over the planarized device 200. The etch stop layer 227 may be similar to the etch stop layer 213 in composition. The etch stop layer 227 forms directly over the S/D contacts 226 and gate structures 208. In reference to FIG. 21A, an ILD layer 228 may be formed over the etch stop layer 227. The ILD layer 228 may be similar to the ILD layer 218 in composition. In reference to FIG. 22A, trenches including S/D via trenches 230*a* and gate via trenches 230*b* may be formed. The S/D via trenches 230*a* may be formed through the ILD layer 228 and the etch stop layer 227 to expose a top surface of the S/D contacts 226. The gate vias trenches 230*b* may be formed through the ILD layer 228, the etch stop layer 227, and the dielectric caps 214 to expose a top surface of the metal gate 210. The trenches 230*a* and 230*b* may be formed through photolithography and etching processes. For example, the photolithography process may form a masking element covering areas of the device 200 that are not to be etched and exposing areas that are to be etched. The trenches 230*a* and 230*b* may be formed in a same or different process steps. In some embodiments, the gate via trenches 230*b* are deeper in the z direction than the S/D via trenches 230*a*. The trenches 230*a* and 230*b* may be lined with a barrier layer 232 along sidewalls of the trenches. The barrier layer is a dielectric barrier layer formed by a suitable procedure that includes deposition and anisotropic etch (e.g., plasma etch) to remove the deposited barrier layer on bottom surface of the trenches. The barrier layer may comprise silicon nitride, silicon oxynitride, other suitable dielectric material or a combination thereof.

Figure 23A:
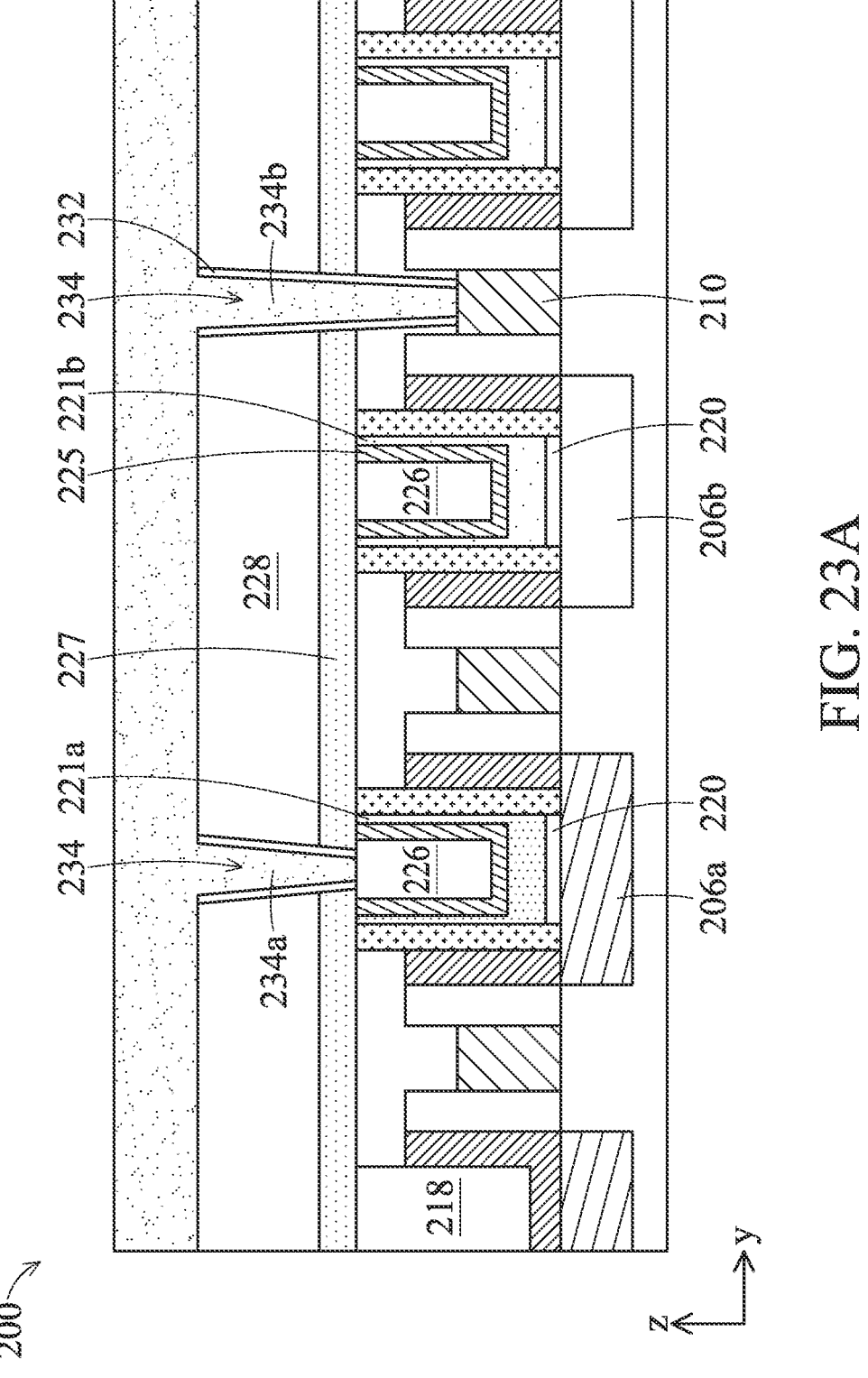
Figure 23B:
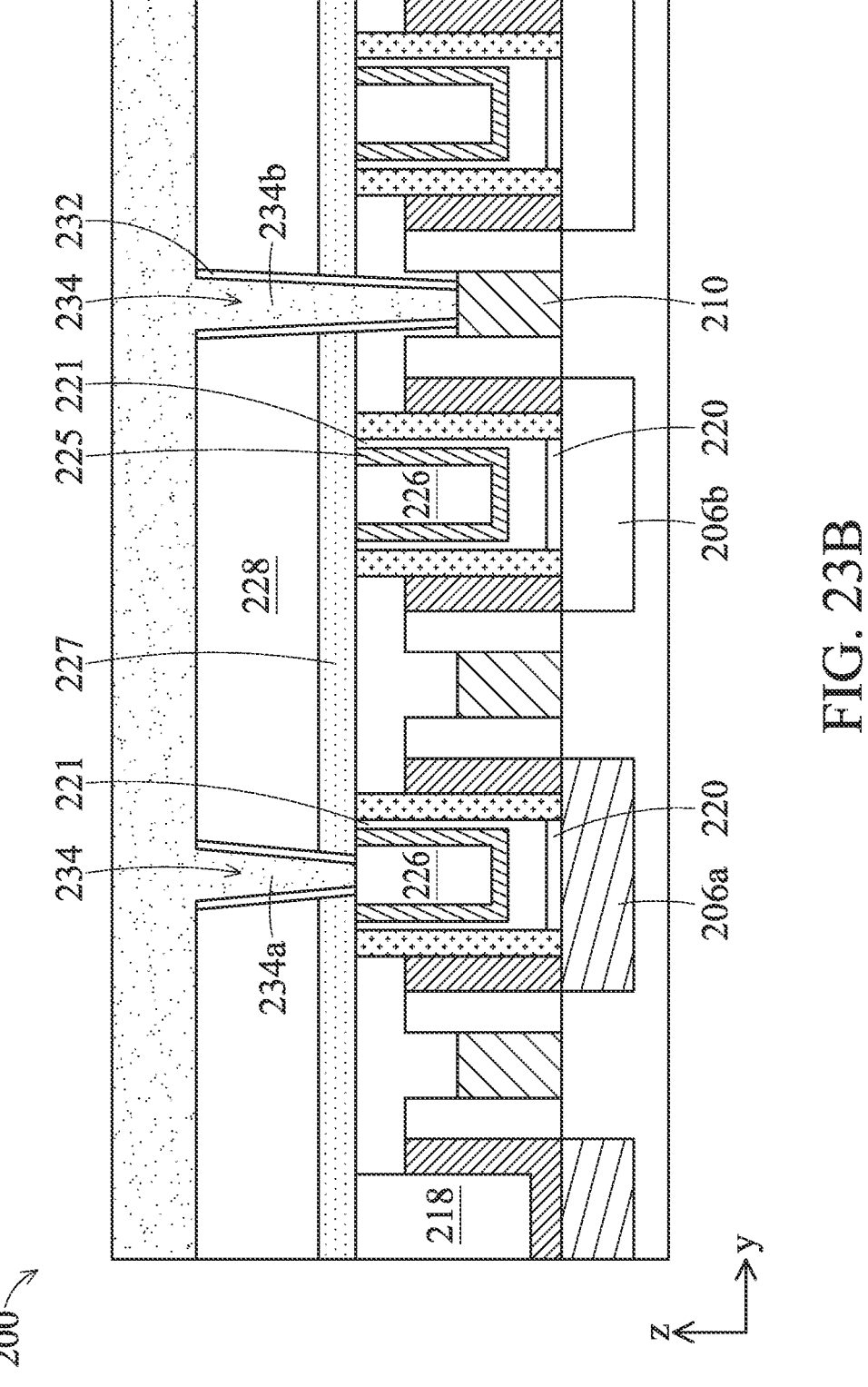
Figure 24A:
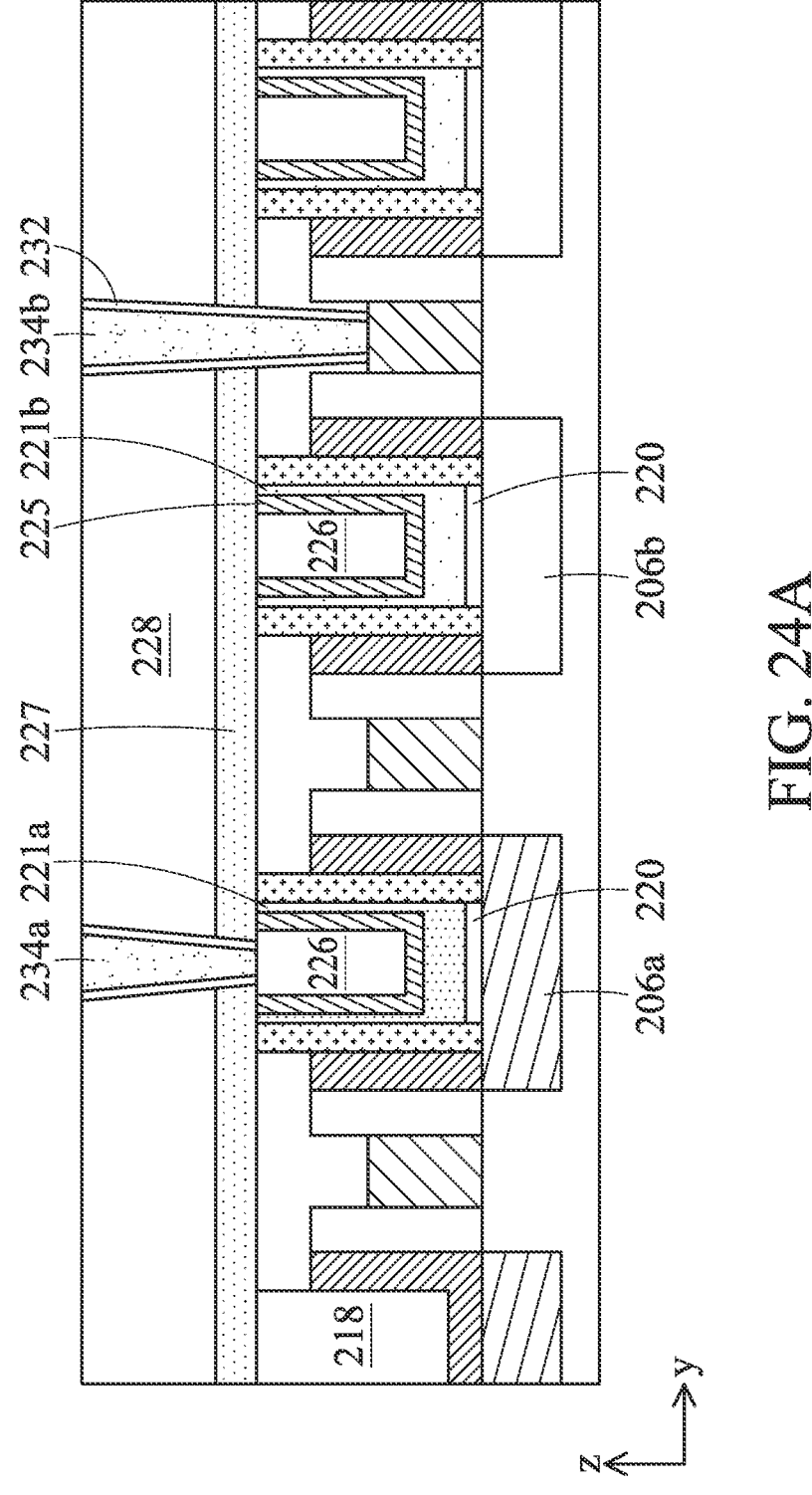
Figure 24B:
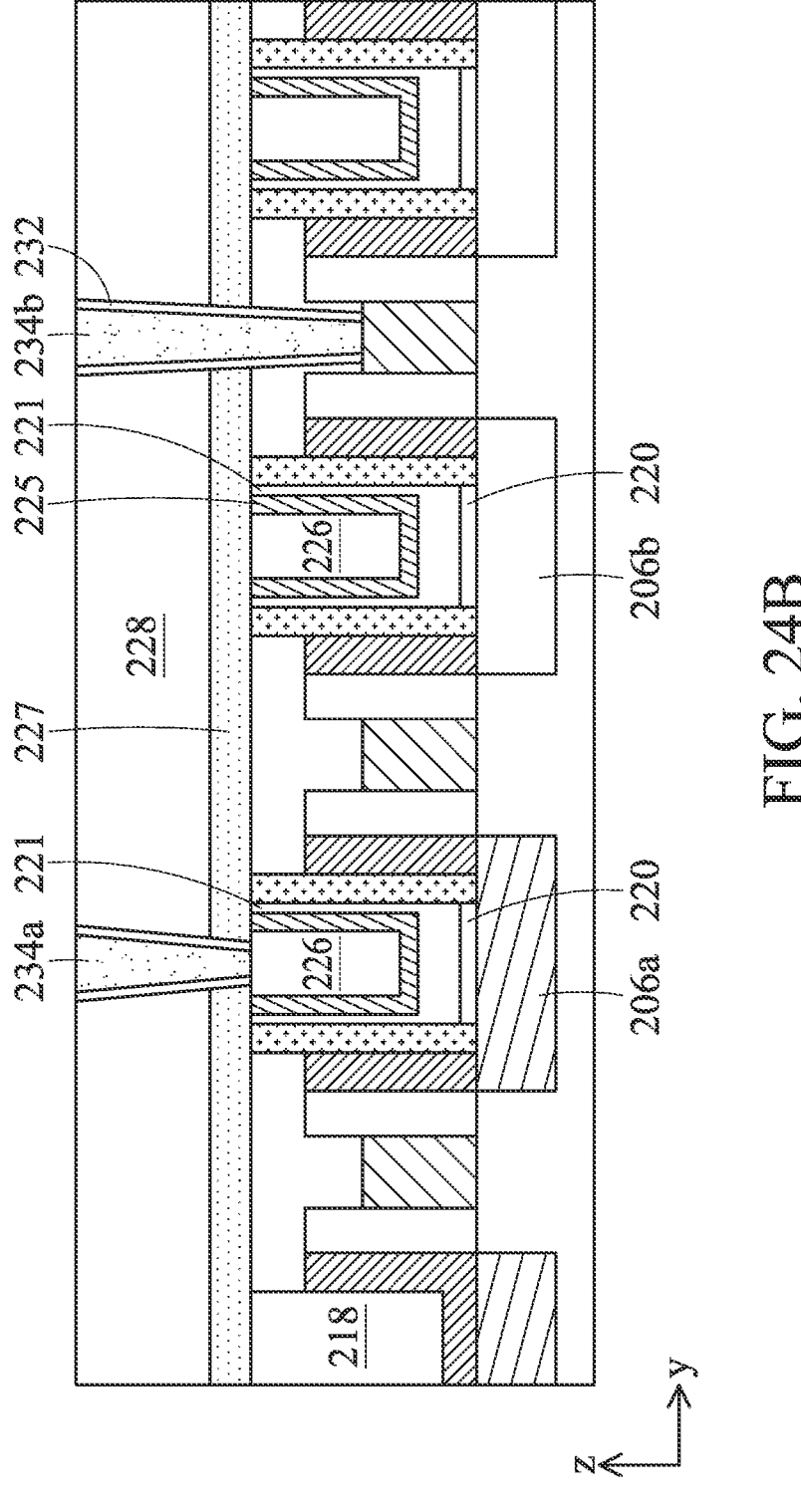

Referring to operation 1312 and 1314, in reference to FIG. 23A, the trenches 230*a* and 230*b* are filled to form vias 234. The vias 234 may be S/D vias 234*a* interfacing with S/D contacts 226 or gate vias 234*b* interfacing with metal gates 210. Now in reference to FIG. 24A, the vias 234 are planarized such that top surfaces of the vias 234 are coplanar with the top surface of the ILD layer 228. The S/D contacts 226 provide seamless metal landing for the S/D vias 234*a*. Thus, the S/D vias 234*a* may also be formed to be without seams or voids. In some embodiments, the S/D vias 234*a* are selectively grown from the S/D contacts 226. The S/D vias 234*a* have the same metal material as portions of the S/D contacts 226 it directly lands on. In some embodiments, the S/D vias 234*a* comprise molybdenum (Mo).

Figure 25A:
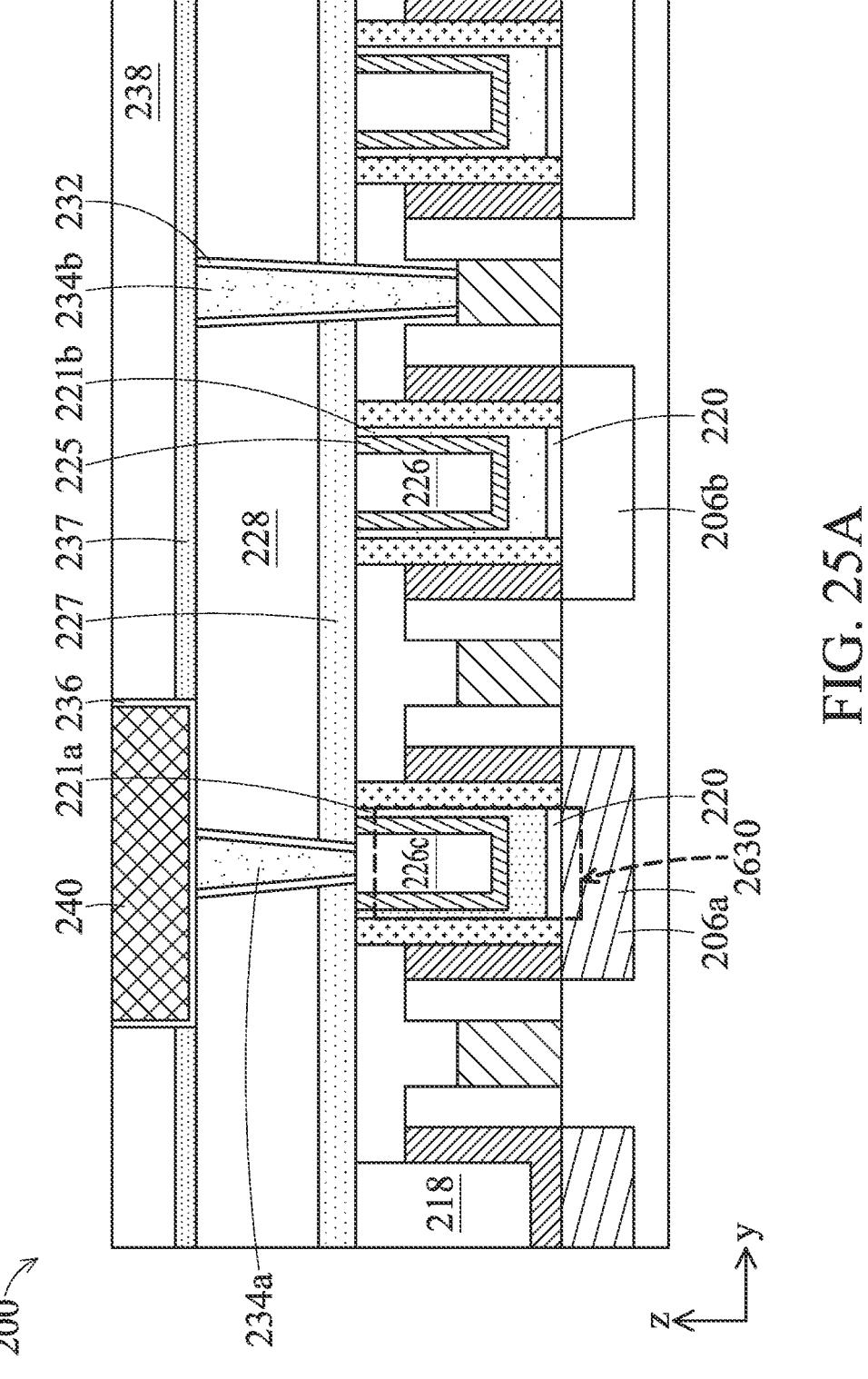

At operation 1316, in reference to FIG. 25A, metal lines, such as metal line 240, are formed over the vias 234 and over the ILD layer 228. The metal line 240 may contact S/D vias 234*a*. The metal line 240 may include a conductive barrier layer 236 that acts as a glue layer enclosing a metal fill material of the metal line 240. The conductive barrier layer 236 is of a different composition than the barrier layer 232. The conductive barrier layer 236 may comprise titanium (Ti), titanium nitride (TiN), tantalum (Ta), or tantalum nitride (TaN). The metal fill material of the metal line 240 may be formed by isotropic growth. Since there is a larger volume or spacing to form the metal line 240, a bottom-up metal growth scheme is not necessary to avoid seams or voids. As shown, the metal line 240 may be embedded in another etch stop layer 237 and another ILD layer 238. These layers are formed in a similar way with respect to the etch stop layer 227 and ILD layer 228 described above. Additional operations may be performed to complete fabrication of the device 200. For example, additional vertical interconnect features such as additional contacts and/or vias, and/or horizontal interconnect features such as more metal lines, and multilayer interconnect features such as metal layers and interlayer dielectrics can be formed over the device 200. In the disclosed embodiment, the conductive barrier layer 236 is thinner than the etch stop layer 237, and the bottom surface of the conductive barrier layer 236 and the bottom surface of the etch stop layer 237 are coplanar. In furtherance of the embodiment, the gate vias 234*b* and the S/D vias 234*a* extend vertically to the interface of the ILD layer 228 and the etch stop layer 237.

Still referring to FIG. 25A, a dashed box 2630 illustrates a tri-layer metal contact 226*c* and certain other surrounding features. The dashed box 2630 encloses in part or in full, an S/D feature 206*a*, a silicide feature 220, a metal cap layer 221*a* (part of metal contact 226*c*), a seed layer 225 (part of metal contact 226*c*), and a metal 224 (part of metal contact 226*c*). A zoomed-in depiction of the dashed box 2630 is illustrated in FIG. 26, which portrays an embodiment of the above-mentioned elements in a real device. As shown in the zoomed-in portrayal 2630, the S/D feature 206 may have an etch-back so that a top surface of the S/D feature 206 curves inwards and the silicide feature 220 is formed over the curved top surface. The metal cap layer 221*a*, the seed layer 222, and the metal 224 have side portions and bottom portions, where the respective side and bottom portions have rounded corners at the interfaces therebetween. In the disclosed embodiment of the metal cap layer 221*a* and the seed layer 225, the respective bottom portions may be thicker than the respective side portions, but the thickness difference is greater in the metal cap layer 221*a*. In this embodiment, an interface between the seed layer 225 and the metal 224 may be defined by a higher concentration of remaining halide components described above.

FIGS. 14B-25B illustrate cross-sectional views of a semiconductor device 200 at intermediate stages of fabrication and processed in accordance with the method 1300 of FIG. 13 according to another embodiment of the present disclosure. FIGS. 14B-25B are similar to FIGS. 14A-25A, respectively. Likewise, the description that accompany FIGS. 14A-25A may be similarly applied to FIGS. 14B-25B. For the sake of brevity, the similar features and configurations will not be repeated here.

Figure 16B:
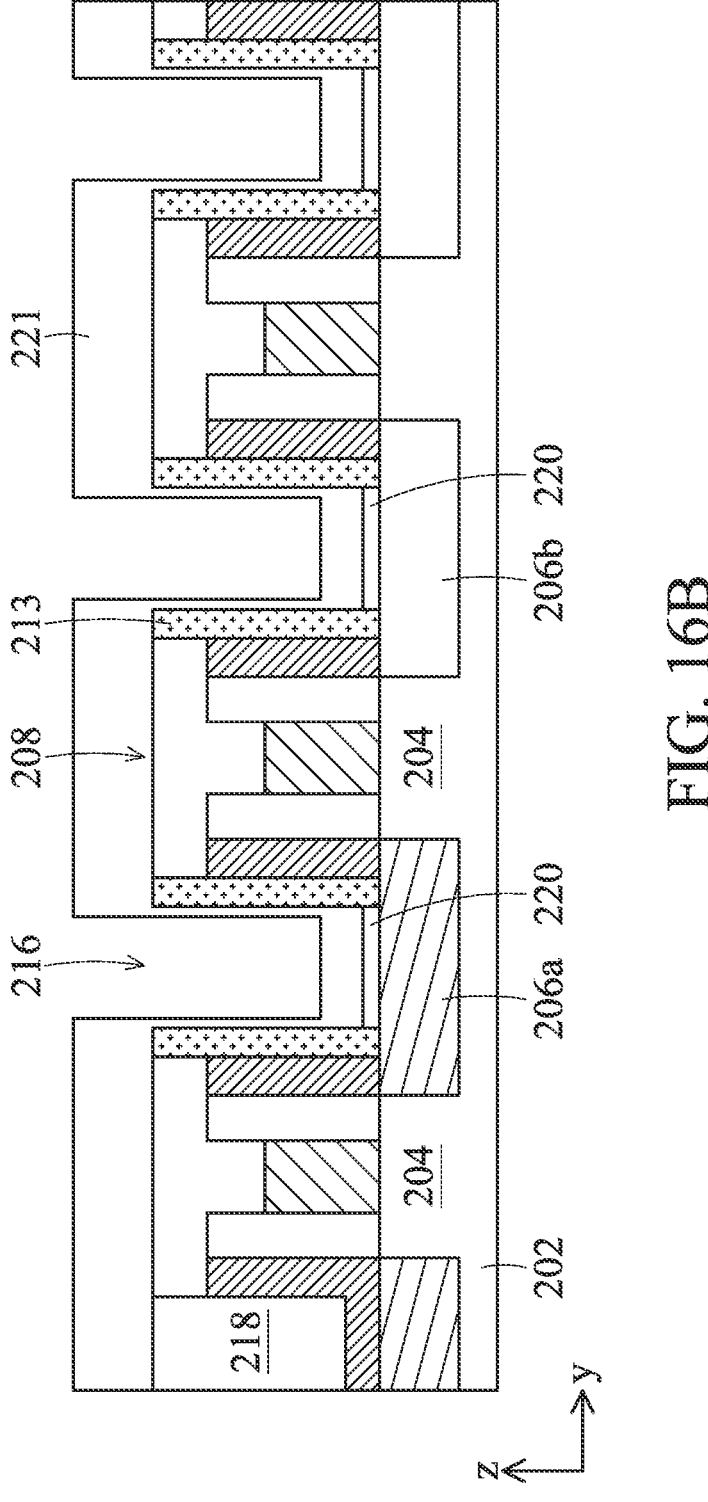

At operation 1305, in reference to FIG. 16B, metal cap layers (or a metal cap layer) 221 is deposited by PVD into the trenches 216, much like the process described in FIG. 16A. However, in this embodiment, regardless of if the S/D features 206a and 206b are n-type or p-type, the same metal cap layer 221 of a same metal material is deposited. This avoids extra processing steps in cases where different metal cap layers are used for different S/D feature types. Since less tuning is made based on doped-type, the metal cap layer 221 should be chosen to exhibit adequate interface contact for both cases of n-type and p-type S/D features. In a preferred embodiment, the metal cap layer 221 is made of molybdenum (Mo), which is a suitable metal as a PVD cap for both n-type and p-type transistors.

Figure 17B:
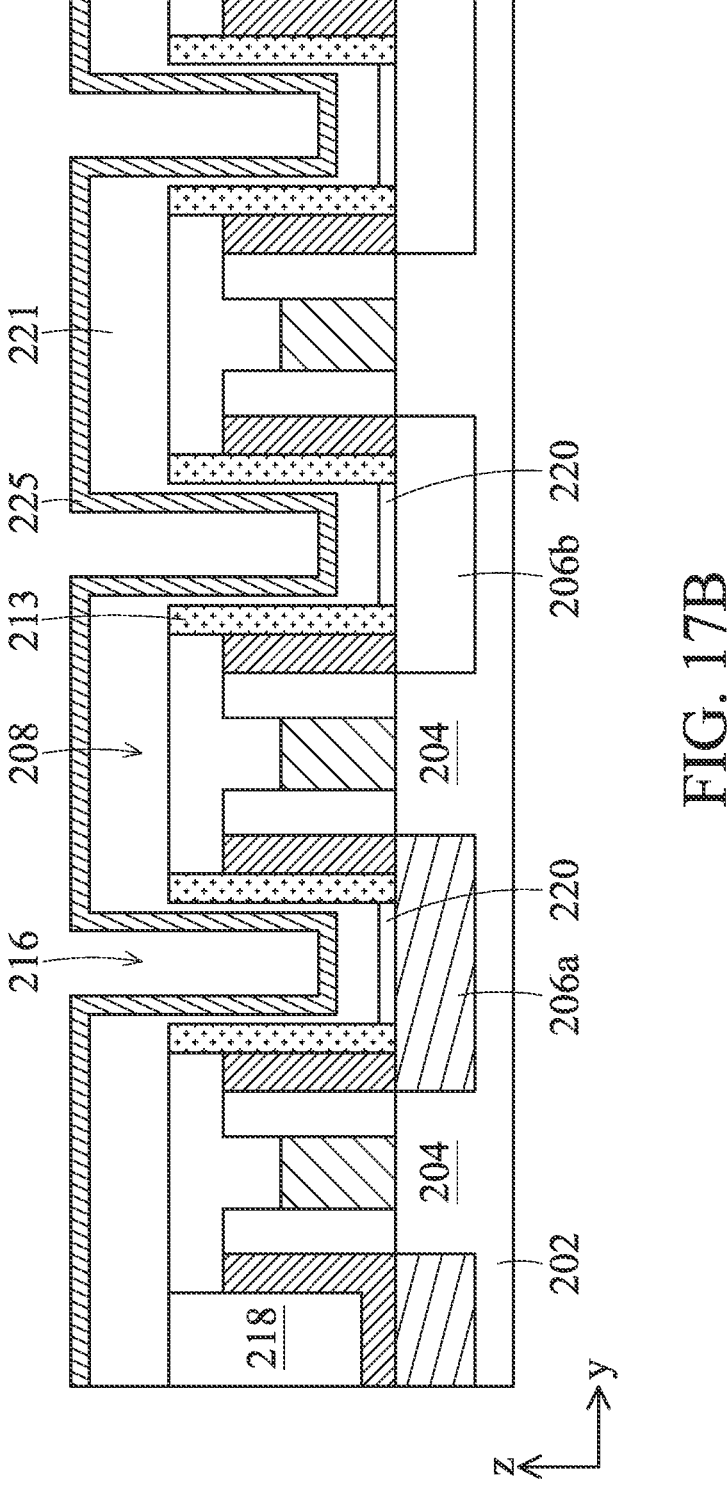

At operation 1306, in reference to FIG. 17B, much like in FIG. 17A, the method forms a seed layer 225 by PVD over bottom and side surfaces of the metal cap layer 221 that is disposed inside each of the trenches 216. The seed layer 225 is formed in substantially the same way as the seed layer 225 described above with respect to FIG. 17A. Likewise, in a preferred embodiment, the seed layer 225 is made of tungsten (W). Both the metal cap layer 221 and the seed layer 225 are formed using PVD.

Figure 18B:
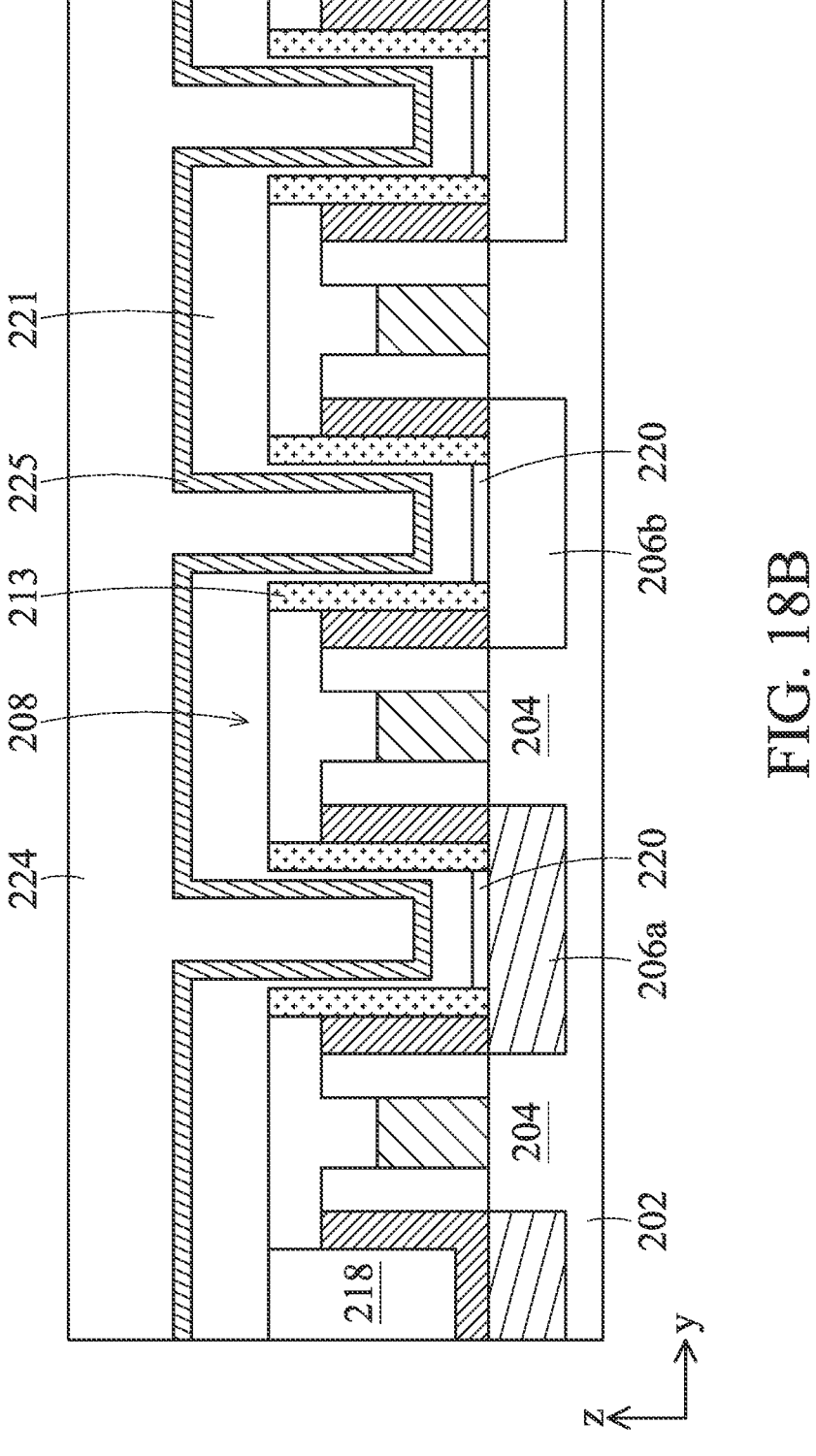

At operation 1308, in reference to FIG. 18B, much like in FIG. 18A, the method 100 selectively grows a metal 224 from the seed layer 225 by CVD or ALD. Due to the relationship of W and Mo described above, like in FIG. 18A, in a preferred embodiment, the metal 224 is made of molybdenum (Mo). As such, in this embodiment, the metal cap layer 221 and the metal 224 are both made of molybdenum (Mo), separated by a seed layer 225 made of tungsten (W).

Figure 19B:
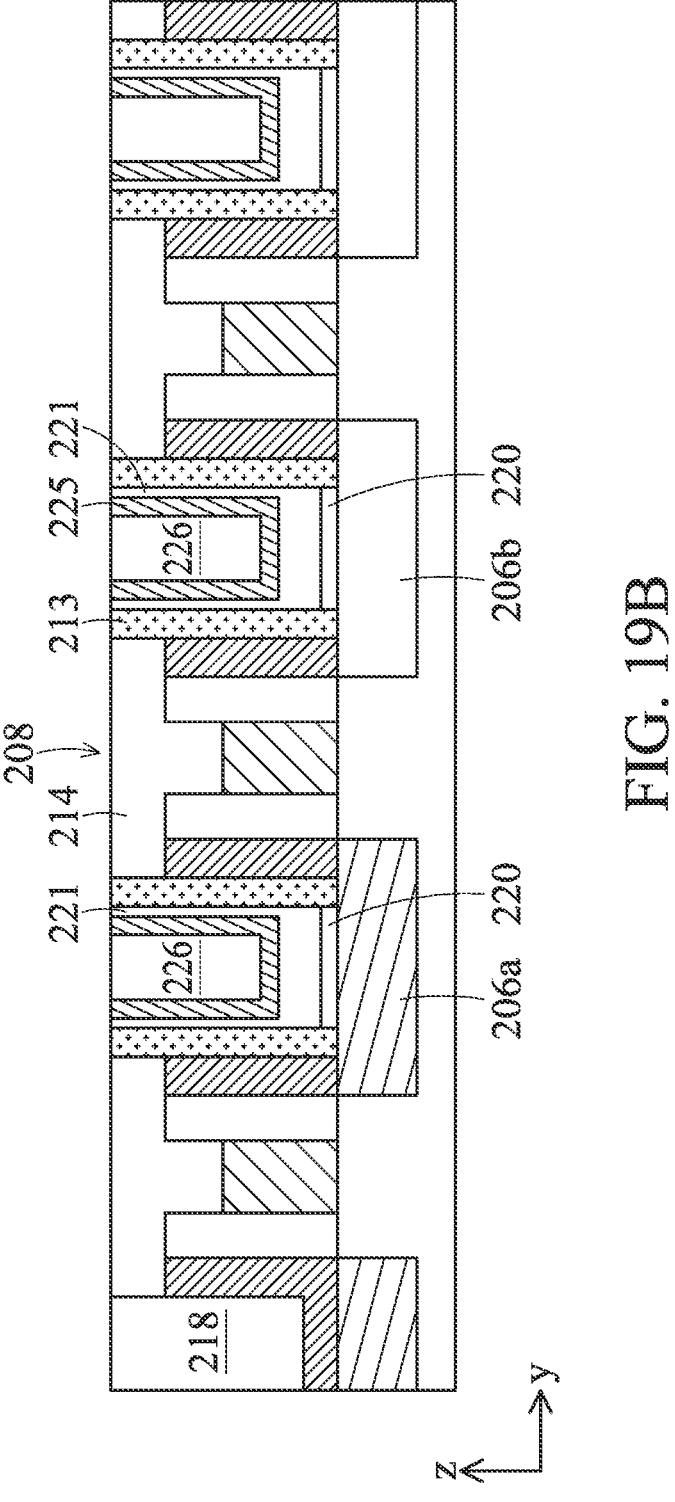
Figure 20A:
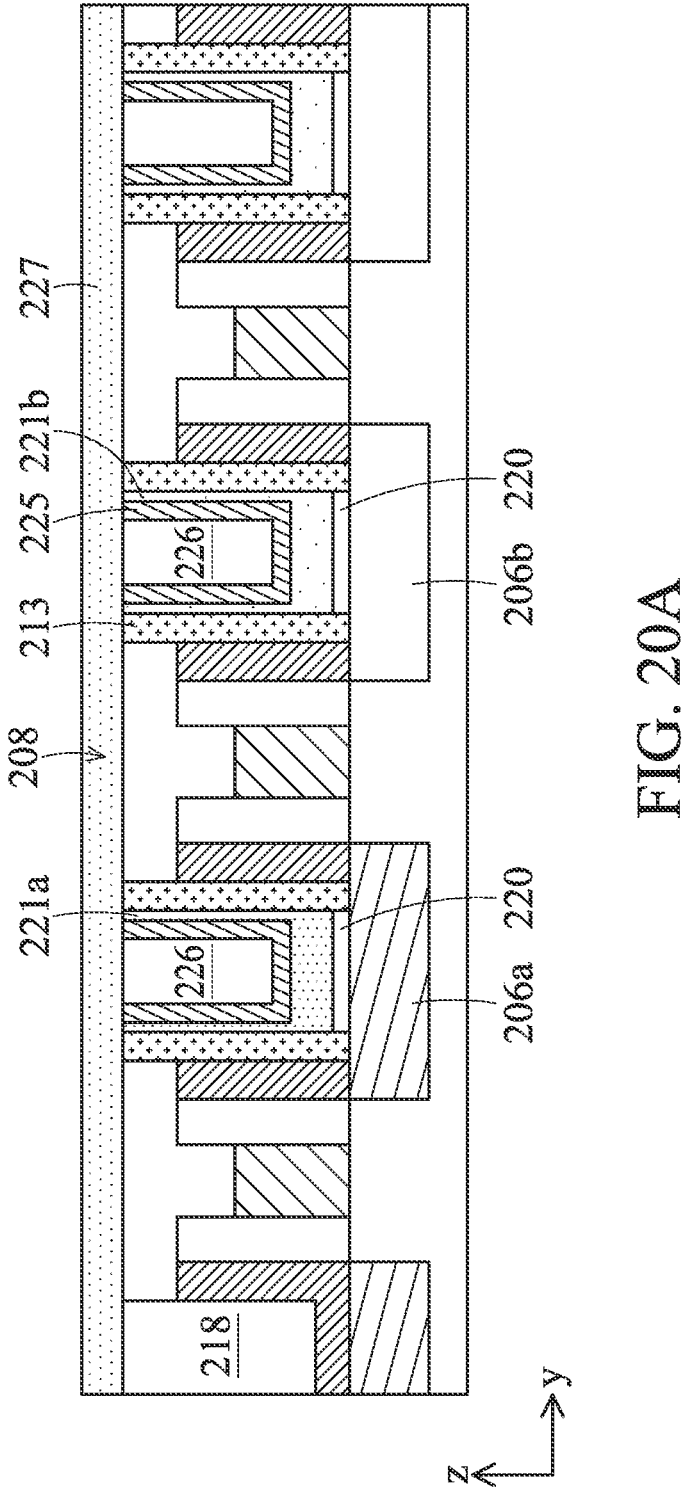
Figure 20B:
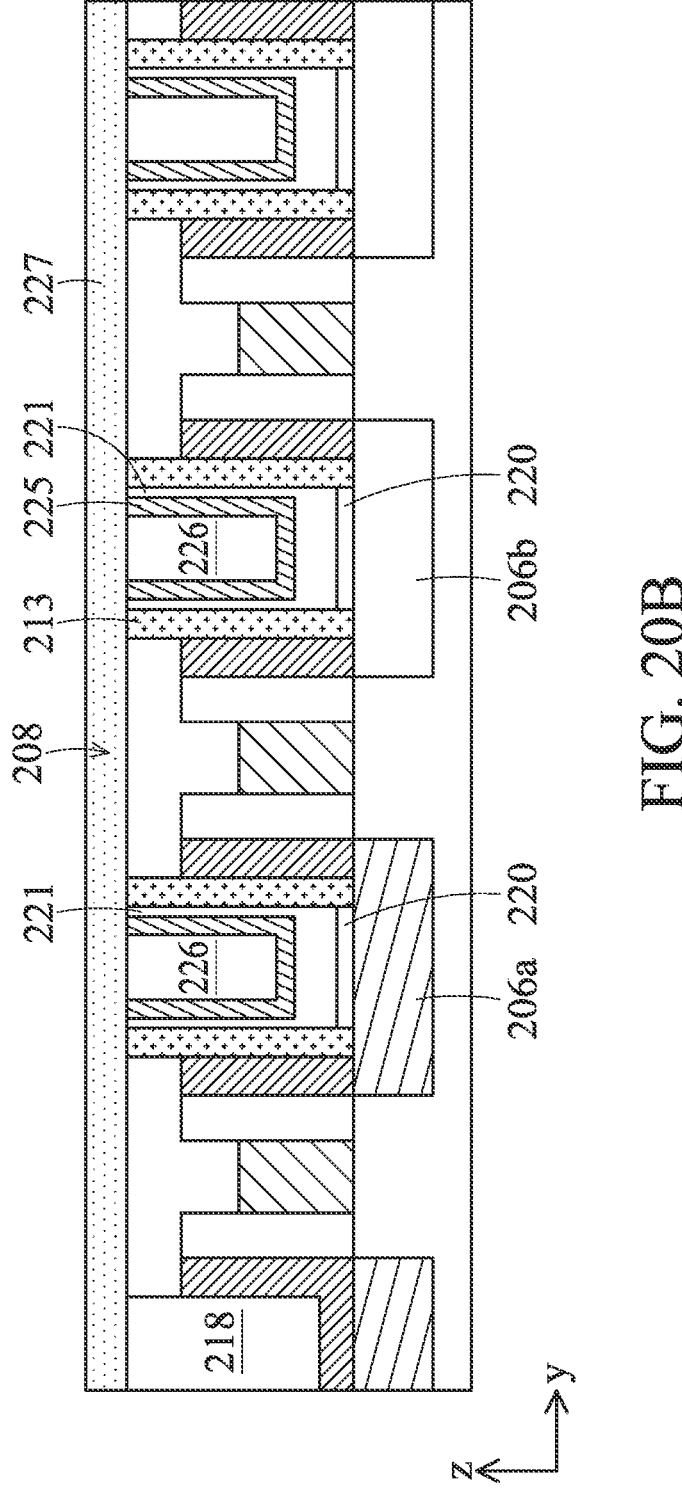
Figure 21A:
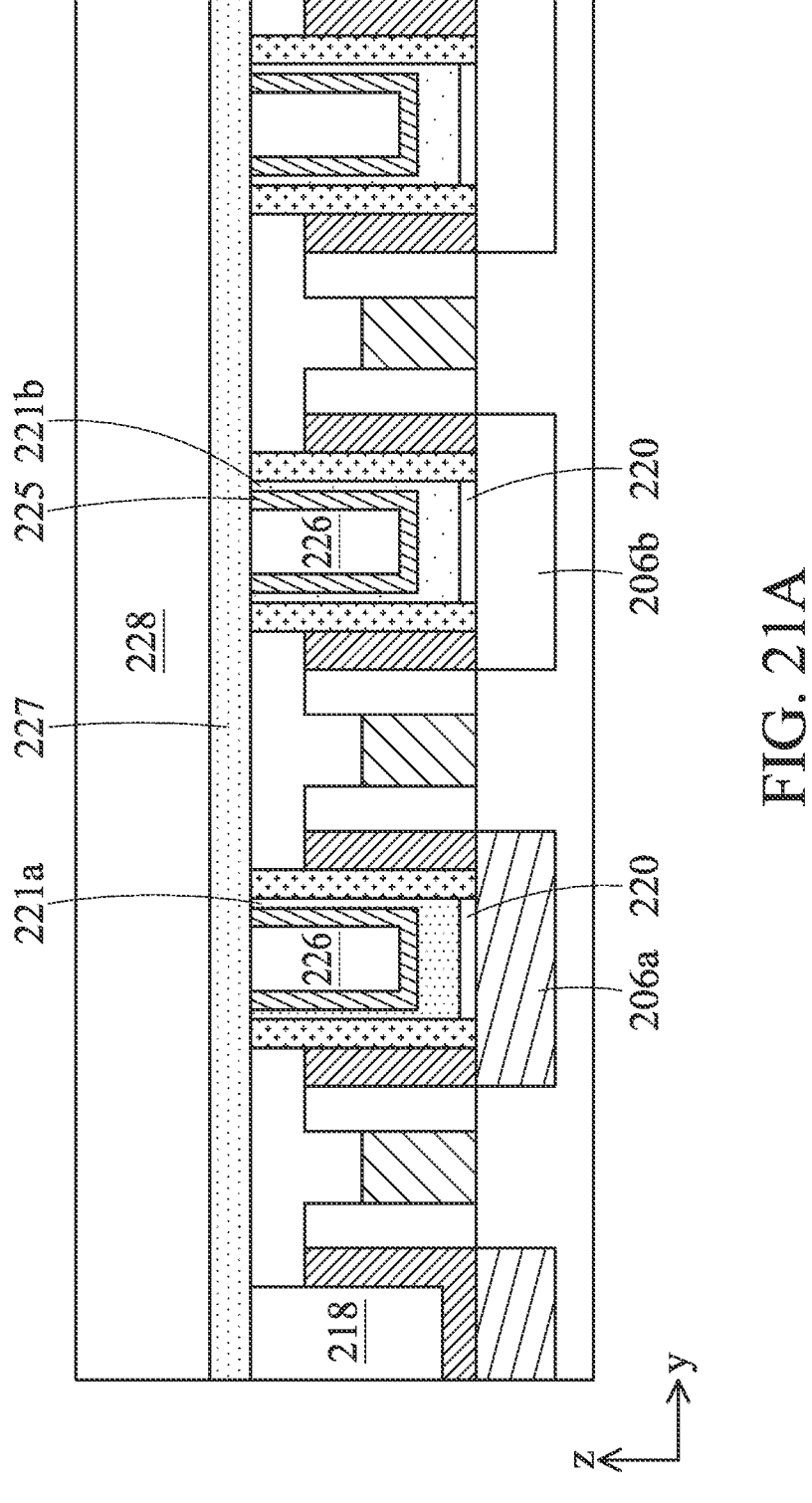
Figure 21B:
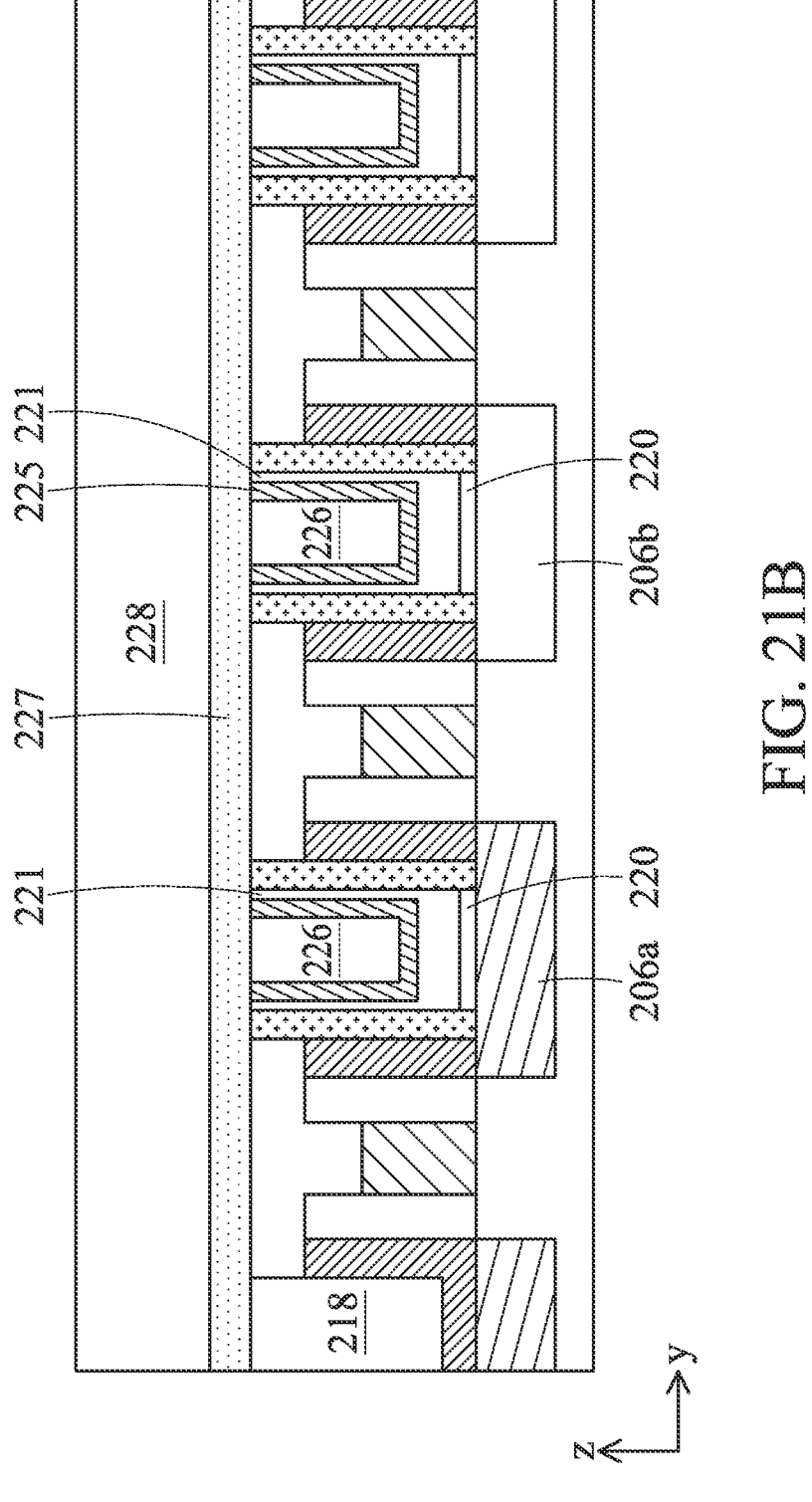
Figure 22A:
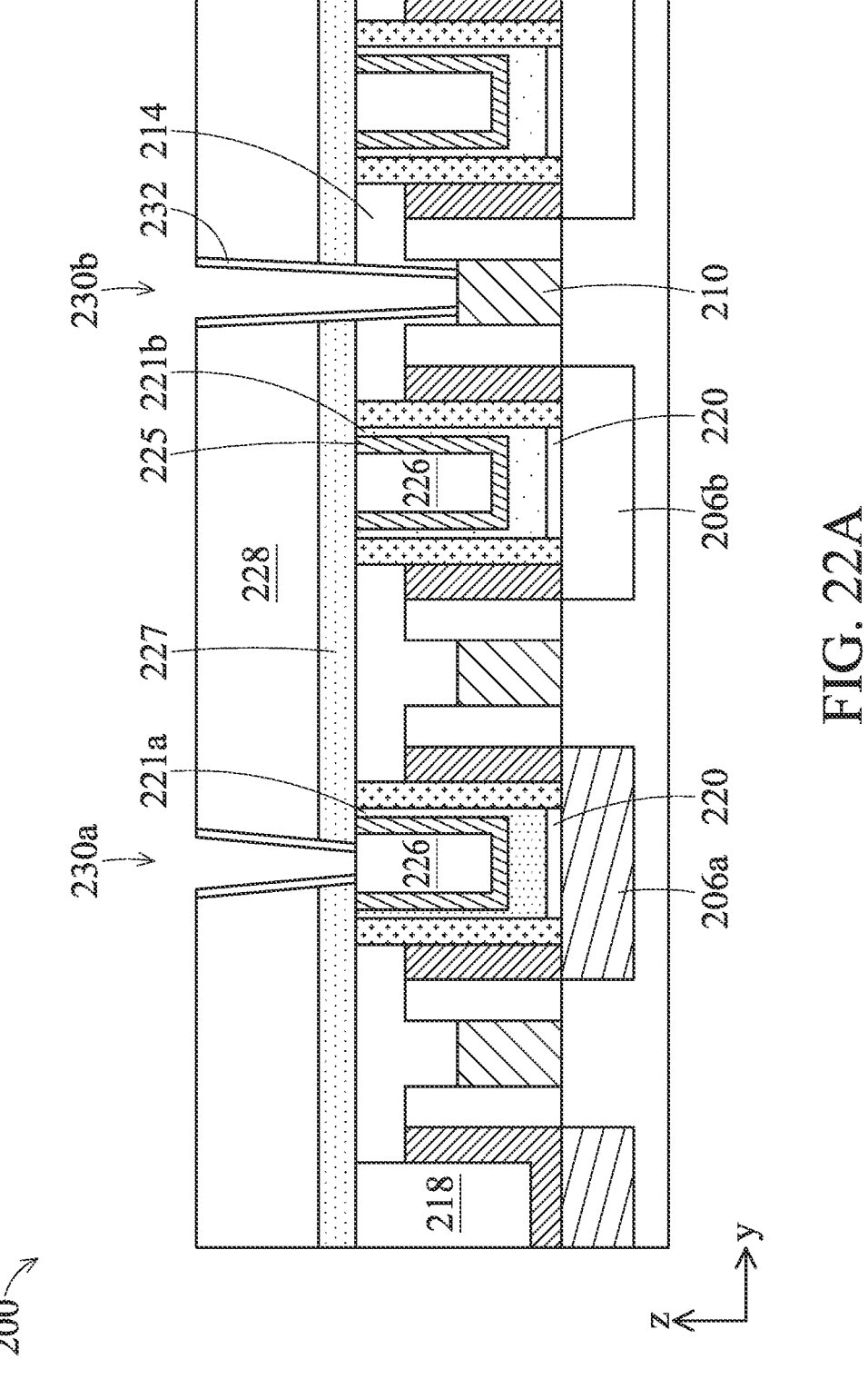
Figure 22B:
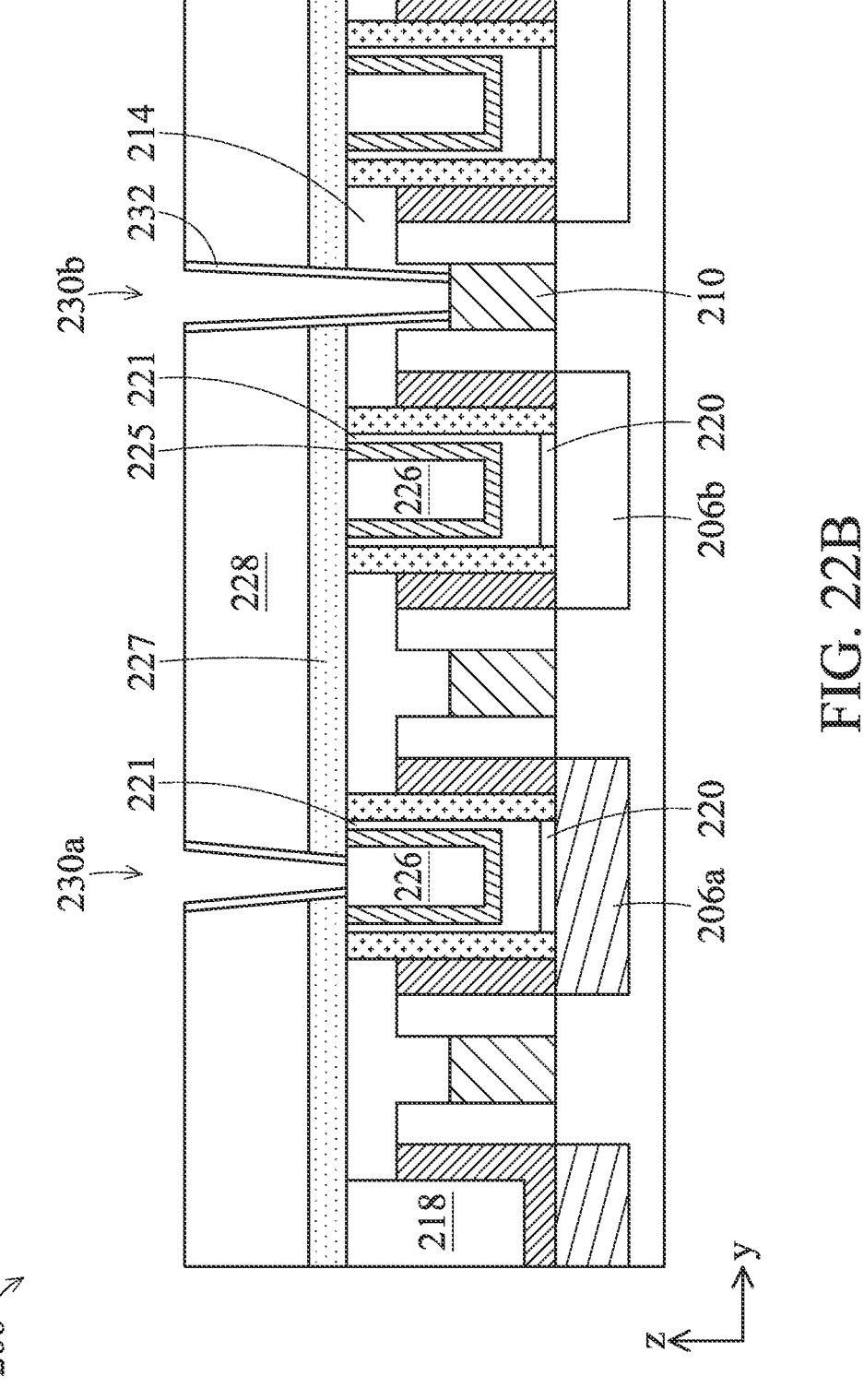

At operation 1310, in reference to FIG. 19B, the method 100 planarizes the metal 224 to form S/D contacts 226. This is much like the process described in FIG. 19A. As shown, the S/D contacts 226 include portions of the metal 224 sandwiched between side portions of the seed layer 225. And the seed layer 225 is sandwiched between the metal 224 and the metal cap layer 221. In this embodiment, each of the S/D contacts 226 is a tri-layer metal contact, having three metal materials. In a preferred embodiment, the three metal materials include at least tungsten (W), with the tungsten being a metal layer separating the other two metal materials, where the two other metal materials are both molybdenum (Mo).

At operation 1312 and 1314, and in reference to FIGS. 20B-24B, the method 100 forms S/D vias 234a over the S/D contacts 226 and gate vias 234b over the metal gates 210 much like in FIGS. 20A-24A. In reference to FIG. 23B, portions of the S/D contacts 226 provide seamless metal landing for the S/D vias 234a. Particularly, the metal 224 (see FIG. 18B) filled over the seed layer 225 provides the landing for the S/D vias 234a. Thus, the S/D vias 234a may also be formed to be without seams or voids. In some embodiments, the S/D vias 234a are selectively grown from the S/D contacts 226. The S/D vias 234a have the same metal material as the metal 224 it lands on. In some embodiments, the S/D vias 234a comprise molybdenum (Mo). At operation 1316, shown in FIG. 25B, additional processes are performed much like in FIG. 25A.

Figure 25B:
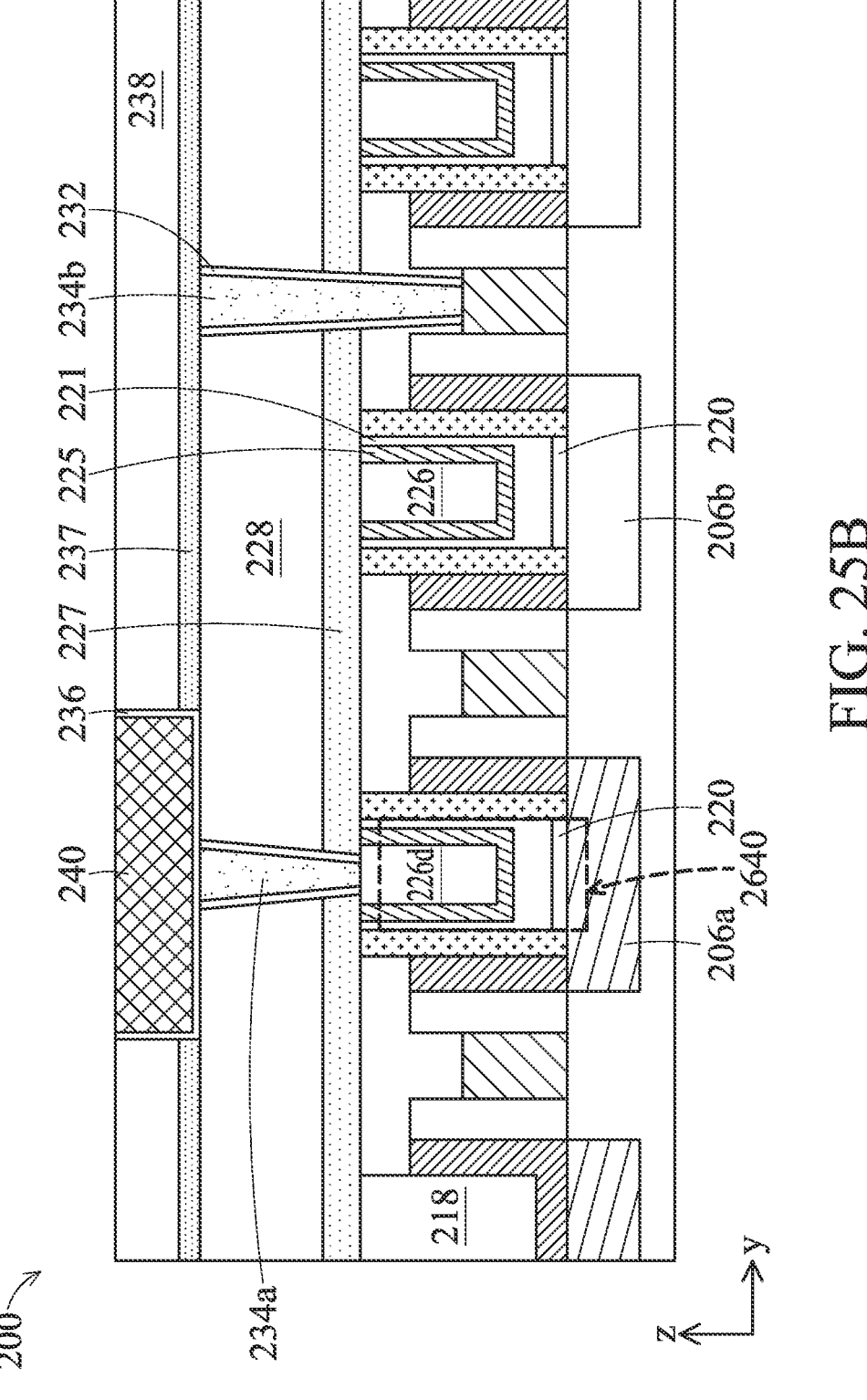

Referring to FIG. 25B, a dashed box 2640 illustrates a tri-layer metal contact 226d and certain other surrounding features. The dashed box 2640 encloses in part or in full, an S/D feature 206a, a silicide feature 220, a metal cap layer 221 (part of metal contact 226d), a seed layer 225 (part of metal contact 226d), and a metal 224 (part of metal contact 226d). A zoomed-in depiction of the dashed box 2640 is illustrated in FIG. 26, which portrays an embodiment of the above-mentioned elements in a real device. As shown in the zoomed-in portrayal 2640, the S/D feature 206 may have an etch-back so that a top surface of the S/D feature 206 curves inwards and the silicide feature 220 is formed over the curved top surface. The metal cap layer 221a, the seed layer 222, and the metal 224 have side portions and bottom portions, where the respective side and bottom portions have rounded corners at the interfaces therebetween. In the disclosed embodiment of the metal cap layer 221 and the seed layer 225, the respective bottom portions may be thicker than the respective side portions, but the thickness difference is greater in the metal cap layer 221. In this embodiment, an interface between the seed layer 225 and the metal 224 may be defined by a higher concentration of remaining halide components described above.

Although not intended to be limiting, the present disclosure offers advantages related device-metal contacts such as S/D contacts. One example advantage is that the S/D contacts are formed without seams through seed layers or metal cap layers formed by PVD. Another example advantage is reducing resistance by avoiding barrier layers in the formation of the S/D contacts. Further, the selection of different metal materials and layers for transistor type tuning further reduces interface and contact resistance.

One aspect of the present disclosure pertains to a method of forming a semiconductor device. The method includes receiving a workpiece having gate structures over channel regions on a substrate and a source/drain (S/D) feature adjacent to one of the channel regions, the S/D feature exposed in a trench between two of the gate structures. The method includes depositing a first metal layer by a first deposition over the S/D feature and over side portions of the trench, where the first metal layer is thicker over the S/D feature than over side portions of the trench. The method includes growing a metal on the first metal layer by a second deposition to form a second metal layer that fills up the trench, where the second deposition is different from the first deposition and where the growing of the metal in a vertical direction is grown at a faster rate than the growing of the metal in a horizontal direction. After growing the metal to form the second metal layer, the method includes planarizing the first and second metal layers to form an S/D contact. The method then forms an S/D via on the second metal layer of the S/D contact.

In an embodiment of the method of forming the semiconductor device, the first metal layer and the second metal layer include molybdenum. In another embodiment, the first metal layer includes tungsten, and the second metal layer includes molybdenum. In yet another embodiment, before the depositing of the first metal layer, the method includes forming a silicide feature over the S/D feature.

In an embodiment of the method of forming the semiconductor device, the growing of the metal includes applying a precursor with an etch chemical that etches the metal and the first metal layer over sidewalls of the trench while depositing the metal over portions of the first metal layer formed directly over the S/D feature.

In an embodiment of the method of forming the semiconductor device, the first deposition is performed by physical vapor deposition (PVD), the second deposition is performed by chemical vapor deposition (CVD) or atomic layer deposition (ALD), and the CVD or ALD is performed with a metal halide precursor having a metal component and a halogen component, the metal component includes tungsten (W), molybdenum (Mo), ruthenium (Ru), cobalt (Co), iridium (Ir), or rhodium (Rh), and the halogen component includes fluorine (F), chlorine (Cl), bromine (Br), or iodine (I).

In an embodiment of the method of forming the semiconductor device, a concentration of the halogen component remains in the second metal layer after the second metal layer is formed, and a concentration of the halogen component at an interface between the first metal layer and second metal layer is greater than a concentration of the halogen component in other portions of the second metal layer.

In an embodiment of the method of forming the semiconductor device, the first metal layer is a first seed layer, and before the growing of the metal to from the second metal layer, the method deposits a second seed layer over the first seed layer, where the second seed layer is different from the first seed layer in composition. In an embodiment, the first seed layer is a molybdenum layer, and the second seed layer is a tungsten layer.

Another aspect of the present disclosure pertains to a method of forming a semiconductor device. The method includes receiving a workpiece having gate structures over channel regions on a substrate and source/drain (S/D) features adjacent to the channel regions, the S/D features exposed in trenches between the gate structures. The method includes forming silicide features over the S/D features. The method includes depositing metal cap layers over the workpiece such that the metal cap layers have bottom portions over the silicide features and side portions over sidewalls of the trenches, where bottom portions of the metal cap layers are thicker than side portions of the metal cap layers. The method includes depositing a first metal layer over the metal cap layers, the first metal layer comprising tungsten and having bottom and side portions that form over the bottom and side portions of the metal cap layers, respectively. The method includes growing a second metal layer from the first metal layer to fill up the trenches, wherein metal growth of the second metal layer in a vertical direction is grown at a faster rate than in a horizontal direction. And after the growing of the second metal layer, the method includes planarizing the metal cap layers, the first metal layer, and the second metal layer to form S/D contacts. The method then forms S/D vias on the second metal layers of the S/D contacts.

In an embodiment of the method of forming the semiconductor device, the depositing of the metal cap layers and the depositing of the first metal layer is performed by physical vapor deposition (PVD), where the growing of the second metal layer is performed by chemical vapor deposition (CVD) or atomic layer deposition (ALD), wherein the CVD or ALD is performed with a metal halide precursor having a metal component and a halogen component, the metal component includes tungsten (W), molybdenum (Mo), ruthenium (Ru), and the halogen component includes fluorine (F), chlorine (CI), bromine (Br), or iodine (I).

In an embodiment of the method of forming the semiconductor device, the growing of the second metal layer includes etching the metal component on side portions of the first metal layer while depositing the metal component over the bottom portions of the first metal layer.

In an embodiment of the method of forming the semiconductor device, a thickness ratio of the bottom to side portions of the metal cap layer is greater than a thickness ratio of the bottom to side portions of the first metal layer.

In an embodiment of the method of forming the semiconductor device, a difference between the thicknesses of the bottom and side portions of the first metal layer is less than a difference between the thicknesses of the bottom and side portions of the metal cap layer.

In an embodiment of the method of forming the semiconductor device, the S/D features include p-type S/D features and n-type S/D features. The metal cap layers include a first metal cap layer of a first metal material and a second metal cap layer of a second metal material different from the first metal material in composition. The first metal cap layer is directly over the p-type S/D features and the second metal cap layer is directly over the n-type S/D features. And the first metal layer is directly on the first and second metal cap layers.

In an embodiment of the method of forming the semiconductor device, the first metal cap layer includes at least one of nickel, cobalt, and ruthenium and the second metal cap layer includes at least one of zirconium, erbium, and scandium.

In an embodiment of the method of forming the semiconductor device, the S/D features include p-type S/D features and n-type S/D features, where the second metal layer and the metal cap layers directly over the p-type and the n-type S/D features comprise molybdenum.

Another aspect of the present disclosure pertains to a semiconductor device. The semiconductor device includes a channel region on a substrate and S/D features adjacent to the channel region. The semiconductor device includes silicide features over the S/D features. The semiconductor device includes a first metal layer of a first metal material over the silicide features, wherein the first metal layer includes horizontal and vertical portions. The semiconductor device includes a second metal layer of a second metal material over the first metal layer, the first and second metal materials being different, wherein the second metal layer includes horizontal and vertical portions. The semiconductor device includes a metal fill layer over the second metal layer such that the metal fill layer is enclosed within the horizontal and vertical portions of the second metal layer. The semiconductor device includes a via extending from the metal fill layer and first metal line over the via. And a difference between thicknesses of the horizontal and vertical portions of the second metal layer is less than a difference between thicknesses of the horizontal and vertical portions of the first metal layer.

In an embodiment of the semiconductor device, a thickness ratio of the horizontal to vertical portions of the first metal layer is greater than a thickness ratio of the horizontal to vertical portions of the second metal layer.

In an embodiment of the semiconductor device, the via includes sidewall barrier layers and a via fill metal between the sidewall barrier layers, where the sidewall barrier layers include silicon nitride, and the via fill metal includes the same material as the metal fill layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming a semiconductor device, comprising:

receiving a workpiece having gate structures over channel regions on a substrate and source/drain (S/D) features adjacent to the channel regions, the S/D features exposed in trenches between the gate structures;

forming silicide features over the S/D features;

depositing metal cap layers over the workpiece such that the metal cap layers have bottom portions over the silicide features and side portions over sidewalls of the trenches, wherein bottom portions of the metal cap layers are thicker than side portions of the metal cap layers;

depositing a first metal layer over the metal cap layers, the first metal layer comprising tungsten and having bottom and side portions that form over the bottom and side portions of the metal cap layers, respectively, wherein a thickness ratio of the bottom to side portions of the metal cap layers is greater than a thickness ratio of the bottom to side portions of the first metal layer;

growing a second metal layer from the first metal layer to fill up the trenches, wherein metal growth of the second metal layer in a vertical direction is grown at a faster rate than in a horizontal direction;

after the growing of the second metal layer, planarizing the metal cap layers, the first metal layer, and the second metal layer to form S/D contacts; and forming S/D vias on the second metal layer of the S/D contacts.

2. The method of claim 1, wherein the depositing of the metal cap layers and the depositing of the first metal layer is performed by physical vapor deposition (PVD), wherein the growing of the second metal layer is performed by chemical vapor deposition (CVD) or atomic layer deposition (ALD), wherein the CVD or ALD is performed with a metal halide precursor having a metal component and a halogen component, the metal component includes tungsten (W), molybdenum (Mo), or ruthenium (Ru), and the halogen component includes fluorine (F), chlorine (Cl), bromine (Br), or iodine (I).

3. The method of claim 2, wherein the growing of the second metal layer includes etching the metal component on side portions of the first metal layer while depositing metal component over the bottom portions of the first metal layer.

4. The method of claim 1, wherein a difference between the thicknesses of the bottom and side portions of the first metal layer is less than a difference between the thicknesses of the bottom and side portions of the metal cap layer.

5. The method of claim 1, wherein the S/D features include p-type S/D features and n-type S/D features, wherein the metal cap layers include a first metal cap layer of a first metal material and a second metal cap layer of a second metal material different from the first metal material in composition, wherein the first metal cap layer is directly over the p-type S/D features and the second metal cap layer is directly over the n-type S/D features, and wherein the first metal layer is directly on the first and second metal cap layers.

6. The method of claim 5, wherein the first metal cap layer includes at least one of nickel, cobalt, and ruthenium and the second metal cap layer includes at least one of zirconium, erbium, and scandium.

7. The method of claim 1, wherein the S/D features include p-type S/D features and n-type S/D features, wherein the second metal layer and the metal cap layers directly over the p-type and the n-type S/D features comprise molybdenum.

8. The method of claim 1, wherein each of the metal cap layers and the first metal layer are formed of and from a single pure metal without other chemical compounds.

9. A method of forming a semiconductor device, comprising:

forming a channel regions on a substrate and S/D features adjacent to the channel regions;

forming gate structures over and engaging the channel regions;

forming silicide features over the S/D features;

depositing first metal layers over the silicide features, wherein the first metal layers include horizontal and vertical portions;

depositing a second metal layer over the first metal layers, wherein the second metal layer includes horizontal and vertical portions;

depositing a metal fill layer over the second metal layer such that the metal fill layer is enclosed within the horizontal and vertical portions of the second metal layer;

forming a via extending from the metal fill layer; and forming a first metal line over the via, wherein a difference between thicknesses of the horizontal and vertical portions of the second metal layer is less than a difference between thicknesses of the horizontal and vertical portions of the first metal layer, wherein the S/D features include p-type S/D features and n-type S/D features, wherein the first metal layers include first metal cap layers of a first metal material and second metal cap layers of a second metal material different from the first metal material in composition, wherein the first metal cap layers overlay the p-type S/D features and the second metal cap layers overlay n-type S/D features, and wherein the second metal layer is on and interfaces with the first and second metal cap layers.

10. The method of claim 9, wherein a thickness ratio of the horizontal to vertical portions of the first metal layer is greater than a thickness ratio of the horizontal to vertical portions of the second metal layer.

11. The method of claim 9, wherein the via includes sidewall barrier layers and a via fill metal between the sidewall barrier layers, wherein the sidewall barrier layers include silicon nitride, and the via fill metal includes the same material as the metal fill layer.

12. A method of forming a semiconductor device, comprising:

receiving a workpiece having gate structures over channel regions on a substrate and a source/drain (S/D) feature adjacent to one of the channel regions, the S/D feature exposed in a trench between two of the gate structures;

depositing a first metal layer by a first deposition over the S/D feature and over side portions of the trench, wherein the first metal layer is thicker over the S/D feature than over side portions of the trench;

depositing a second metal layer over the first metal layer by a second deposition, the second metal layer having bottom and side portions that form over bottom and side portions of the first metal layer;

growing a metal fill layer on the second metal layer by a third deposition to form a third metal layer that fills up the trench, wherein the third deposition is different from the first deposition and wherein the growing of the metal fill layer in a vertical direction is grown at a faster rate than the growing of the metal fill layer in a horizontal direction; and after the growing of the metal fill layer, planarizing the first, second, and third metal layers to form an S/D contact, wherein the first metal layer and the second metal layer have different metal compositions, the first metal layer and the third metal layer have a same metal composition, and the first metal layer and the third metal layer are physically separated from each other by the second metal layer.

13. The method of claim 12, further comprising forming an S/D via on the third metal layer of the S/D contact.

14. The method of claim 12, The method of claim 1, wherein before the depositing of the first metal layer, further comprising forming a silicide feature over the S/D feature.

15. The method of claim 12, wherein the growing of the metal fill layer includes applying a precursor with an etch chemical that etches the metal fill layer on side portions of the second metal layer while depositing the metal fill layer over the bottom portions of the second metal layer.

16. The method of claim 12,
wherein the first deposition and the second deposition are performed by physical vapor deposition (PVD), wherein the third deposition is performed by chemical vapor deposition (CVD) or atomic layer deposition (ALD), the CVD or ALD is performed with a metal halide precursor having a metal component and a halogen component, the metal component includes tungsten (W), molybdenum (Mo), ruthenium (Ru), cobalt (Co), iridium (Ir), or rhodium (Rh), and the halogen component includes fluorine (F), chlorine (Cl), bromine (Br), or iodine (I).

17. The method of claim 16, wherein a concentration of the halogen component remains in the metal fill layer after the metal fill layer is formed, and a concentration of the halogen component at an interface between the second metal layer and metal fill layer is greater than a concentration of the halogen component in other portions of the metal fill layer.

18. The method of claim 12, wherein the first metal layer and the second metal layer include different metals.

19. The method of claim 12,
wherein a bottom portion of the first metal layer has a first thickness, a bottom portion of the second metal layer has a second thickness, and the first thickness is greater than the second thickness, wherein the bottom and side portions of the second metal layer have a substantially same thickness.

20. The method of claim 12, wherein the first metal layer includes molybdenum (Mo), the second metal layer includes tungsten (W), and the metal fill layer includes (Mo).

* * * * *